US012622006B2

(12) United States Patent
Park et al.

(10) Patent No.: US 12,622,006 B2
(45) Date of Patent: May 5, 2026

(54) SEMICONDUCTOR DEVICE

(71) Applicant: Samsung Electronics Co., Ltd.,
Suwon-si (KR)

(72) Inventors: Sungil Park, Suwon-si (KR); **Jae
Hyun Park**, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 383 days.

(21) Appl. No.: 18/189,621

(22) Filed: Mar. 24, 2023

(65) Prior Publication Data

US 2023/0326994 A1     Oct. 12, 2023

(30) Foreign Application Priority Data

Apr. 7, 2022   (KR) ........................ 10-2022-0043345
Oct. 13, 2022  (KR) ........................ 10-2022-0131369

(51) Int. Cl.
| | |
|---|---|
| *H10D 10/01* | (2025.01) |
| *H10D 62/13* | (2025.01) |
| *H10D 62/17* | (2025.01) |
| *H10D 84/60* | (2025.01) |

(52) U.S. Cl.
CPC ......... *H10D 10/058* (2025.01); *H10D 62/133*
(2025.01); *H10D 62/137* (2025.01); ***H10D
62/177* (2025.01); *H10D 84/60*** (2025.01);
*H10D 84/645* (2025.01)

(58) Field of Classification Search
CPC .. H10D 10/058; H10D 62/133; H10D 62/137;
H10D 62/177; H10D 84/60; H10D
84/645; H10D 10/60; H10D 62/127;
H10D 62/134; H10D 62/184; H10D
62/60; H10D 64/231; H10D 64/281;
H10D 84/401
See application file for complete search history.

(56) References Cited

U.S. PATENT DOCUMENTS

| | | | |
|---|---|---|---|
| 8,049,282 B2 | 11/2011 | Dyson et al. | |
| 8,310,027 B2 | 11/2012 | Russ et al. | |
| 9,153,569 B1 | 10/2015 | Edwards et al. | |
| 10,475,782 B2 | 11/2019 | Oh et al. | |
| 10,483,368 B1 * | 11/2019 | Hashemi | .............. H10D 62/116 |

(Continued)

FOREIGN PATENT DOCUMENTS

KR       10-2021-0102016 A      8/2021

*Primary Examiner* — Syed I Gheyas
(74) *Attorney, Agent, or Firm* — Wolf, Greenfield &
Sacks, P.C.

(57) ABSTRACT

A semiconductor device includes a semiconductor body
having first and second surfaces opposite to each other. The
semiconductor body includes a first well region having a
first conductivity type, second and third well regions spaced
apart from each other in a first direction with the first well
region interposed therebetween and having a second con-
ductivity type, first doped regions spaced apart from each
other in a second direction intersecting the first direction in
the first well region, a second doped region, which is
adjacent to the second well region and has the second
conductivity type, and a third doped region, which is adja-
cent to the third well region and has the second conductivity
type. The second surface of the semiconductor body
includes bottom surfaces of the first to third well regions, the
plurality of first doped regions, the second doped region, and
the third doped region.

14 Claims, 53 Drawing Sheets

(56) References Cited

U.S. PATENT DOCUMENTS

| | | | |
|---|---|---|---|
| 2007/0052057 A1 | 3/2007 | Drobny | |
| 2014/0231962 A1 | 8/2014 | Yoo et al. | |
| 2016/0358822 A1* | 12/2016 | Hu | H10D 84/401 |
| 2018/0083126 A1* | 3/2018 | Hashemi | H10D 62/137 |
| 2020/0303529 A1 | 9/2020 | Kushner et al. | |
| 2020/0335494 A1 | 10/2020 | Vendt et al. | |
| 2022/0199810 A1* | 6/2022 | Malinowski | H10D 62/125 |
| 2022/0376093 A1* | 11/2022 | Derrickson | H10D 10/041 |
| 2023/0058451 A1* | 2/2023 | Jain | H10D 86/201 |
| 2023/0067523 A1* | 3/2023 | Wang | H10D 10/60 |
| 2023/0069207 A1* | 3/2023 | Derrickson | H10D 62/136 |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2022-0043345, filed on Apr. 7, 2022, and Korean Patent Application No. 10-2022-0131369, filed on Oct. 13, 2022, in the Korean Intellectual Property Office, the entire contents of which are hereby incorporated by reference.

BACKGROUND OF THE INVENTION

The present disclosure relates to a semiconductor device including a bipolar junction transistor.

A semiconductor device may include an integrated circuit including metal-oxide-semiconductor (MOS) field effect transistors (MOSFETs) and upper interconnection lines connected to the MOS field effect transistors. The MOS field effect transistors and the upper interconnection lines may be disposed on a top surface of a semiconductor substrate. As a size and a design rule of semiconductor devices have been reduced, the MOS field effect transistors and the upper interconnection lines have been scaled down. Operating characteristics of semiconductor devices may be diminished by the scale-down of the MOS field effect transistors and the upper interconnection lines. Thus, various methods for forming a semiconductor device, which has desirable performance characteristics while overcoming limitations caused by high integration have been studied. For example, a semiconductor device may further include lower interconnection lines disposed on a bottom surface of the semiconductor substrate, and a through-electrode penetrating the semiconductor substrate and connecting the lower interconnection lines to the MOS field effect transistors and the upper interconnection lines. A reduction in thickness of the semiconductor substrate may be required to form the through-electrode, and in this case, an operable bipolar junction transistor structure compatible with the through-electrode may be desired.

SUMMARY

Embodiments of the inventive concepts may provide a semiconductor device including a bipolar junction transistor capable of being realized in a relatively thin semiconductor body.

Embodiments of the inventive concepts may also provide a semiconductor device including a bipolar junction transistor capable of relatively easy control of operating characteristics.

In an aspect, a semiconductor device may include a semiconductor body having a first surface and a second surface which are opposite to each other. The semiconductor body may include a first well region having a first conductivity type: a second well region and a third well region, which are spaced apart from each other in a first direction with the first well region interposed therebetween and have a second conductivity type different from the first conductivity type; a plurality of first doped regions spaced apart from each other in a second direction intersecting the first direction in the first well region, the plurality of first doped regions having the first conductivity type, wherein a concentration of dopants having the first conductivity type in each of the plurality of first doped regions is greater than a concentration of dopants having the first conductivity type in the first well region; a second doped region, which is adjacent to the second well region and has the second conductivity type; and a third doped region, which is adjacent to the third well region and has the second conductivity type. The second well region may be disposed between the first well region and the second doped region, and the third well region may be disposed between the first well region and the third doped region. The second surface of the semiconductor body may include bottom surfaces of the first to third well regions, the plurality of first doped regions, the second doped region, and the third doped region.

In an aspect, a semiconductor device may include a semiconductor body having a first surface and a second surface, which are opposite to each other. The semiconductor body may include a first well region having a first conductivity type: a second well region and a third well region, which are spaced apart from each other in a first direction with the first well region interposed therebetween and have a second conductivity type different from the first conductivity type; a plurality of first doped regions spaced apart from each other in a second direction intersecting the first direction in the first well region, the plurality of first doped regions having the first conductivity type; first contacts on the plurality of first doped regions, respectively; a second doped region, which is adjacent to the second well region and has the second conductivity type; and a third doped region, which is adjacent to the third well region and has the second conductivity type. The second well region may be between the first well region and the second doped region, and the third well region may be between the first well region and the third doped region. The first surface of the semiconductor body includes top surfaces of the first to third well regions, the plurality of first doped regions, the second doped region, and the third doped region. The second surface of the semiconductor body includes bottom surfaces of the first to third well regions, the plurality of first doped regions, the second doped region, and the third doped region.

In an aspect, a semiconductor device may include a semiconductor body having a first surface and a second surface which are opposite to each other, and isolation patterns penetrating the semiconductor body. The semiconductor body may include: first well regions having a first conductivity type, the first well regions extending in a first direction and spaced apart from each other in a second direction intersecting the first direction: a second well region on a side surface of each of the first well regions and having a second conductivity type different from the first conductivity type; first doped regions in each of the first well regions and spaced apart from each other in the first direction, the first doped regions having the first conductivity type, wherein a concentration of dopants having the first conductivity type in the first doped regions is greater than a concentration of dopants having the first conductivity type in the first well regions; and a second doped region in each of the first well regions and between the first doped regions, the second doped region having the second conductivity type, wherein a concentration of dopants having the second conductivity type in the second doped region is greater than a concentration of dopants having the second conductivity type in the second well region. The isolation patterns may penetrate each of the first well regions and may be between the second doped region and the first doped regions. Bottom surfaces of the isolation patterns may be at a same height in a third direction perpendicular to a plane formed by the first direction and the second direction as the second surface of the semiconductor body.

BRIEF DESCRIPTION OF THE DRAWINGS

FIG. 21 is a plan view illustrating a semiconductor device according to some embodiments of the inventive concepts.

FIG. 27 is a plan view illustrating a semiconductor device according to some embodiments of the inventive concepts.

FIG. 40 is a plan view illustrating a semiconductor device according to some embodiments of the inventive concepts.

DETAILED DESCRIPTION

Figure 1:
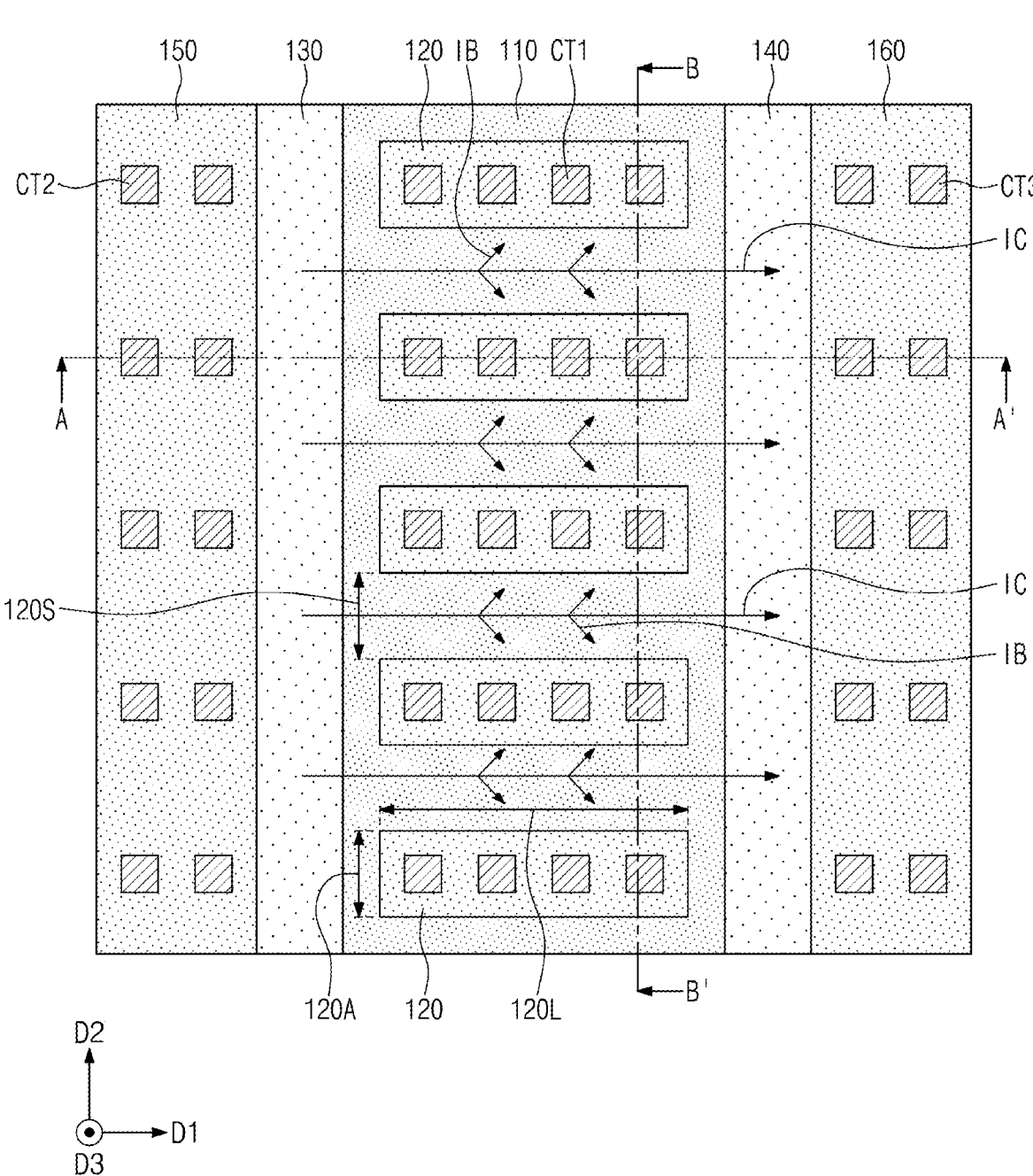
FIG. 1 is a plan view illustrating a semiconductor device according to some embodiments of the inventive concepts.

Embodiments of the inventive concepts will now be described more fully with reference to the accompanying drawings. The present disclosure may, however, be embodied in many different forms and should not be construed as limited to the embodiments set forth herein. Like reference numerals refer to like elements throughout this application. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2A:
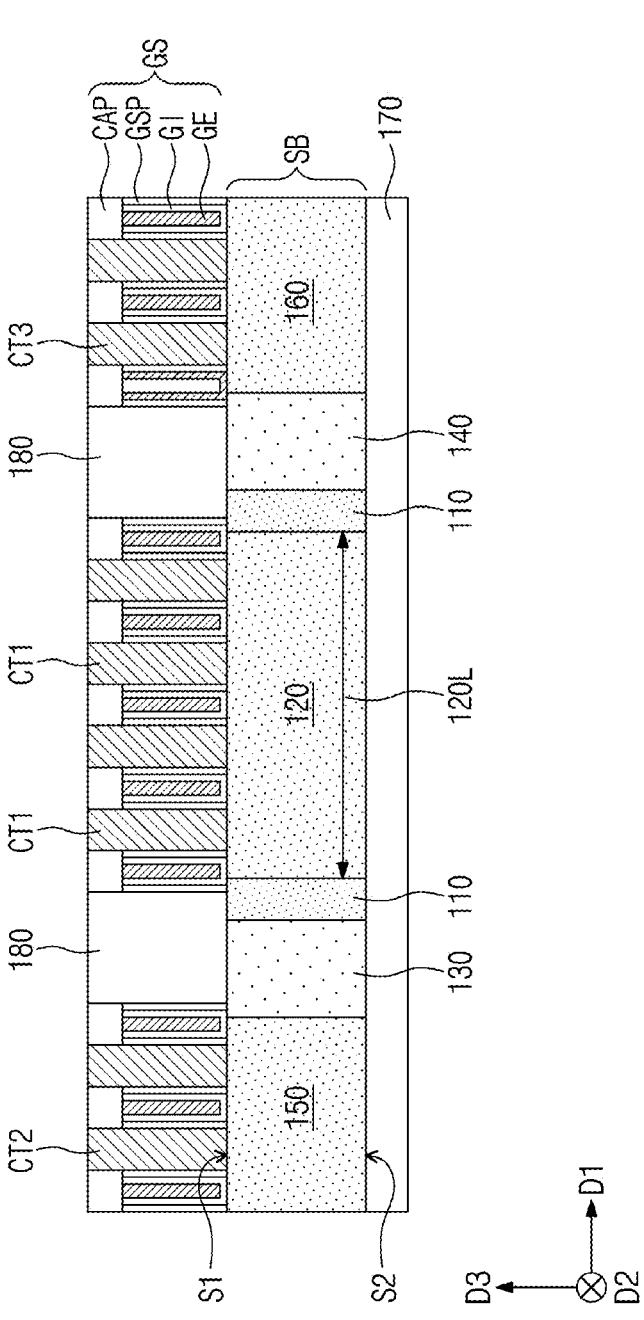
FIG. 2A is a cross-sectional view taken along a line A-A' of FIG. 1.

FIG. 1 is a plan view illustrating a semiconductor device according to some embodiments of the inventive concepts. FIG. 2A is a cross-sectional view taken along a line A-A' of FIG. 1, and FIG. 2B is a cross-sectional view taken along a line B-B' of FIG. 1.

Figure 2B:
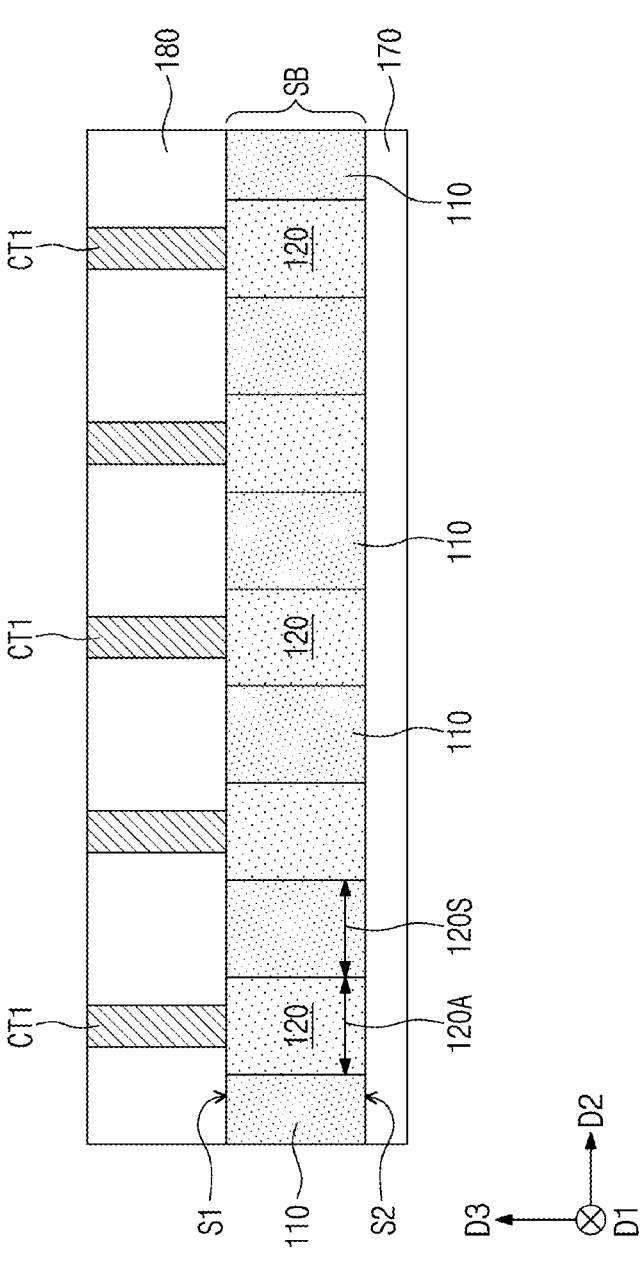
FIG. 2B is a cross-sectional view taken along a line B-B' of FIG. 1.

Referring to FIGS. 1, 2A, and 2B, a semiconductor body SB having a first surface S1 and a second surface S2, which are opposite to each other may be provided. The semiconductor body SB may include a semiconductor material (e.g., silicon and/or germanium). The semiconductor body SB may include a first well region 110 having a first conductivity type, and a second well region 130 and a third well region 140 which are disposed at both sides of the first well region 110 and have a second conductivity type different from the first conductivity type. The second well region 130 and the third well region 140 may be spaced apart from each other in a first direction D1 with the first well region 110 interposed therebetween, and the first to third well regions 110, 130, and 140 may extend in a second direction D2. The first direction D1 and the second direction D2 may be parallel to the first surface S1 of the semiconductor body SB and may intersect each other. For some examples, the first conductivity type may be an N-type, and the second conductivity type may be a P-type. For certain examples, the first conductivity type may be a P-type, and the second conductivity type may be an N-type. Top surfaces of the first well region 110, the second well region 130, and the third well region 140 may correspond to the first surface S1 of the semiconductor body SB, and bottom surfaces of the first well region 110, the second well region 130 and the third well region 140 may correspond to the second surface S2 of the semiconductor body SB.

The semiconductor body SB may further include a plurality of first doped regions 120 disposed in the first well region 110. The plurality of first doped regions 120 may be spaced apart from each other in the second direction D2 in the first well region 110. In some embodiments, the plurality of first doped regions 120 may extend in the first direction D1. For example, each of the plurality of first doped regions 120 may have a bar shape extending in the first direction D1.

Each of the plurality of first doped regions 120 may have a length 120L in the first direction D1 and a width 120A in the second direction D2. The length 120L of each of the plurality of first doped regions 120 may be greater than the width 120A of each of the plurality of first doped regions 120. In some embodiments, a distance 120S in the second direction D2 between adjacent two of the plurality of first doped regions 120 may be greater than the width 120A of each of the plurality of first doped regions 120. In some embodiments, each of the plurality of first doped regions 120 may penetrate the first well region 110 in a third direction D3. The third direction D3 may be perpendicular to the first surface S1 of the semiconductor body SB. The first well region 110 may extend in the first direction D1 between the plurality of first doped regions 120.

Top surfaces of the plurality of first doped regions 120 may correspond to the first surface S1 of the semiconductor body SB, and bottom surfaces of the plurality of first doped regions 120 may correspond to the second surface S2 of the semiconductor body SB. The plurality of first doped regions 120 may have the first conductivity type. A concentration of dopants having the first conductivity type in each of the plurality of first doped regions 120 may be greater than a concentration of dopants having the first conductivity type in the first well region 110.

The semiconductor body SB may further include a second doped region 150, which is adjacent to the second well region 130 and has the second conductivity type, and a third doped region 160 which is adjacent to the third well region 140 and has the second conductivity type. The second well region 130 may be disposed between the first well region 110 and the second doped region 150. The second doped region 150 may be spaced apart from the first well region 110 in the first direction D1 with the second well region 130 interposed therebetween and may extend in the second direction D2. The second doped region 150 and the first well region 110 may be in contact with both side surfaces of the second well region 130, respectively. The third well region 140 may be disposed between the first well region 110 and the third doped region 160. The third doped region 160 may be spaced apart from the first well region 110 in the first direction D1 with the third well region 140 interposed therebetween and may extend in the second direction D2. The third doped region 160 and the first well region 110 may be in contact with both side surfaces of the third well region 140, respectively. Side surfaces of the first to third well regions 110, 130 and 140, the second doped region 150 and the third doped region 160 may be in contact with each other in the first direction D1. Top surfaces of the second doped region 150 and the third doped region 160 may correspond to the first surface S1 of the semiconductor body SB, and bottom surfaces of the second doped region 150 and the third doped region 160 may correspond to the second surface S2 of the semiconductor body SB.

A concentration of dopants having the second conductivity type in the second doped region 150 may be greater than a concentration of dopants having the second conductivity type in the second well region 130, and a concentration of dopants having the second conductivity type in the third doped region 160 may be greater than a concentration of dopants having the second conductivity type in the third well region 140. The concentration of the dopants having the second conductivity type in the second well region 130 may be equal to or different from the concentration of the dopants having the second conductivity type in the third well region 140. For some examples, the concentration of the dopants having the second conductivity type in the second well region 130 may be greater than the concentration of the dopants having the second conductivity type in the third well region 140. For certain examples, the concentration of the dopants having the second conductivity type in the second well region 130 may be less than the concentration of the dopants having the second conductivity type in the third well region 140.

First contacts CT1, second contacts CT2 and third contacts CT3 may be disposed on the first surface S1 of the semiconductor body SB. The first contacts CT1 may be disposed on the plurality of first doped regions 120 and may be electrically connected to the plurality of first doped regions 120. The first contacts CT1 may be spaced apart from each other in the first direction D1 and the second direction D2. First contacts CT1, spaced apart from each other in the first direction D1, of the first contacts CT1 may be disposed on a corresponding first doped region of the plurality of first doped regions 120 and may be connected in common to the corresponding first doped region. First contacts CT1, spaced apart from each other in the second direction D2, of the first contacts CT1 may be disposed on the plurality of first doped regions 120, respectively, and may be connected to the plurality of first doped regions 120, respectively. The plurality of first doped regions 120 and the first contacts CT1 may constitute a plurality of bases of a bipolar junction transistor.

The second contacts CT2 may be disposed on the second doped region 150 and may be electrically connected to the second doped region 150. The second doped region 150 and the second contacts CT2 may constitute an emitter of the bipolar junction transistor. The third contacts CT3 may be disposed on the third doped region 160 and may be electrically connected to the third doped region 160. The third doped region 160 and the third contacts CT3 may constitute a collector of the bipolar junction transistor. The first contacts CT1, the second contacts CT2 and the third contacts CT3 may include a conductive material (e.g., a metal).

A plurality of gate structures GS may be disposed on the first surface S1 of the semiconductor body SB. The plurality of gate structures GS is omitted in FIG. 1 for the purpose of ease and convenience in illustration. The plurality of gate structures GS may be spaced apart from each other in the first direction D1 and may extend in the second direction D2. The first contacts CT1, the second contacts CT2 and the third contacts CT3 may be disposed between the plurality of gate structures GS.

Each of the plurality of gate structures GS may include a gate electrode GE extending in the second direction D2, a gate dielectric pattern GI between the gate electrode GE and the first surface S1 of the semiconductor body SB, gate spacers GSP on side surfaces of the gate electrode GE, and a gate capping pattern CAP on a top surface of the gate electrode GE. The gate dielectric pattern GI may extend between the gate electrode GE and the gate spacers GSP, and a topmost surface of the gate dielectric pattern GI may be substantially coplanar with the top surface of the gate electrode GE. The gate capping pattern CAP may extend onto top surfaces of the gate spacers GSP. The gate electrode GE may include a doped semiconductor material, a conductive metal nitride, and/or a metal. The gate dielectric pattern GI may include a silicon oxide layer, a silicon nitride layer, a silicon oxynitride layer, and/or a high-k dielectric layer. The high-k dielectric layer may include a material (e.g., a hafnium oxide (HfO) layer, an aluminum oxide (AlO) layer, or a tantalum oxide (TaO) layer) of which a dielectric constant is higher or greater than that of a silicon oxide layer. Each of the gate spacers GSP and the gate capping pattern CAP may include a silicon oxide layer, a silicon nitride layer, and/or a silicon oxynitride layer. The plurality of gate structures GS may be electrically floated dummy gate structures.

An upper interlayer insulating layer 180 may be disposed on the first surface S1 of the semiconductor body SB and may cover the plurality of gate structures GS and the first to third contacts CT1, CT2, and CT3. The plurality of gate structures GS and the first to third contacts CT1, CT2, and CT3 may penetrate the upper interlayer insulating layer 180 in the third direction D3. For example, the upper interlayer insulating layer 180 may include a silicon oxide layer, a silicon nitride layer, and/or a silicon oxynitride layer.

A lower insulating layer 170 may be disposed on the second surface S2 of the semiconductor body SB. For example, the lower insulating layer 170 may include a silicon oxide layer, a silicon nitride layer, and/or a silicon oxynitride layer.

A first voltage may be applied to the second contacts CT2, and a second voltage may be applied to the first contacts CT1 and the third contacts CT3. The second voltage may be different from the first voltage and may be, for example, a ground voltage. In this case, a first current IC may flow from the emitter constituted by the second contacts CT2 and second doped region 150 to the collector constituted by the third doped region 160 and the third contacts CT3. In addition, a second current IB may flow from the emitter constituted by the second contacts CT2 and the second doped region 150 to the plurality of bases constituted by the plurality of first doped regions 120 and the first contacts CT1. Thus, the bipolar junction transistor may operate in this manner.

The first current IC and the second current IB may be controlled by adjusting the length 120L and the width 120A of the plurality of first doped regions 120 and the distance 120S between the plurality of first doped regions 120. For some examples, the second current IB may be increased by increasing the length 120L of the plurality of first doped regions 120. For certain examples, the first current IC may be increased by increasing the distance 120S between the plurality of first doped regions 120. For certain examples, when the distance 120S between the plurality of first doped regions 120 is greater than the width 120A of the plurality of first doped regions 120, the first current IC may be increased.

According to some embodiments of the inventive concepts, the side surfaces of the first to third well regions 110, 130 and 140, the plurality of first doped regions 120, the second doped region 150 and the third doped region 160 may be in contact with each other in a horizontal direction (e.g., in the first direction D1 and the second direction D2), and the plurality of first doped regions 120 may be spaced apart from each other in the second direction D2 in the first well region 110. Top surfaces of the first to third well regions 110, 130 and 140 and the first to third doped regions 120, 150 and 160 may constitute the first surface S1 of the semiconductor body SB, and bottom surfaces of the first to third well regions 110, 130 and 140 and the first to third doped regions 120, 150 and 160 may constitute the second surface S2 of the semiconductor body SB. In this case, even though a thickness of the semiconductor body SB in the third direction D3 is relatively thin, the bipolar junction transistor operable in the semiconductor body SB may be easily realized. In addition, a current (e.g., the first current IC and the second current IB) flowing through the bipolar junction transistor may be controlled by adjusting the length 120L and the width 120A of the plurality of first doped regions

120 and the distance 120S between the plurality of first doped regions 120, and thus operating characteristics of the bipolar junction transistor may be easily controlled.

Figure 3A:
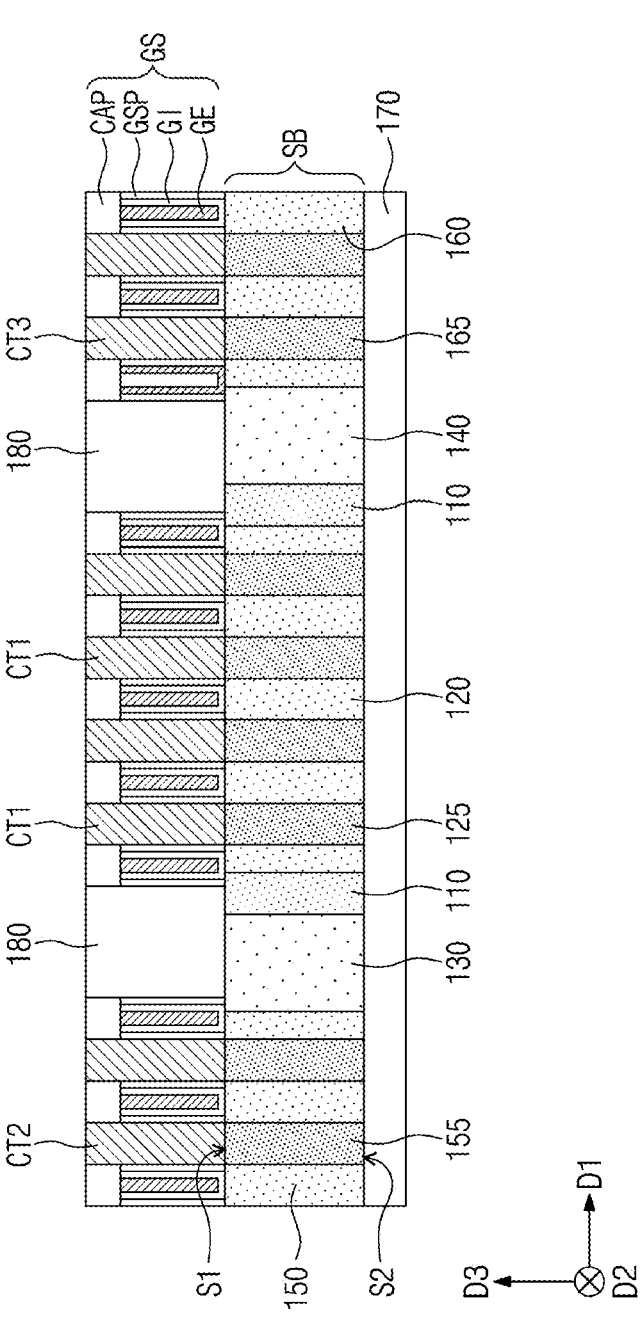
FIGS. 3A and 3B are cross-sectional views corresponding to the lines A-A' and B-B' of FIG. 1, respectively, to illustrate a semiconductor device according to some embodiments of the inventive concepts.
Figure 3B:
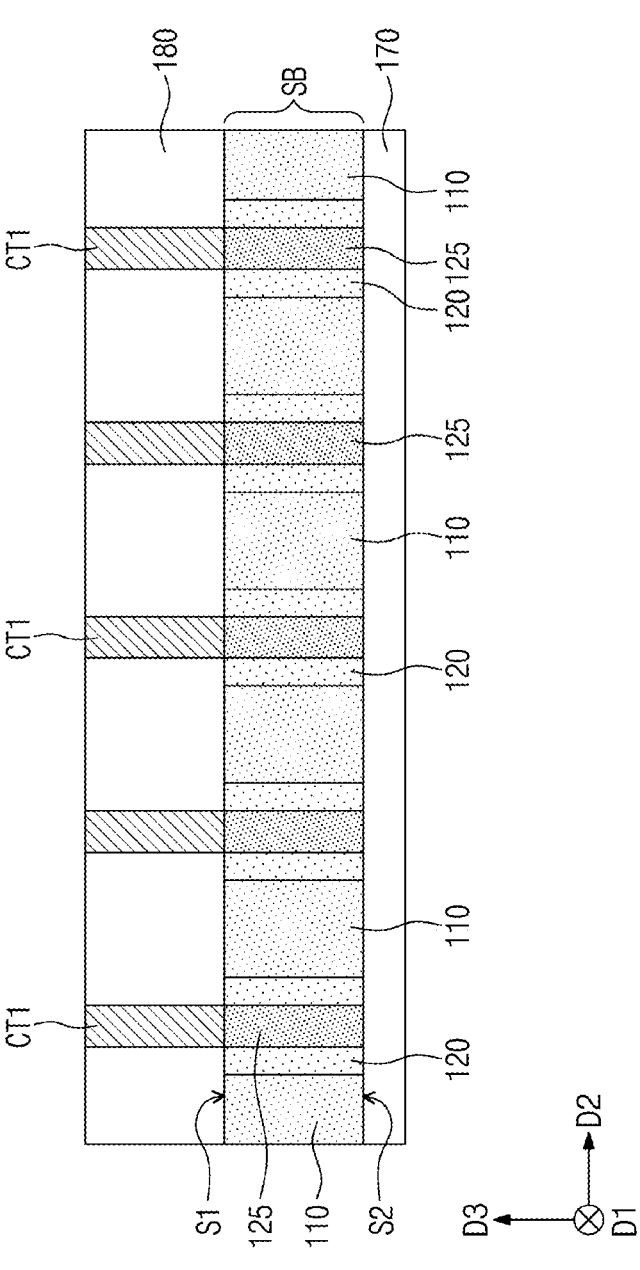

FIGS. 3A and 3B are cross-sectional views corresponding to the lines A-A' and B-B' of FIG. 1, respectively, to illustrate a semiconductor device according to some embodiments of the inventive concepts. Hereinafter, differences between the present embodiments and the above embodiments of FIGS. 1, 2A, and 2B will be mainly described for the purpose of ease and convenience in explanation.

Referring to FIGS. 1, 3A, and 3B, the semiconductor body SB may further include a plurality of first doped patterns 125 penetrating each of the plurality of first doped regions 120. The plurality of first doped patterns 125 may be spaced apart from each other in the first direction D1 in a corresponding first doped region 120 of the plurality of first doped regions 120 and may be disposed under the first contacts CT1 arranged in the first direction D1, respectively. The plurality of first doped patterns 125 may be electrically connected to the first contacts CT1 arranged in the first direction D1, respectively. In some embodiments, each of the plurality of first doped patterns 125 may penetrate the corresponding first doped region 120 in the third direction D3. Top surfaces of the plurality of first doped patterns 125 may correspond to the first surface S1 of the semiconductor body SB, and bottom surfaces of the plurality of first doped patterns 125 may correspond to the second surface S2 of the semiconductor body SB.

The plurality of first doped patterns 125 may have the first conductivity type and may be epitaxial patterns formed by an epitaxial growth process. A concentration of dopants having the first conductivity type in each of the plurality of first doped patterns 125 may be equal to or greater than the concentration of the dopants having the first conductivity type in each of the plurality of first doped regions 120. The plurality of first doped patterns 125 may be used to reduce a contact resistance between the first contacts CT1 and the plurality of first doped regions 120.

The semiconductor body SB may further include second doped patterns 155 penetrating the second doped region 150, and third doped patterns 165 penetrating the third doped region 160.

The second doped patterns 155 may be spaced apart from each other in the second doped region 150 and may be disposed under the second contacts CT2, respectively. The second doped patterns 155 may be electrically connected to the second contacts CT2, respectively. In some embodiments, each of the second doped patterns 155 may penetrate the second doped region 150 in the third direction D3. Top surfaces of the second doped patterns 155 may correspond to the first surface S1 of the semiconductor body SB, and bottom surfaces of the second doped patterns 155 may correspond to the second surface S2 of the semiconductor body SB. The second doped patterns 155 may have the second conductivity type and may be epitaxial patterns formed by an epitaxial growth process. A concentration of dopants having the second conductivity type in each of the second doped patterns 155 may be equal to or greater than the concentration of the dopants having the second conductivity type in the second doped region 150. The second doped patterns 155 may be used to reduce a contact resistance between the second contacts CT2 and the second doped region 150.

The third doped patterns 165 may be spaced apart from each other in the third doped region 160 and may be disposed under the third contacts CT3, respectively. The third doped patterns 165 may be electrically connected to the third contacts CT3, respectively. In some embodiments, each of the third doped patterns 165 may penetrate the third doped region 160 in the third direction D3. Top surfaces of the third doped patterns 165 may correspond to the first surface S1 of the semiconductor body SB, and bottom surfaces of the third doped patterns 165 may correspond to the second surface S2 of the semiconductor body SB. The third doped patterns 165 may have the second conductivity type and may be epitaxial patterns formed by an epitaxial growth process. A concentration of dopants having the second conductivity type in each of the third doped patterns 165 may be equal to or greater than the concentration of the dopants having the second conductivity type in the third doped region 160. The third doped patterns 165 may be used to reduce a contact resistance between the third contacts CT3 and the third doped region 160.

Except for the differences described above, other components and features of the semiconductor device according to the present embodiments may be substantially the same as corresponding components and features of the semiconductor device described with reference to FIGS. 1, 2A, and 2B.

Figure 4:
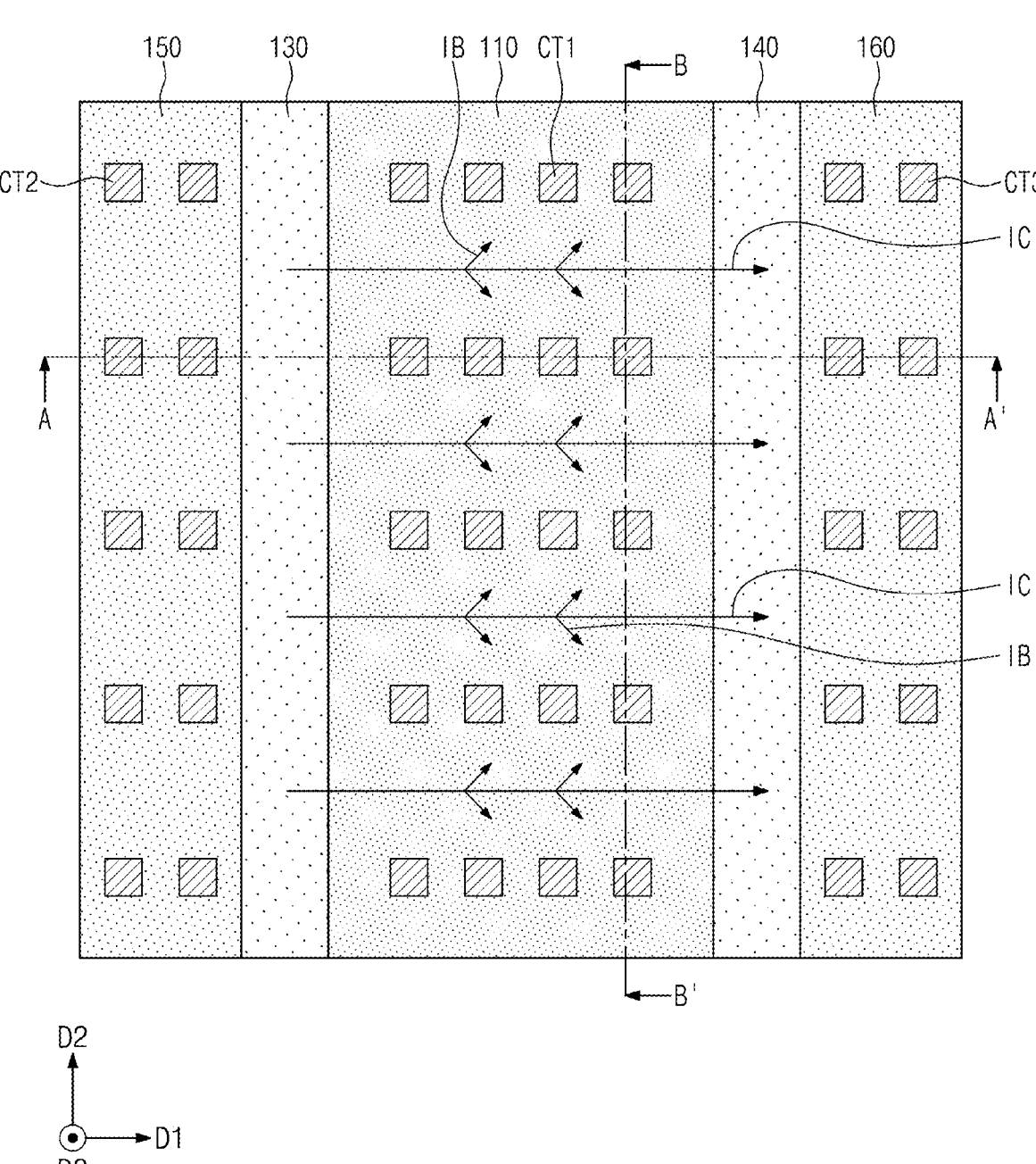
FIG. 4 is a plan view illustrating a semiconductor device according to some embodiments of the inventive concepts.
Figure 5A:
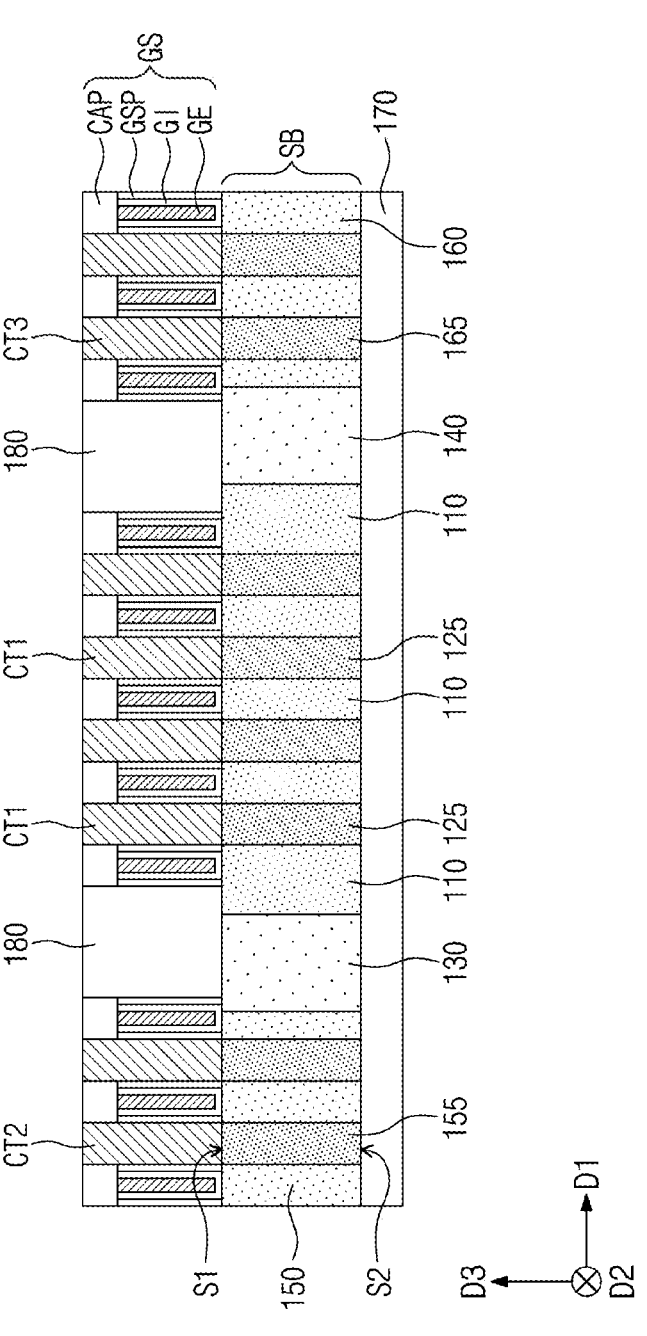
FIG. 5A is a cross-sectional view taken along a line A-A' of FIG. 4.
Figure 5B:
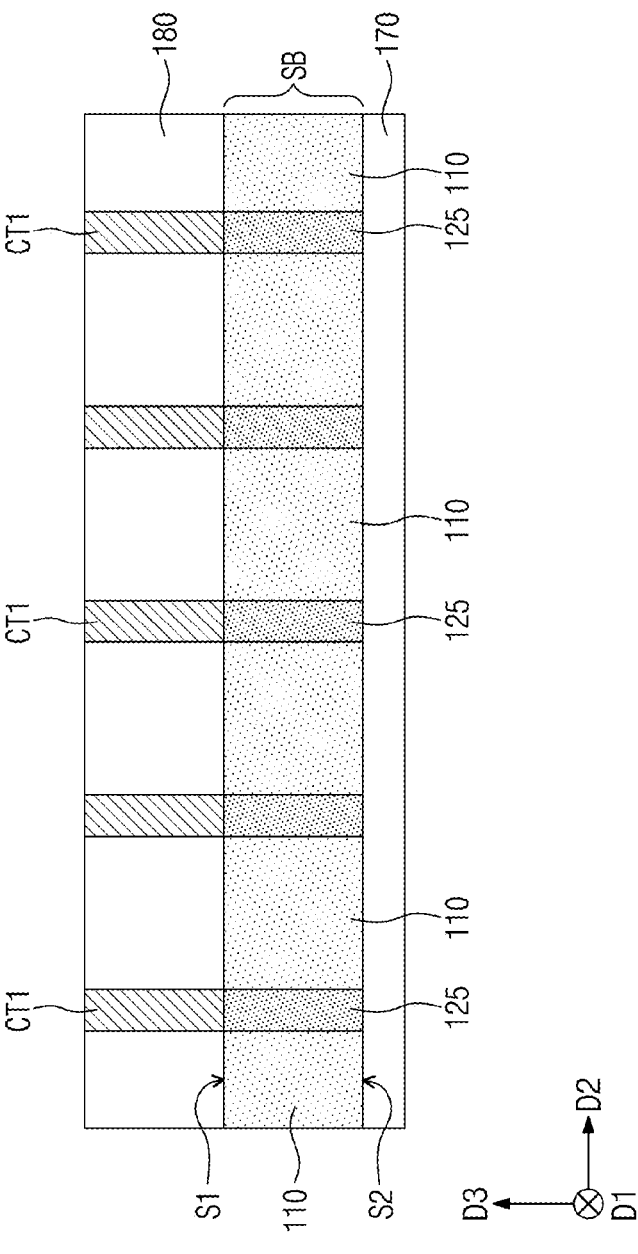
FIG. 5B is a cross-sectional view taken along a line B-B' of FIG. 4.

FIG. 4 is a plan view illustrating a semiconductor device according to some embodiments of the inventive concepts. FIG. 5A is a cross-sectional view taken along a line A-A' of FIG. 4, and FIG. 5B is a cross-sectional view taken along a line B-B' of FIG. 4. Hereinafter, differences between the present embodiments and the above embodiments of FIGS. 1, 2A, and 2B will be mainly described for the purpose of ease and convenience in explanation.

Referring to FIGS. 4, 5A, and 5B, the semiconductor body SB may include a plurality of first doped patterns 125 disposed in the first well region 110. In some embodiments, the plurality of first doped regions 120 described with reference to FIGS. 1, 2A, and 2B may be omitted. The plurality of first doped patterns 125 may be spaced apart from each other in the first direction D1 and the second direction D2 in the first well region 110 and may be disposed under the first contacts CT1, respectively. The plurality of first doped patterns 125 may be electrically connected to the first contacts CT1, respectively. In some embodiments, each of the plurality of first doped patterns 125 may penetrate the first well region 110 in the third direction D3. Top surfaces of the plurality of first doped patterns 125 may correspond to the first surface S1 of the semiconductor body SB, and bottom surfaces of the plurality of first doped patterns 125 may correspond to the second surface S2 of the semiconductor body SB.

The plurality of first doped patterns 125 may have the first conductivity type and may be epitaxial patterns formed by an epitaxial growth process. A concentration of dopants having the first conductivity type in the plurality of first doped patterns 125 may be greater than the concentration of the dopants having the first conductivity type in the first well region 110. The plurality of first doped patterns 125 may also be referred to as a plurality of first doped regions. According to the present embodiments, the plurality of first doped patterns 125 and the first contacts CT1 may constitute a plurality of bases of a bipolar junction transistor.

The semiconductor body SB may further include second doped patterns 155 penetrating the second doped region 150, and third doped patterns 165 penetrating the third doped region 160. The second doped patterns 155 and the third doped patterns 165 may be substantially the same as the second doped patterns 155 and the third doped patterns 165 described with reference to FIGS. 1, 3A, and 3B.

Except for the differences described above, other components and features of the semiconductor device according to the present embodiments may be substantially the same as corresponding components and features of the semiconductor device described with reference to FIGS. 1, 2A and 2B.

Figure 6A:
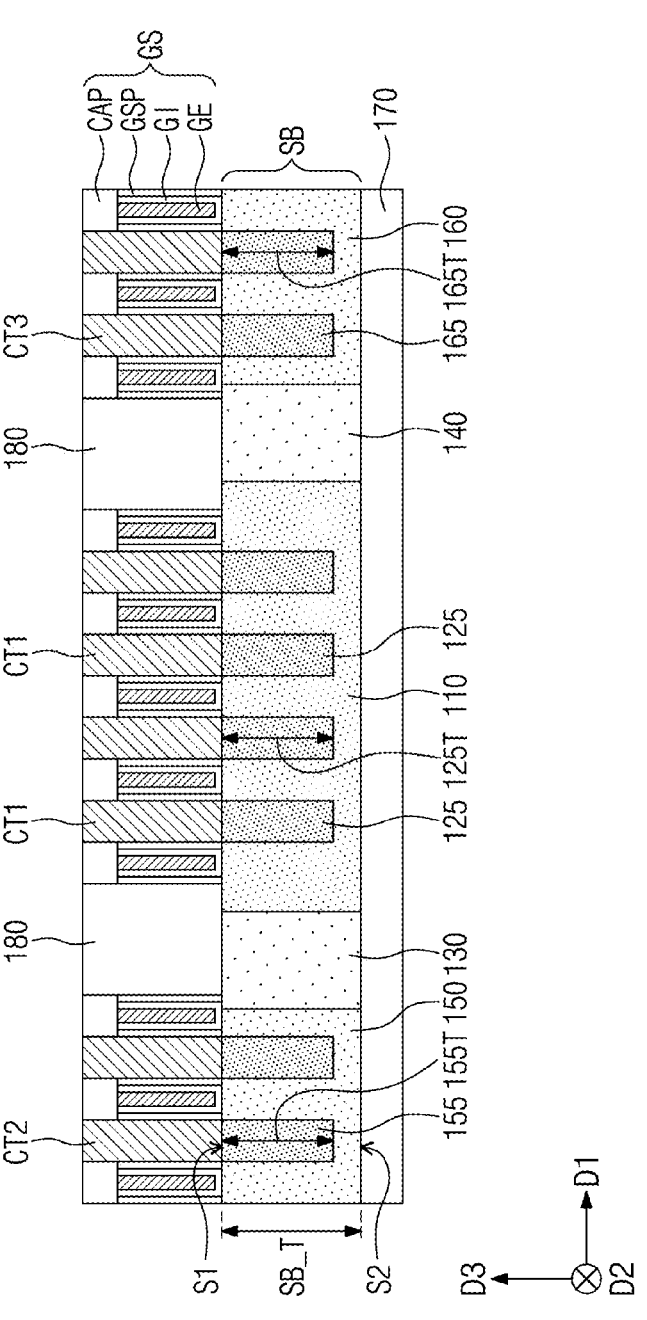
FIGS. 6A and 6B are cross-sectional views corresponding to the lines A-A' and B-B' of FIG. 4, respectively, to illustrate a semiconductor device according to some embodiments of the inventive concepts.
Figure 6B:
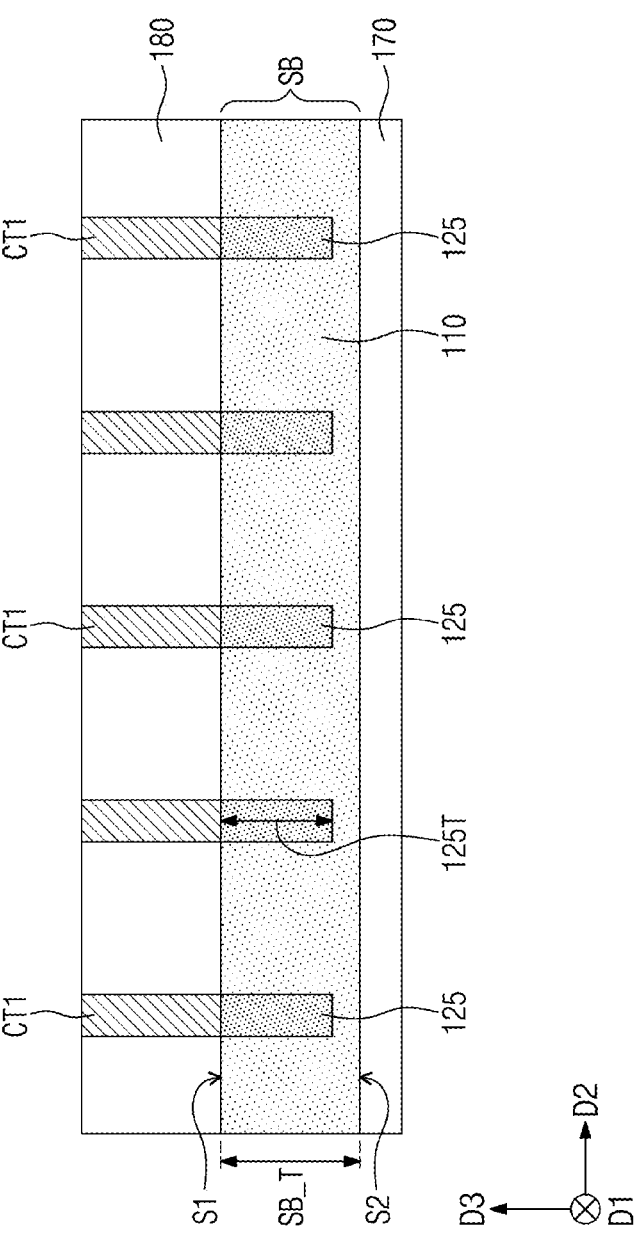

FIGS. 6A and 6B are cross-sectional views corresponding to the lines A-A' and B-B' of FIG. 4, respectively, to illustrate a semiconductor device according to some embodiments of the inventive concepts. Hereinafter, differences between the present embodiments and the above embodiments of FIGS. 4, 5A, and 5B will be mainly described for the purpose of ease and convenience in explanation.

Referring to FIGS. 4, 6A, and 6B, according to some embodiments, each of the first doped patterns 125 may penetrate a portion of the first well region 110 in the third direction D3. Top surfaces of the plurality of first doped patterns 125 may correspond to the first surface S1 of the semiconductor body SB, and bottom surfaces of the plurality of first doped patterns 125 may be located at a height higher than the second surface S2 of the semiconductor body SB. As used herein, the 'height' may be a distance measured from the second surface S2 of the semiconductor body SB in the third direction D3. The first well region 110 may extend under the plurality of first doped patterns 125 and may at least partially cover the bottom surfaces of the plurality of first doped patterns 125. Each of the plurality of first doped patterns 125 may have a thickness 125T in the third direction D3, and the thickness 125T of each of the plurality of first doped patterns 125 may be less than a thickness SB_T of the semiconductor body SB in the third direction D3.

Each of the second doped patterns 155 may penetrate a portion of the second doped region 150 in the third direction D3. Top surfaces of the second doped patterns 155 may correspond to the first surface S1 of the semiconductor body SB, and bottom surfaces of the second doped patterns 155 may be located at a height higher than the second surface S2 of the semiconductor body SB. The second doped region 150 may extend under the second doped patterns 155 and may cover the bottom surfaces of the second doped patterns 155. Each of the second doped patterns 155 may have a thickness 155T in the third direction D3, and the thickness 155T of each of the second doped patterns 155 may be less than the thickness SB_T of the semiconductor body SB in the third direction D3.

Each of the third doped patterns 165 may penetrate a portion of the third doped region 160 in the third direction D3. Top surfaces of the third doped patterns 165 may correspond to the first surface S1 of the semiconductor body SB, and bottom surfaces of the third doped patterns 165 may be located at a height higher than the second surface S2 of the semiconductor body SB. The third doped region 160 may extend under the third doped patterns 165 and may cover the bottom surfaces of the third doped patterns 165. Each of the third doped patterns 165 may have a thickness 165T in the third direction D3, and the thickness 165T of each of the third doped patterns 165 may be less than the thickness SB_T of the semiconductor body SB in the third direction D3.

Except for the differences described above, other components and features of the semiconductor device according to the present embodiments may be substantially the same as corresponding components and features of the semiconductor device described with reference to FIGS. 4, 5A, and 5B.

Figure 7:
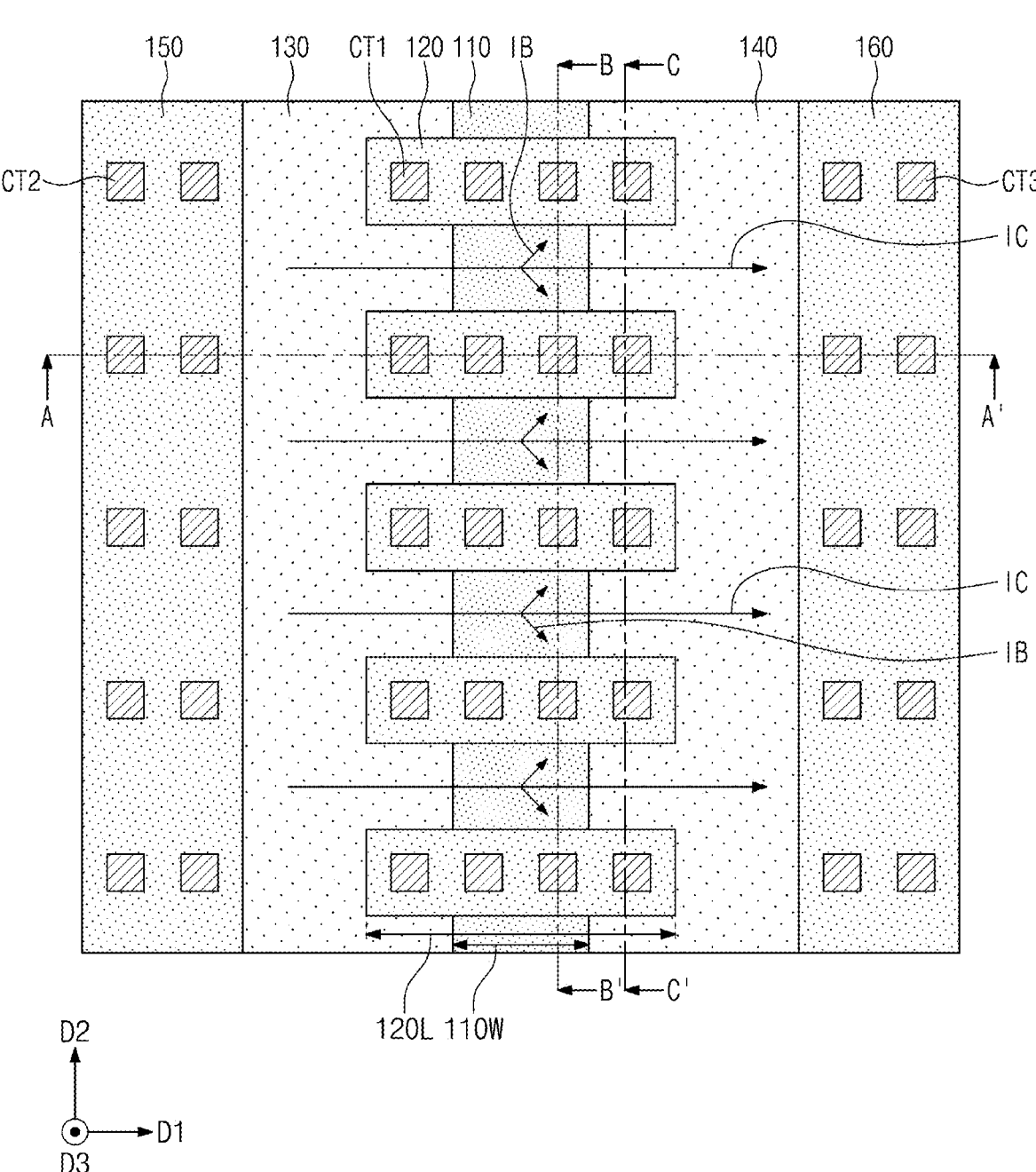
FIG. 7 is a plan view illustrating a semiconductor device according to some embodiments of the inventive concepts.
Figure 8A:
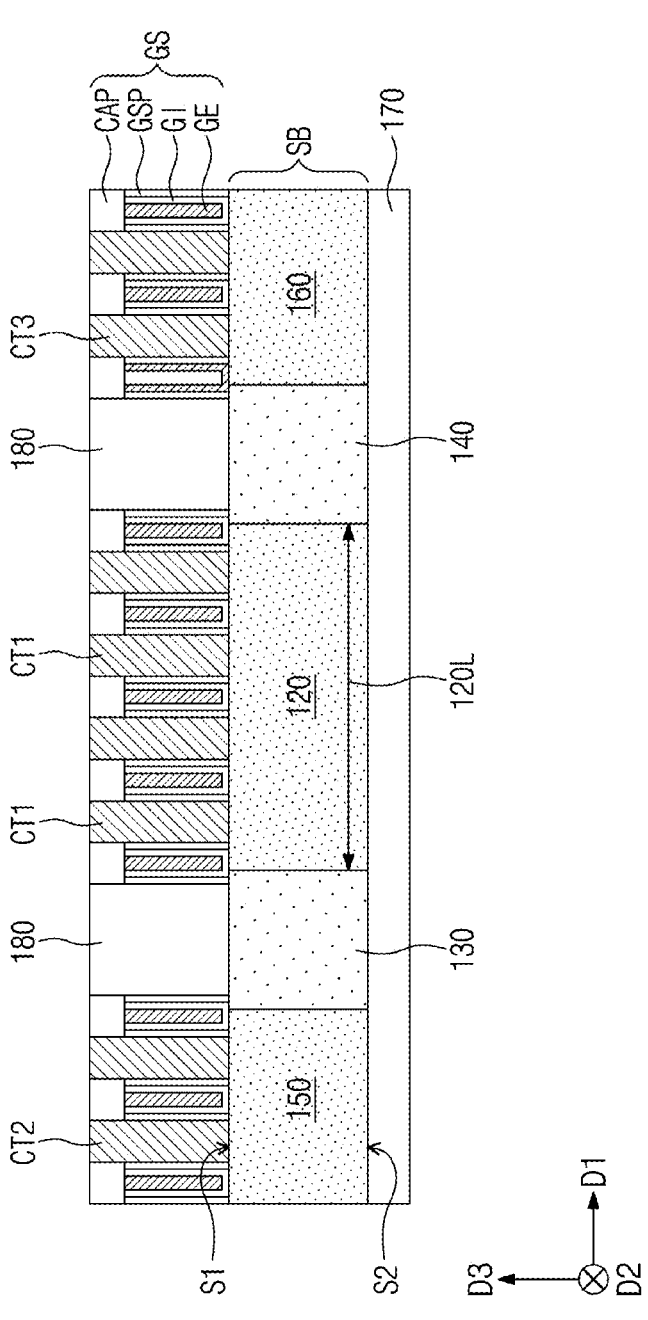
FIG. 8A is a cross-sectional view taken along a line A-A' of FIG. 7.
Figure 8B:
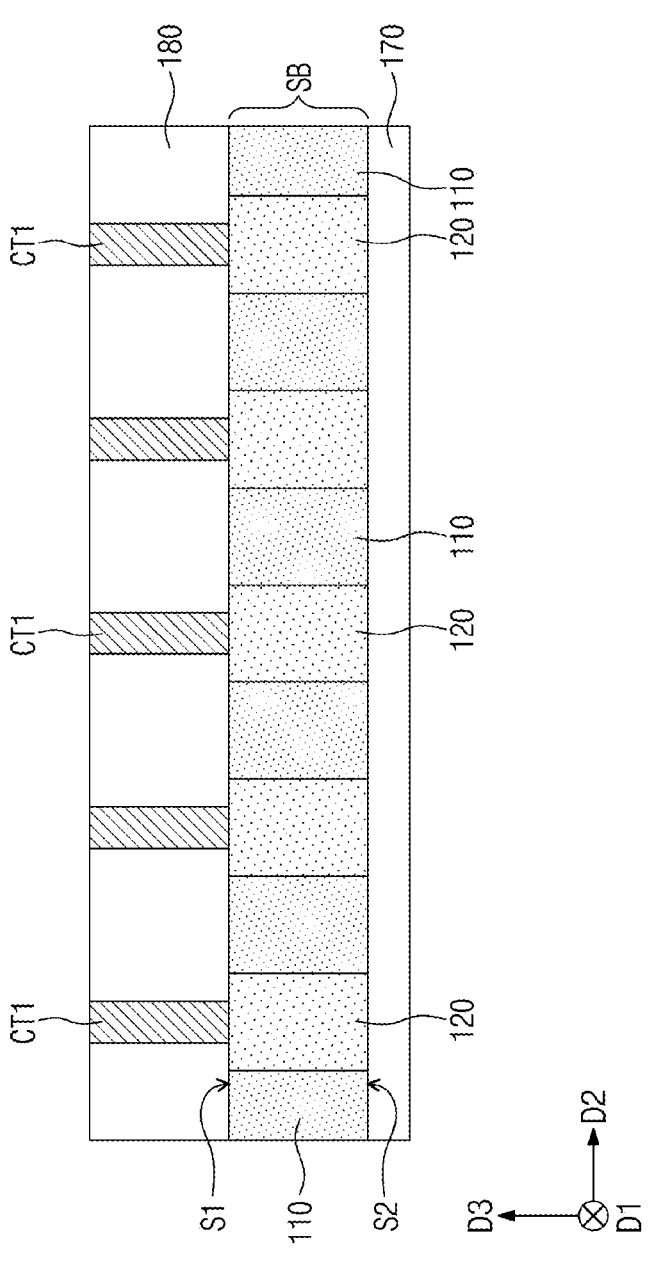
FIG. 8B is a cross-sectional view taken along a line B-B' of FIG. 7.
Figure 8C:
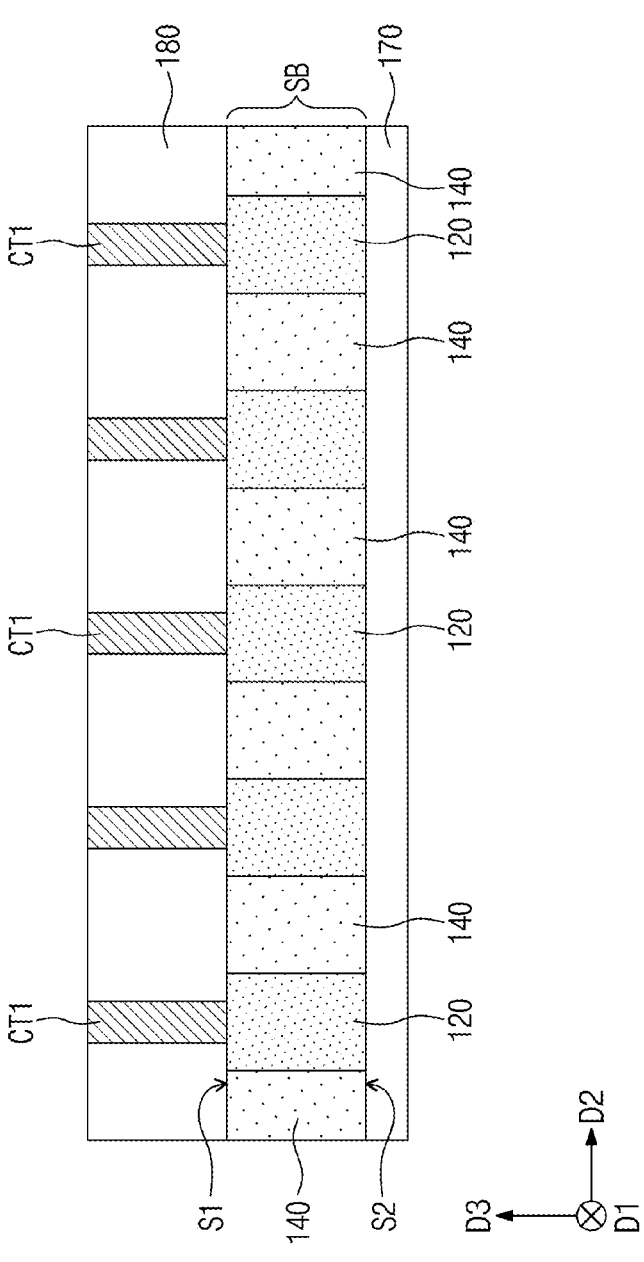
FIG. 8C is a cross-sectional view taken along a line C-C' of FIG. 7.

FIG. 7 is a plan view illustrating a semiconductor device according to some embodiments of the inventive concepts. FIG. 8A is a cross-sectional view taken along a line A-A' of FIG. 7, FIG. 8B is a cross-sectional view taken along a line B-B' of FIG. 7, and FIG. 8C is a cross-sectional view taken along a line C-C' of FIG. 7. Hereinafter, differences between the present embodiments and the above embodiments of FIGS. 1, 2A, and 2B will be mainly described for the purpose of ease and convenience in explanation.

Referring to FIGS. 7, 8A, 8B and 8C, the first well region 110 may have a width 110W in the first direction D1, and the width 110W of the first well region 110 may be less than the length 120L of each of the plurality of first doped regions 120. An end portion of each of the plurality of first doped regions 120 may extend into the second well region 130 and may penetrate the second well region 130. Another end portion of each of the plurality of first doped regions 120 may extend into the third well region 140 and may penetrate the third well region 140.

First contacts CT1, spaced apart from each other in the first direction D1, of the first contacts CT1 may be disposed on a corresponding first doped region of the plurality of first doped regions 120 and may be connected in common to the corresponding first doped region. First contacts CT1, spaced apart from each other in the second direction D2, of the first contacts CT1 may be disposed on the plurality of first doped regions 120, respectively, and may be connected to the plurality of first doped regions 120, respectively. The plurality of first doped regions 120 and the first contacts CT1 may constitute a plurality of bases of a bipolar junction transistor.

According to the present embodiments, the width 110W of the first well region 110 may be less than the length 120L of each of the plurality of first doped regions 120, and in this case, the first current IC flowing from the emitter constituted by the second contacts CT2 and the second doped region 150 to the collector constituted by the third doped region 160 and the third contacts CT3 may be increased. In addition, the second current IB flowing from the emitter constituted by the second contacts CT2 and the second doped region 150 to the plurality of bases constituted by the plurality of first doped regions 120 and the first contacts CT1 may be reduced. As a result, a current (e.g., the first current IC and the second current IB) flowing through the bipolar junction transistor may be controlled by adjusting the width 110W of the first well region 110 and the length 120L of each of the plurality of first doped regions 120, and thus operating characteristics of the bipolar junction transistor may be easily controlled.

Figure 9:
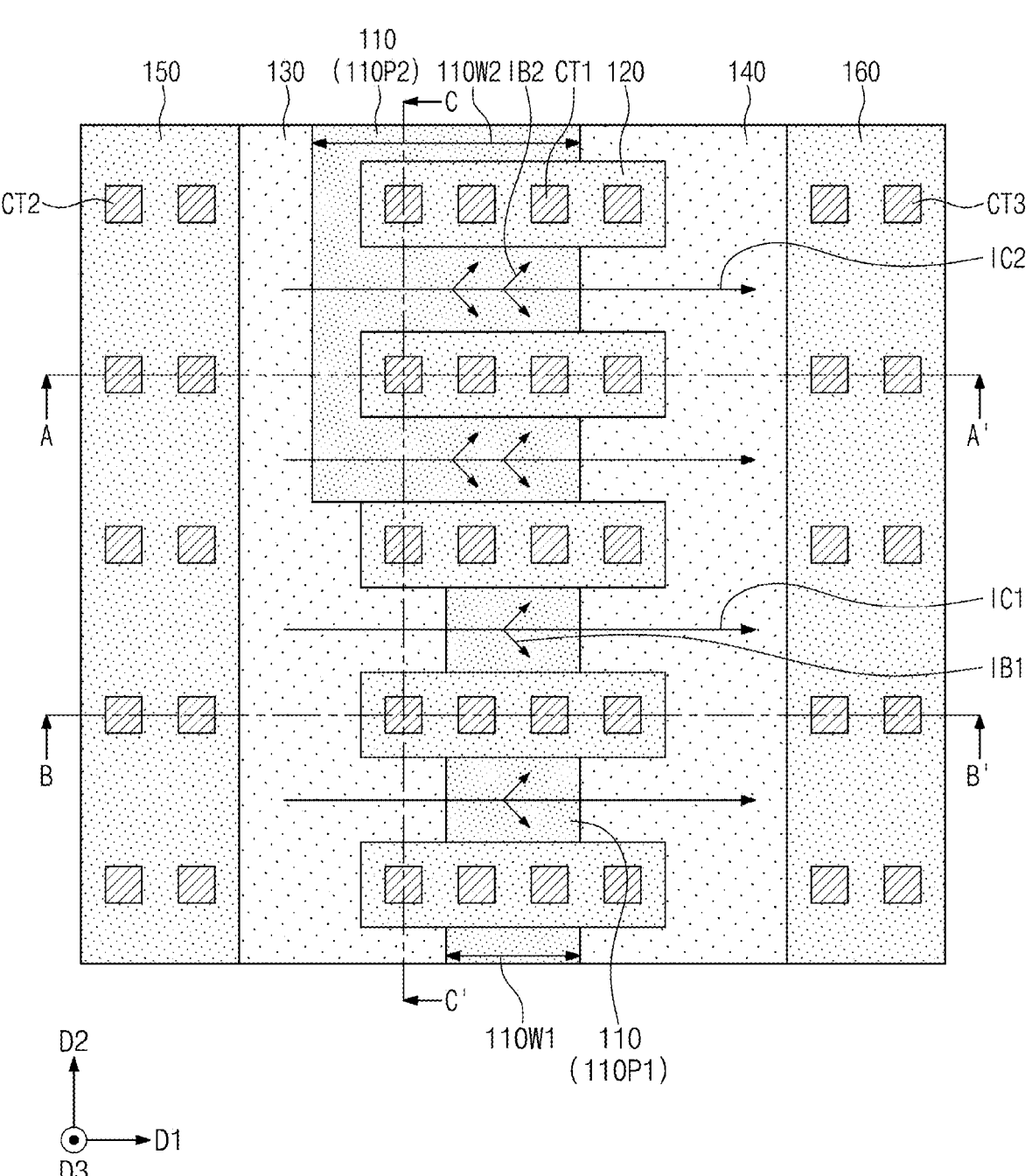
FIG. 9 is a plan view illustrating a semiconductor device according to some embodiments of the inventive concepts.
Figure 10A:
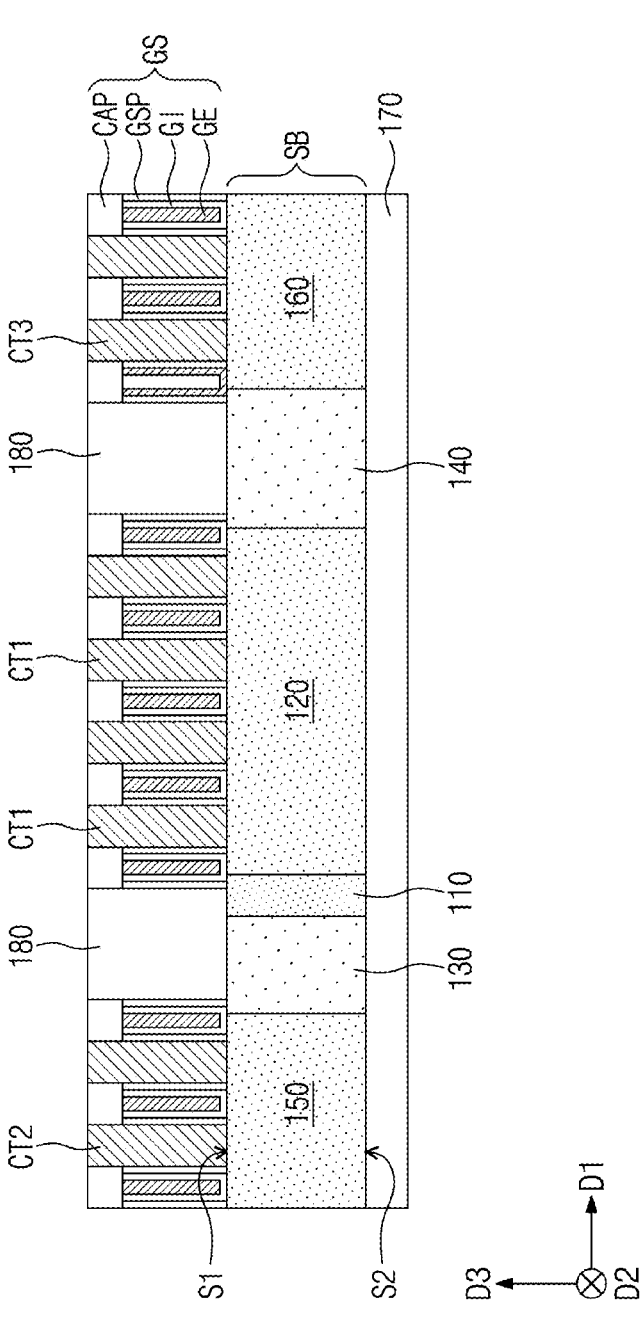
FIG. 10A is a cross-sectional view taken along a line A-A' of FIG. 9.
Figure 10B:
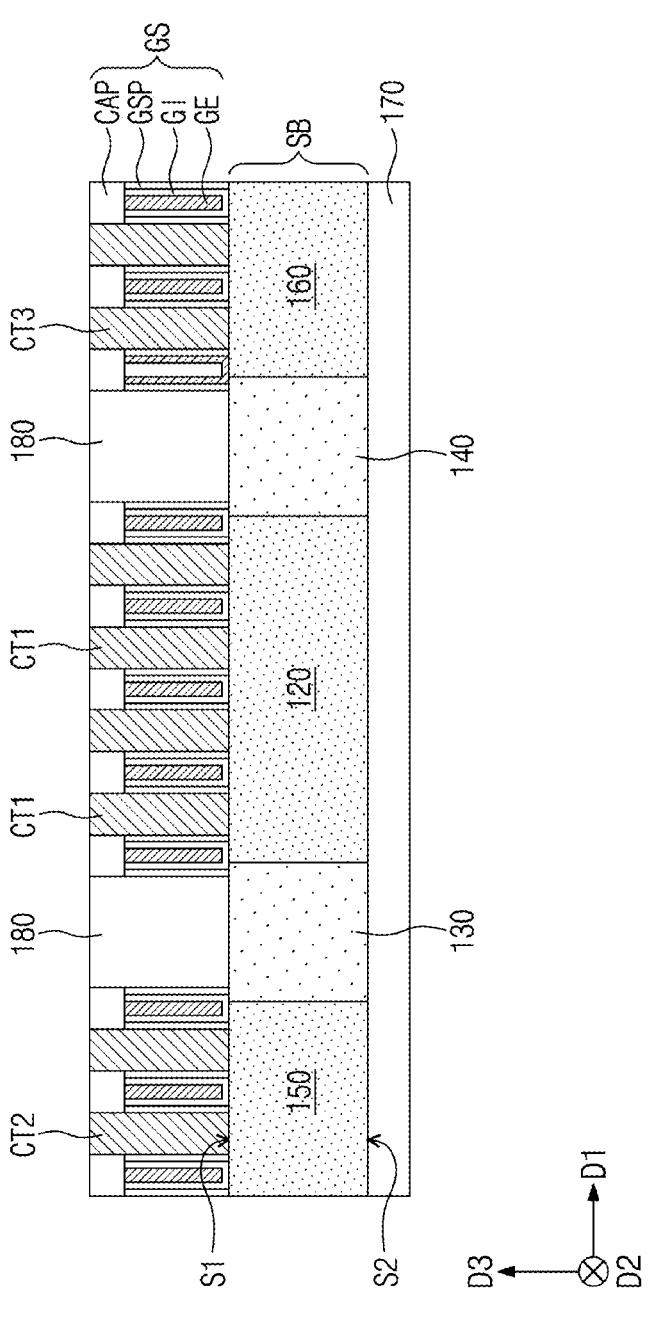
FIG. 10B is a cross-sectional view taken along a line B-B' of FIG. 9.
Figure 10C:
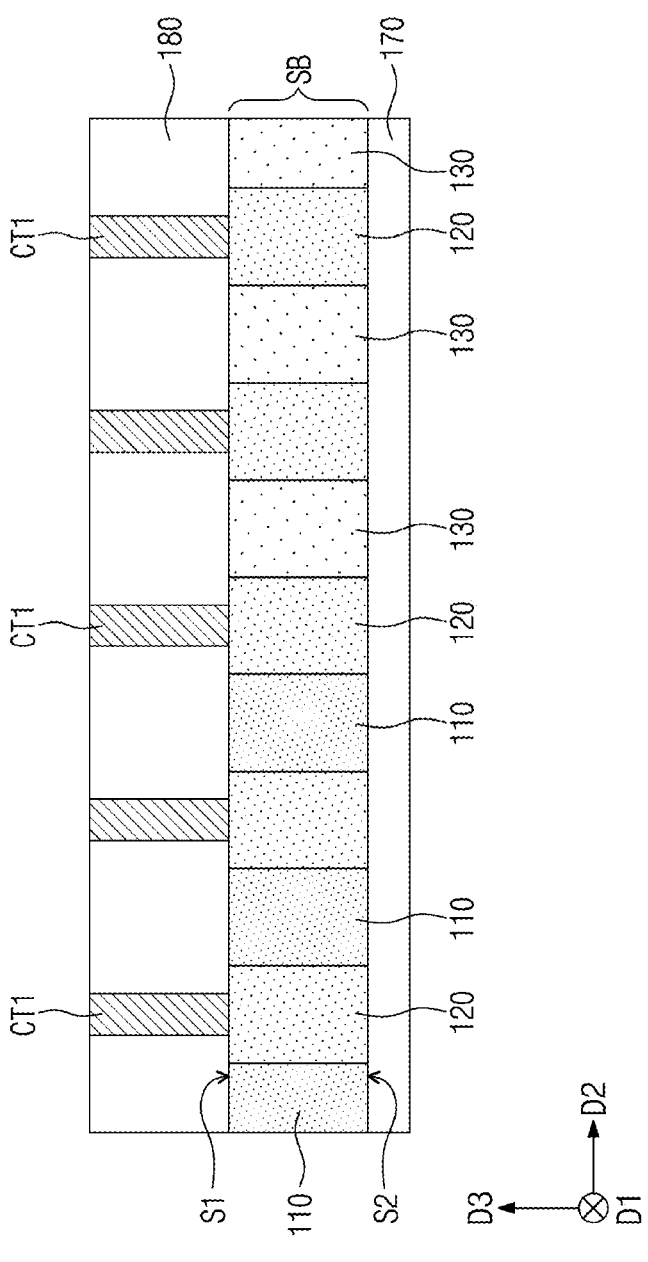
FIG. 10C is a cross-sectional view taken along a line C-C' of FIG. 9.

FIG. 9 is a plan view illustrating a semiconductor device according to some embodiments of the inventive concepts. FIG. 10A is a cross-sectional view taken along a line A-A' of FIG. 9, FIG. 10B is a cross-sectional view taken along a line B-B' of FIG. 9, and FIG. 10C is a cross-sectional view taken along a line C-C' of FIG. 9. Hereinafter, differences between the present embodiments and the above embodiments of FIGS. 1, 2A, and 2B will be mainly described for the purpose of ease and convenience in explanation.

Referring to FIGS. 9, 10A, 10B, and 10C, the first well region 110 may include a first portion 110P1 having a first width 110W1 in the first direction D1 and a second portion 110P2 having a second width 110W2 in the first direction D1, and the first width 110W1 and the second width 110W2 may be different from each other. Some of the plurality of first doped regions 120 may be disposed in the first portion 110P1 of the first well region 110 and may penetrate the first portion 110P1 of the first well region 110 in the third direction D3. Others of the plurality of first doped regions 120 may be disposed in the second portion 110P2 of the first well region 110 and may penetrate the second portion 110P2 of the first well region 110 in the third direction D3.

For example, the first width 110W1 may be less than the second width 110W2. In this case, a first current IC1 flowing through the first portion 110P1 of the first well region 110 may be greater than a first current IC2 flowing through the second portion 110P2 of the first well region 110. In addition, a second current IB1 flowing through the first portion 110P1 of the first well region 110 may be less than a second current IB2 flowing through the second portion 110P2 of the first well region 110. As a result, a current (e.g., the first current IC and the second current IB) flowing through the bipolar junction transistor may be controlled because the first well region 110 is formed to include the first and second portions 110P1 and 110P2 having the different widths 110W1 and 110W2, and thus operating characteristics of the bipolar junction transistor may be easily controlled.

FIGS. 11 to 16 are cross-sectional views corresponding to the line A-A' of FIG. 1 to illustrate a method of manufacturing a semiconductor device according to some embodiments of the inventive concepts. Hereinafter, the descriptions of the same features as mentioned with reference to FIGS. 1, 2A, and 2B will be omitted for the purpose of ease and convenience in explanation.

Figure 11:
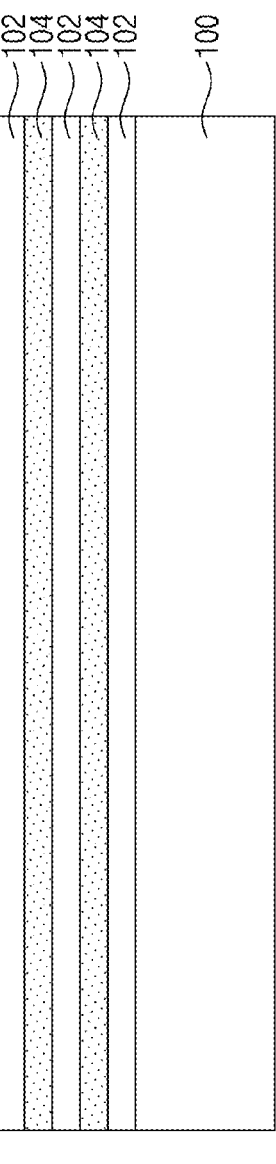
FIGS. 11 to 16 are cross-sectional views corresponding to the line A-A' of FIG. 1 to illustrate a method of manufacturing a semiconductor device according to some embodiments of the inventive concepts.
Figure 11:
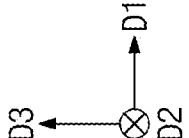

Referring to FIG. 11, first semiconductor layers 102 and second semiconductor layers 104 may be alternately stacked on a substrate 100. The substrate 100 may be a semiconductor substrate. The first semiconductor layers 102 may include, for example, silicon, and the second semiconductor layers 104 may include, for example, silicon-germanium.

Figure 12:
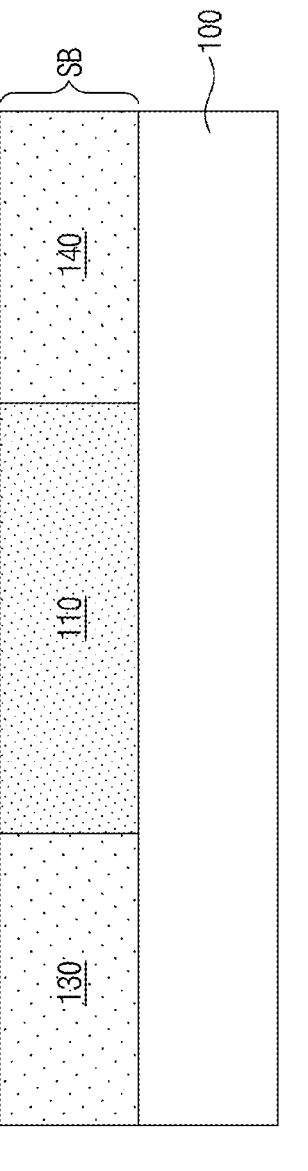
Figure 12:
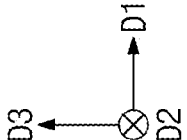

Referring to FIGS. 1 and 12, a first well region 110, a second well region 130 and a third well region 140 may be formed in the first semiconductor layers 102 and the second semiconductor layers 104. For example, the formation of the second well region 130 and the third well region 140 may include injecting dopants having a second conductivity type into the first semiconductor layers 102 and the second semiconductor layers 104. A concentration of the dopants having the second conductivity type in the second well region 130 may be equal to a concentration of the dopants having the second conductivity type in the third well region 140. For example, the formation of the first well region 110 may include injecting dopants having a first conductivity type into the first semiconductor layers 102 and the second semiconductor layers 104 between the second well region 130 and the third well region 140. The first well region 110, the second well region 130 and the third well region 140 may constitute a semiconductor body SB, and side surfaces of the first well region 110, the second well region 130 and the third well region 140 may be in contact with each other in the first direction D1.

Figure 13:
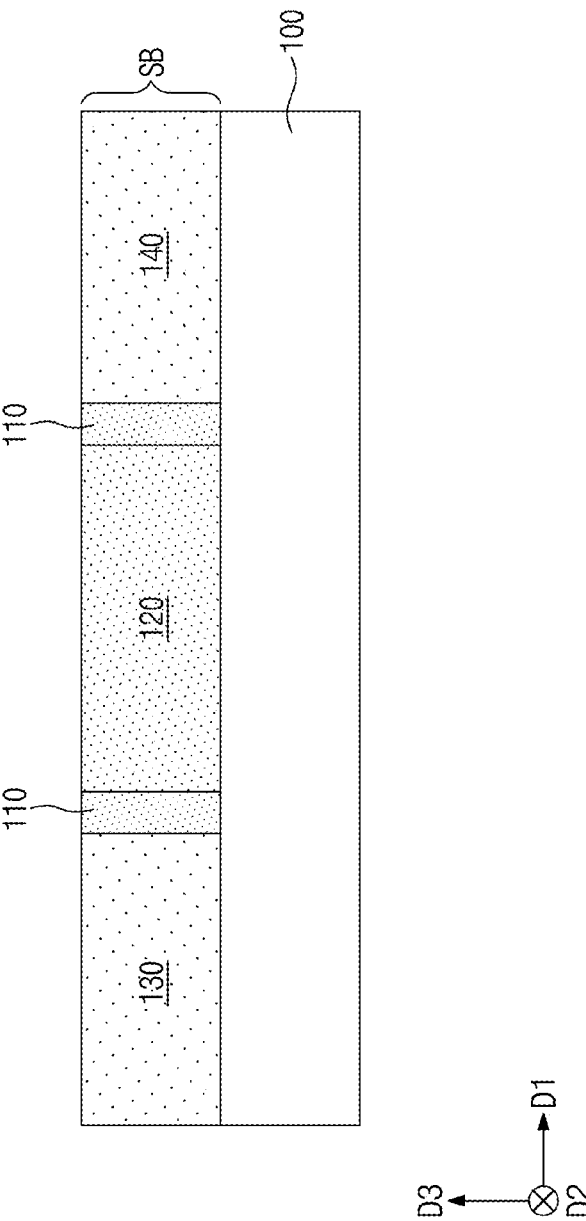
Figure 13:
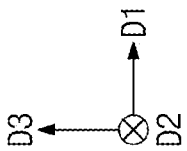

Referring to FIGS. 1 and 13, a plurality of first doped regions 120 may be formed in the first well region 110. The plurality of first doped regions 120 may be spaced apart from each other in the second direction D2 in the first well region 110 and may extend in the first direction D1. Each of the plurality of first doped regions 120 may penetrate the first well region 110 in the third direction D3. For example, the formation of the plurality of first doped regions 120 may include injecting dopants having the first conductivity type into the first well region 110. A concentration of the dopants having the first conductivity type in each of the plurality of first doped regions 120 may be greater than a concentration of the dopants having the first conductivity type in the first well region 110.

Figure 14:
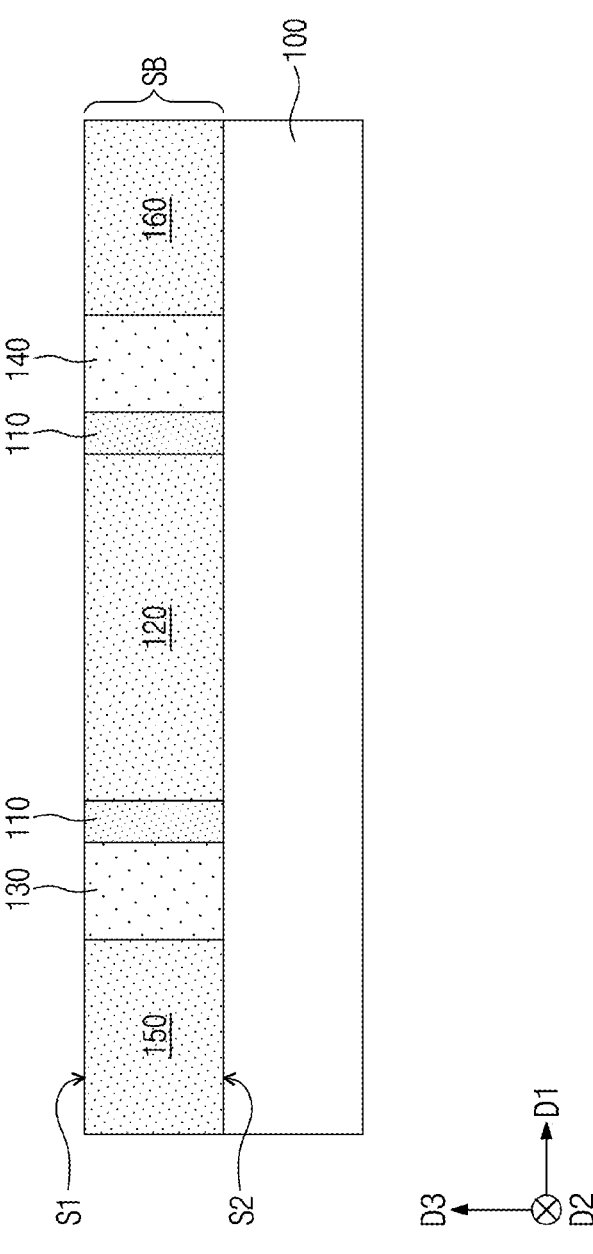

Referring to FIGS. 1 and 14, in some embodiments, dopants having the second conductivity type may be additionally injected into the second well region 130 or the third well region 140. In this case, the concentration of the dopants having the second conductivity type in the second well region 130 may be different from the concentration of the dopants having the second conductivity type in the third well region 140.

A second doped region 150 may be formed in the second well region 130. The second doped region 150 may penetrate the second well region 130 in the third direction D3. For example, the formation of the second doped region 150 may include injecting dopants having the second conductivity type into the second well region 130. A concentration of the dopants having the second conductivity type in the second doped region 150 may be greater than the concentration of the dopants having the second conductivity type in the second well region 130. A portion of the second well region 130 may be disposed between the second doped region 150 and the first well region 110.

A third doped region 160 may be formed in the third well region 140. The third doped region 160 may penetrate the third well region 140 in the third direction D3. For example, the formation of the third doped region 160 may include injecting dopants having the second conductivity type into the third well region 140. A concentration of the dopants having the second conductivity type in the third doped region 160 may be greater than the concentration of the dopants having the second conductivity type in the third well region 140. A portion of the third well region 140 may be disposed between the third doped region 160 and the first well region 110.

Side surfaces of the first to third well regions 110, 130 and 140, the second doped region 150, and the third doped region 160 may be in contact with each other in the first direction D1. The first to third well regions 110, 130 and 140, the plurality of first doped regions 120, the second doped region 150 and the third doped region 160 may constitute the semiconductor body SB. The semiconductor body SB may have a first surface S1 and a second surface S2 which are opposite to each other, and the second surface S2 of the semiconductor body SB may be adjacent to the substrate 100.

Figure 15:
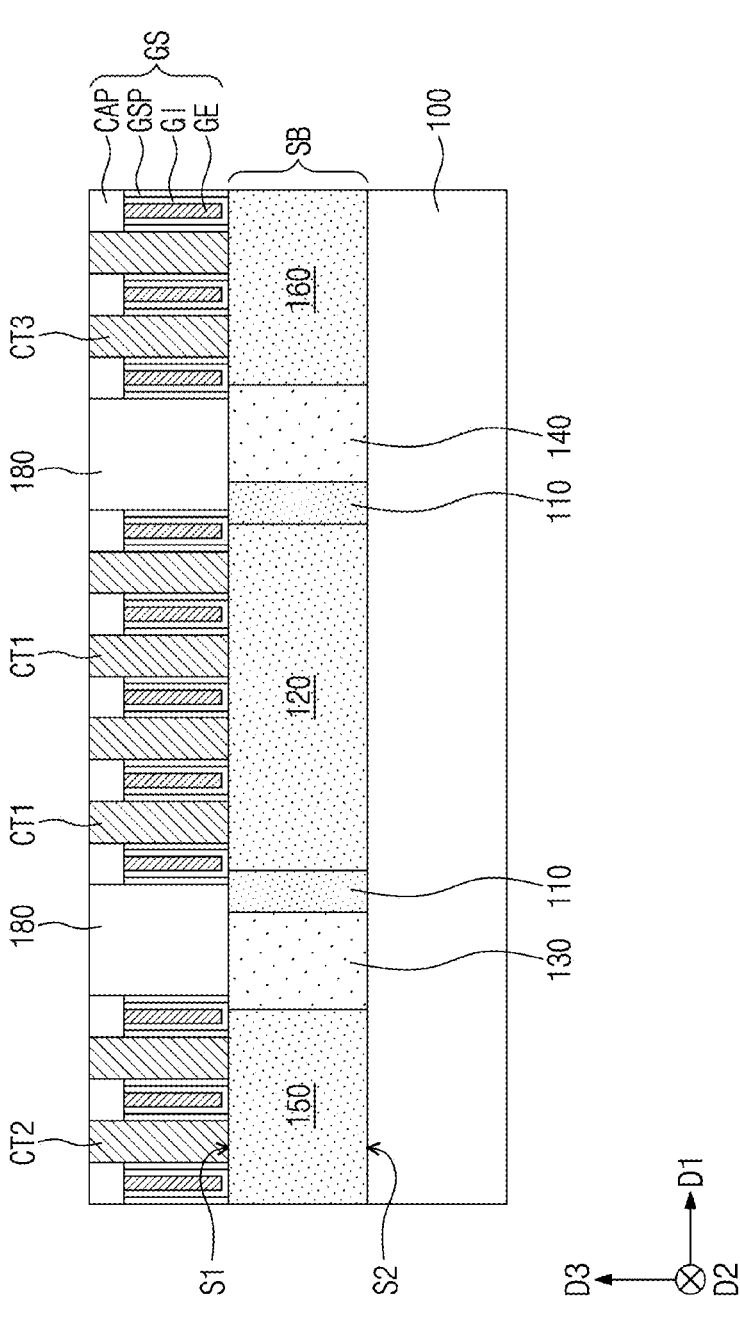

Referring to FIGS. 1 and 15, a plurality of gate structures GS may be formed on the first surface S1 of the semiconductor body SB. The plurality of gate structures GS may be spaced apart from each other in the first direction D1 and may extend in the second direction D2. Each of the plurality of gate structures GS may include a gate electrode GE extending in the second direction D2, a gate dielectric pattern GI between the gate electrode GE and the first surface S1 of the semiconductor body SB, gate spacers GSP on side surfaces of the gate electrode GE, and a gate capping pattern CAP on a top surface of the gate electrode GE. The gate dielectric pattern GI may extend between the gate electrode GE and the gate spacers GSP, and a topmost surface of the gate dielectric pattern GI may be substantially coplanar with the top surface of the gate electrode GE. The gate capping pattern CAP may extend onto top surfaces of the gate spacers GSP.

An upper interlayer insulating layer 180 may be formed on the first surface S1 of the semiconductor body SB and may cover the plurality of gate structures GS. First contacts CT1, second contacts CT2 and third contacts CT3 may be formed in the upper interlayer insulating layer 180 and between the plurality of gate structures GS. For example, the formation of the first to third contacts CT1, CT2 and CT3 may include forming first contact holes, second contact holes and third contact holes in the upper interlayer insulating layer 180 between the plurality of gate structures GS, and forming the first contacts CT1, the second contacts CT2 and the third contacts CT3 in the first contact holes, the second contact holes and the third contact holes, respectively.

Figure 16:
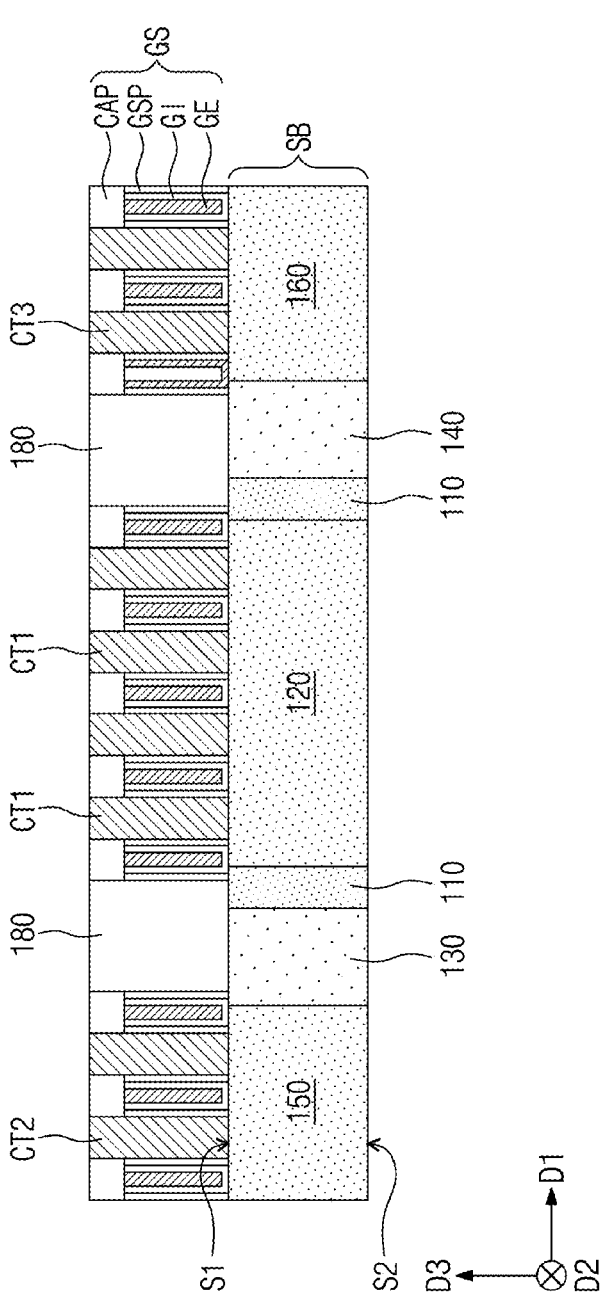

Referring to FIGS. 1 and 16, the substrate 100 may be removed. For example, the removal of the substrate 100 may include grinding the substrate 100 to expose the second surface S2 of the semiconductor body SB. Thereafter, as illustrated in FIGS. 1 and 2A, a lower insulating layer 170 may be formed on the second surface S2 of the semiconductor body SB.

FIGS. 17 to 20 are cross-sectional views corresponding to the line A-A' of FIG. 4 to illustrate a method of manufacturing a semiconductor device according to some embodiments of the inventive concepts. Hereinafter, differences between the present embodiments and the above embodiments of FIGS. 11 to 16 will be mainly described for the purpose of ease and convenience in explanation.

First, as described with reference to FIGS. 11 and 12, first semiconductor layers 102 and second semiconductor layers 104 may be alternately stacked on a substrate 100, and a first well region 110, a second well region 130 and a third well region 140 may be formed in the first semiconductor layers 102 and the second semiconductor layers 104. In some embodiments, as described with reference to FIG. 14, dopants having the second conductivity type may be additionally injected into the second well region 130 or the third well region 140. In this case, a concentration of dopants having the second conductivity type in the second well region 130 may be different from a concentration of dopants having the second conductivity type in the third well region 140. A second doped region 150 may be formed in the second well region 130, and a third doped region 160 may be formed in the third well region 140. In some embodiments, the formation of the plurality of first doped regions 120 described with reference to FIG. 13 may be omitted.

Figure 17:
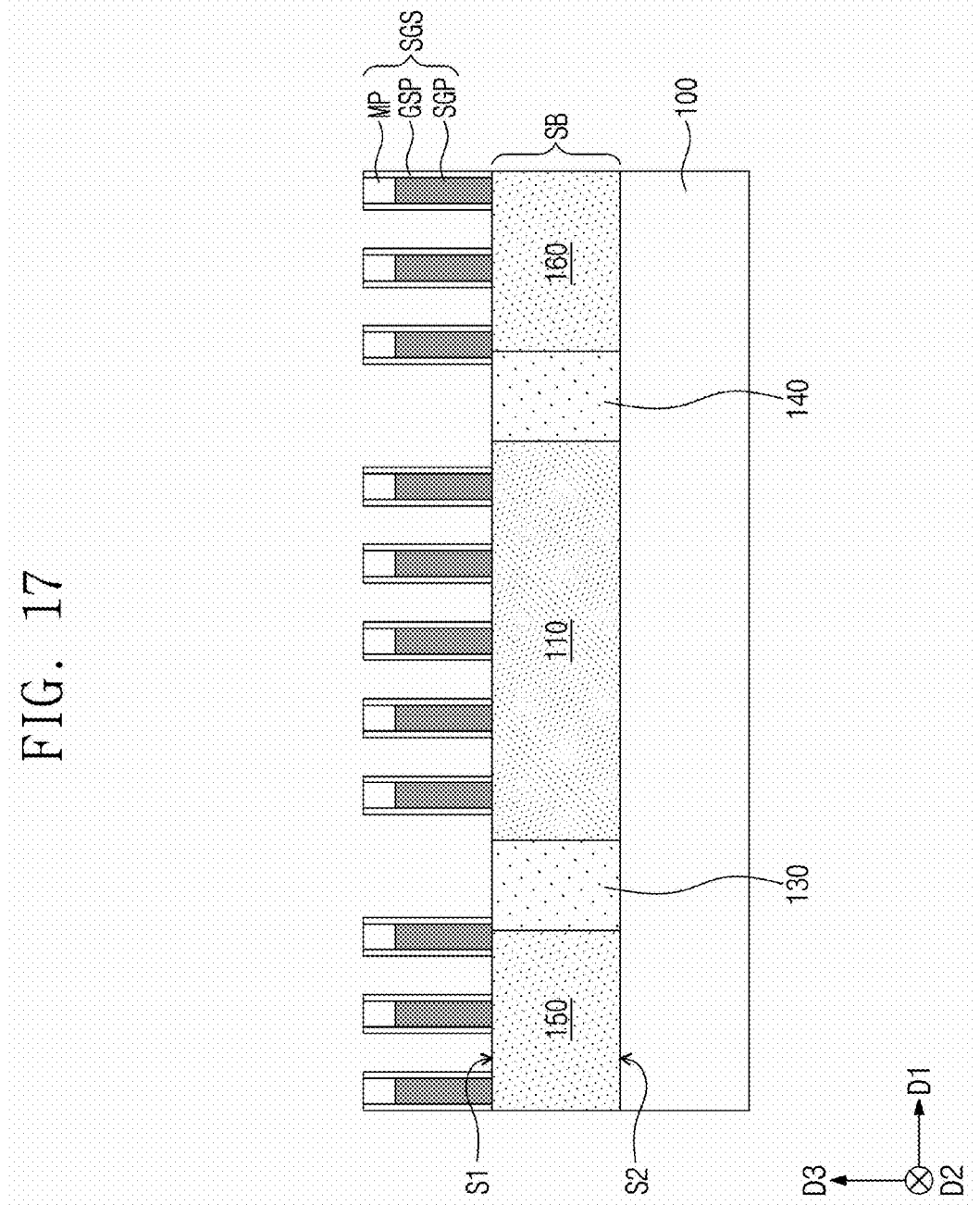
FIGS. 17 to 20 are cross-sectional views corresponding to the line A-A' of FIG. 4 to illustrate a method of manufacturing a semiconductor device according to some embodiments of the inventive concepts.

Referring to FIGS. 4 and 17, the first to third well regions 110, 130 and 140, the second doped region 150 and the third doped region 160 may constitute a semiconductor body SB. The semiconductor body SB may have a first surface S1 and a second surface S2 which are opposite to each other, and the second surface S2 of the semiconductor body SB may be adjacent to the substrate 100.

Sacrificial gate structures SGS may be formed on the first surface S1 of the semiconductor body SB. The sacrificial gate structures SGS may be spaced apart from each other in the first direction D1 and may extend in the second direction D2. Each of the sacrificial gate structures SGS may include a sacrificial gate pattern SGP and a gate mask pattern MP sequentially stacked on the first surface S1 of the semiconductor body SB, and gate spacers GSP on both side surfaces of the sacrificial gate pattern SGP. The gate spacers GSP may extend onto both side surfaces of the gate mask pattern MP. For example, the formation of the sacrificial gate pattern SGP may include forming a sacrificial gate layer (not shown) on the first surface S1 of the semiconductor body SB, forming the gate mask pattern MP defining a region, in which the sacrificial gate pattern SGP will be formed, on the sacrificial gate layer, and patterning the sacrificial gate layer using the gate mask pattern MP as an etch mask. The formation of the gate spacers GSP may include forming a gate spacer layer (not shown) covering the gate mask pattern MP and the sacrificial gate pattern SGP on the first surface S1 of the semiconductor body SB, and anisotropically etching the gate spacer layer. The sacrificial gate pattern SGP may include, for example, poly-silicon, and the gate mask pattern MP and the gate spacers GSP may include, for example, silicon nitride.

Figure 18:
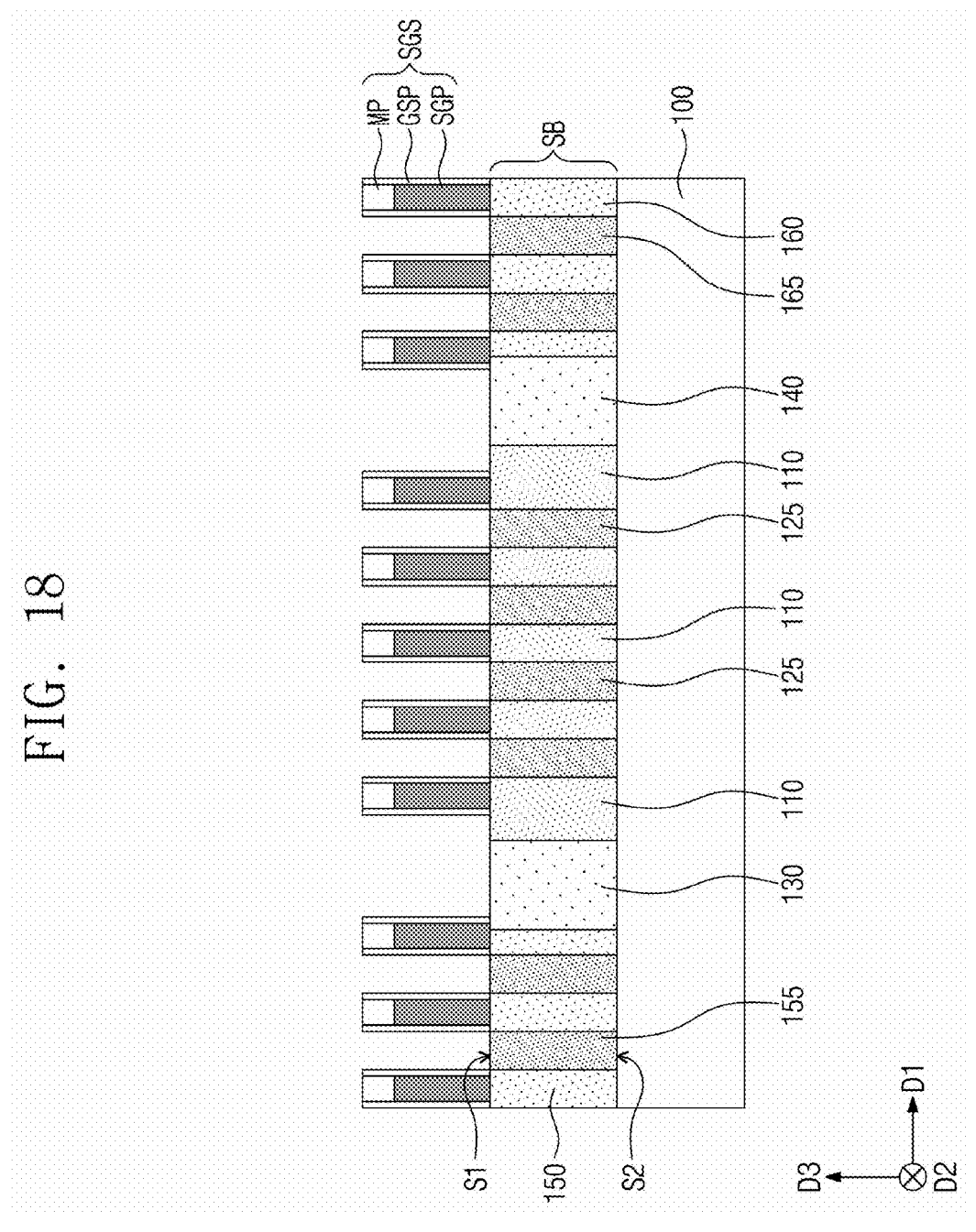

Referring to FIGS. 4 and 18, first doped patterns 125 may be formed in the first well region 110, second doped patterns 155 may be formed in the second doped region 150, and third doped patterns 165 may be formed in the third doped region 160. In some embodiments, a plurality of first doped regions 120 may be formed in the first well region 110 as described with reference to FIGS. 1 and 13, and in this case, the first doped patterns 125 may be formed in the plurality of first doped regions 120.

For example, the formation of the first doped patterns 125 may include patterning the first well region 110 between the sacrificial gate structures SGS to form first holes penetrating the first well region 110, and performing an epitaxial growth process to form the first doped patterns 125 in the first holes, respectively. The formation of the first doped patterns 125 may further include injecting dopants having the first conductivity type into the first doped patterns 125 in the epitaxial growth process or after the epitaxial growth process. A concentration of the dopants having the first conductivity type in the first doped patterns 125 may be greater than the concentration of the dopants having the first conductivity type in the first well region 110. In some embodiments, the first doped patterns 125 may be formed in the plurality of first doped regions 120 formed as described with reference to FIGS. 1 and 13, and in this case, the concentration of the dopants having the first conductivity type in the first doped patterns 125 may be equal to or greater than the concentration of the dopants having the first conductivity type in each of the plurality of first doped regions 120.

For example, the formation of the second doped patterns 155 may include patterning the second doped region 150 between the sacrificial gate structures SGS to form second holes penetrating the second doped region 150, and performing an epitaxial growth process to form the second doped patterns 155 in the second holes, respectively. The formation of the second doped patterns 155 may further include injecting dopants having the second conductivity type into the second doped patterns 155 in the epitaxial growth process or after the epitaxial growth process. A concentration of the dopants having the second conductivity type in each of the second doped patterns 155 may be equal to or greater than the concentration of the dopants having the second conductivity type in the second doped region 150.

For example, the formation of the third doped patterns 165 may include patterning the third doped region 160 between the sacrificial gate structures SGS to form third holes penetrating the third doped region 160, and performing an epitaxial growth process to form the third doped patterns 165 in the third holes, respectively. The formation of the third doped patterns 165 may further include injecting dopants having the second conductivity type into the third doped patterns 165 in the epitaxial growth process or after the epitaxial growth process. A concentration of the dopants having the second conductivity type in each of the third doped patterns 165 may be equal to or greater than the concentration of the dopants having the second conductivity type in the third doped region 160.

Figure 19:
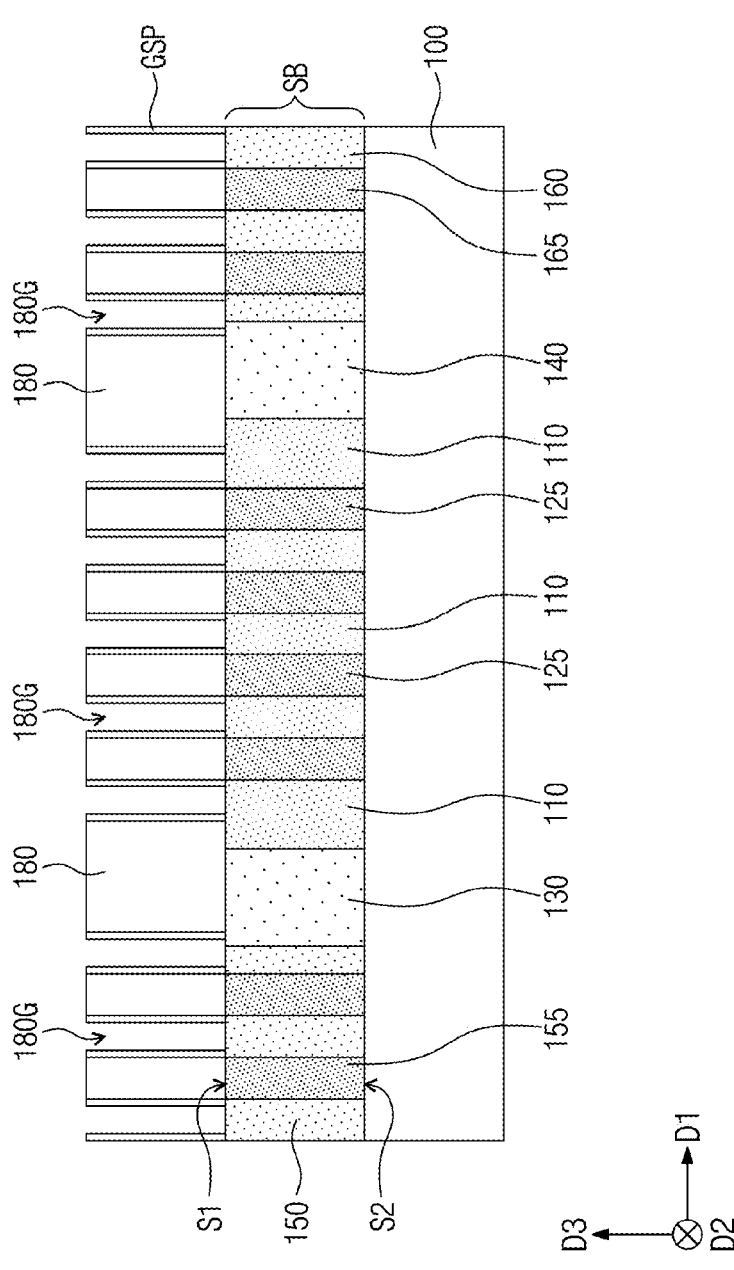

Referring to FIGS. 4 and 19, an upper interlayer insulating layer 180 may be formed on the first surface S1 of the semiconductor body SB to at least partially cover the sacrificial gate structures SGS. Thereafter, the sacrificial gate pattern SGP and the gate mask pattern MP of each of the sacrificial gate structures SGS may be removed. Thus, gap regions 180G may be formed in the upper interlayer insulating layer 180 and between the gate spacers GSP. The gap regions 180G may expose the first surface S1 of the semiconductor body SB.

Figure 20:
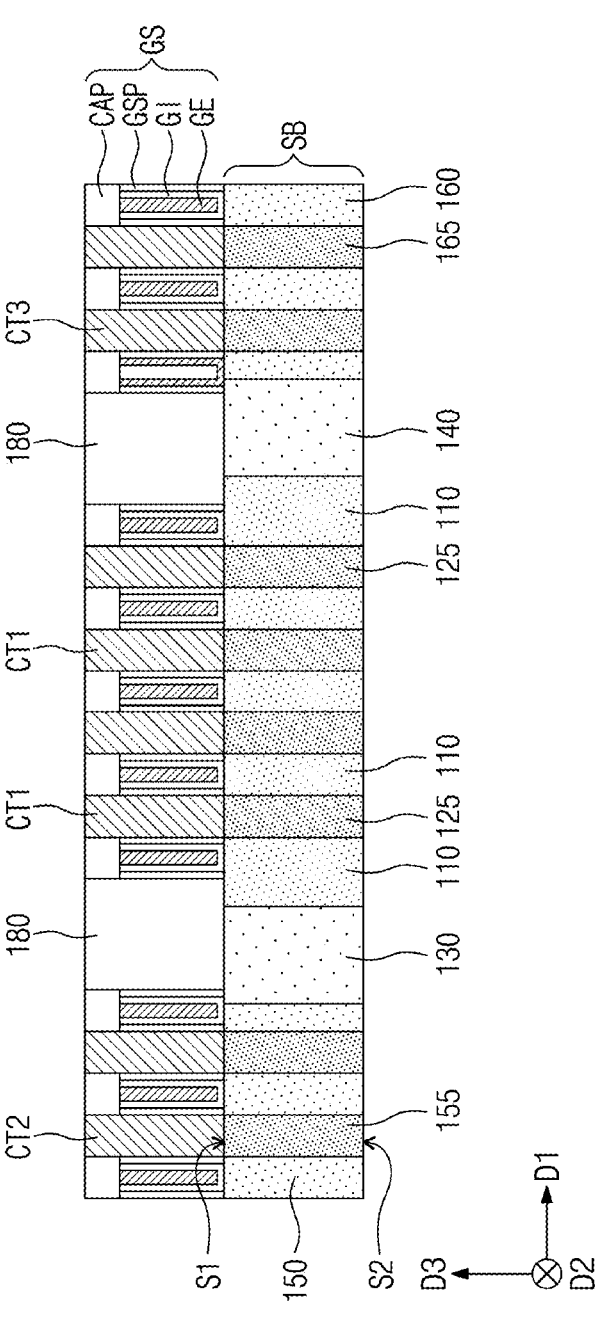

Referring to FIGS. 4 and 20, a gate dielectric pattern GI and a gate electrode GE may be formed to fill each of the gap regions 180G. The formation of the gate dielectric pattern GI and the gate electrode GE may include forming a gate dielectric layer conformally covering an inner surface of each of the gap regions 180G, forming a gate conductive layer filling a remaining portion of each of the gap regions 180G, and performing a planarization process on the gate conductive layer and the gate dielectric layer to expose the upper interlayer insulating layer 180, thereby locally forming the gate dielectric pattern GI and the gate electrode GE in each of the gap regions 180G. Upper portions of the gate dielectric pattern GI, the gate electrode GE and the gate spacers GSP may be recessed to form a groove region in each of the gap regions 180G. A gate capping pattern CAP may be formed in the groove region. The formation of the gate capping pattern CAP may include forming a gate capping layer filling the groove region on the upper interlayer insulating layer 180, and planarizing the gate capping layer to expose the upper interlayer insulating layer 180.

The gate dielectric pattern GI, the gate electrode GE, the gate spacers GSP and the gate capping pattern CAP may be referred to as a gate structure GS.

First contacts CT1, second contacts CT2 and third contacts CT3 may be formed in the upper interlayer insulating layer 180 between a plurality of the gate structures GS. For example, the formation of the first to third contacts CT1, CT2, and CT3 may include forming first contact holes, second contact holes and third contact holes in the upper interlayer insulating layer 180 between the plurality of gate structures GS, and forming the first contacts CT1, the second contacts CT2, and the third contacts CT3 in the first contact holes, the second contact holes, and the third contact holes, respectively. The first contact holes may expose top surfaces of the first doped patterns 125, respectively. The second contact holes may expose top surfaces of the second doped patterns 155, respectively, and the third contact holes may expose top surfaces of the third doped patterns 165, respectively.

The first contacts CT1 may be formed on the first doped patterns 125, respectively, and may be electrically connected to the first doped patterns 125, respectively. The second contacts CT2 may be formed on the second doped patterns 155, respectively, and may be electrically connected to the second doped patterns 155, respectively. The third contacts CT3 may be formed on the third doped patterns 165, respectively, and may be electrically connected to the third doped patterns 165, respectively.

Thereafter, the substrate 100 may be removed. For example, the removal of the substrate 100 may include grinding the substrate 100 to expose the second surface S2 of the semiconductor body SB. Next, as illustrated in FIGS. 4 and 5A, a lower insulating layer 170 may be formed on the second surface S2 of the semiconductor body SB.

Figure 21:
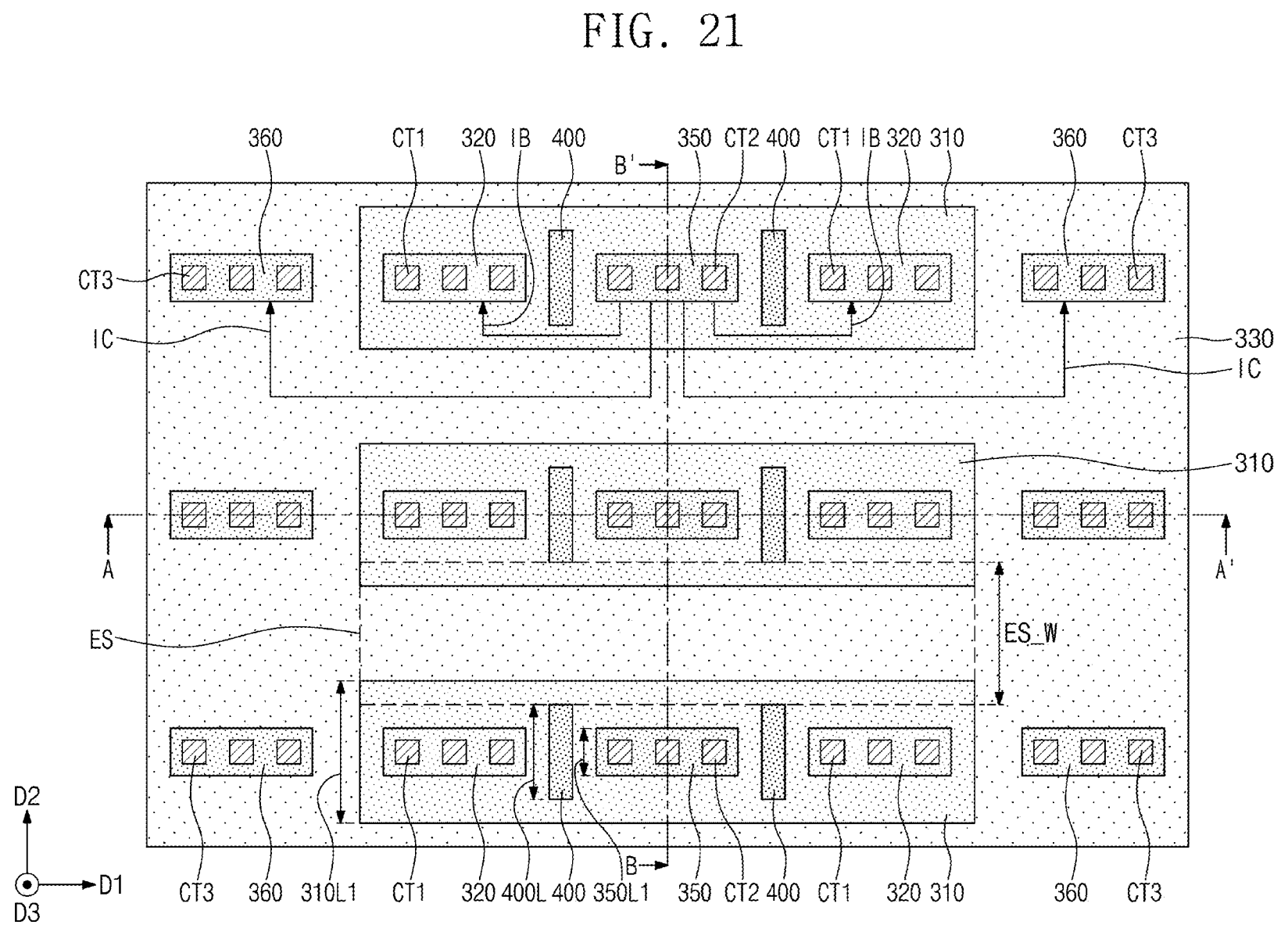
Figure 22A:
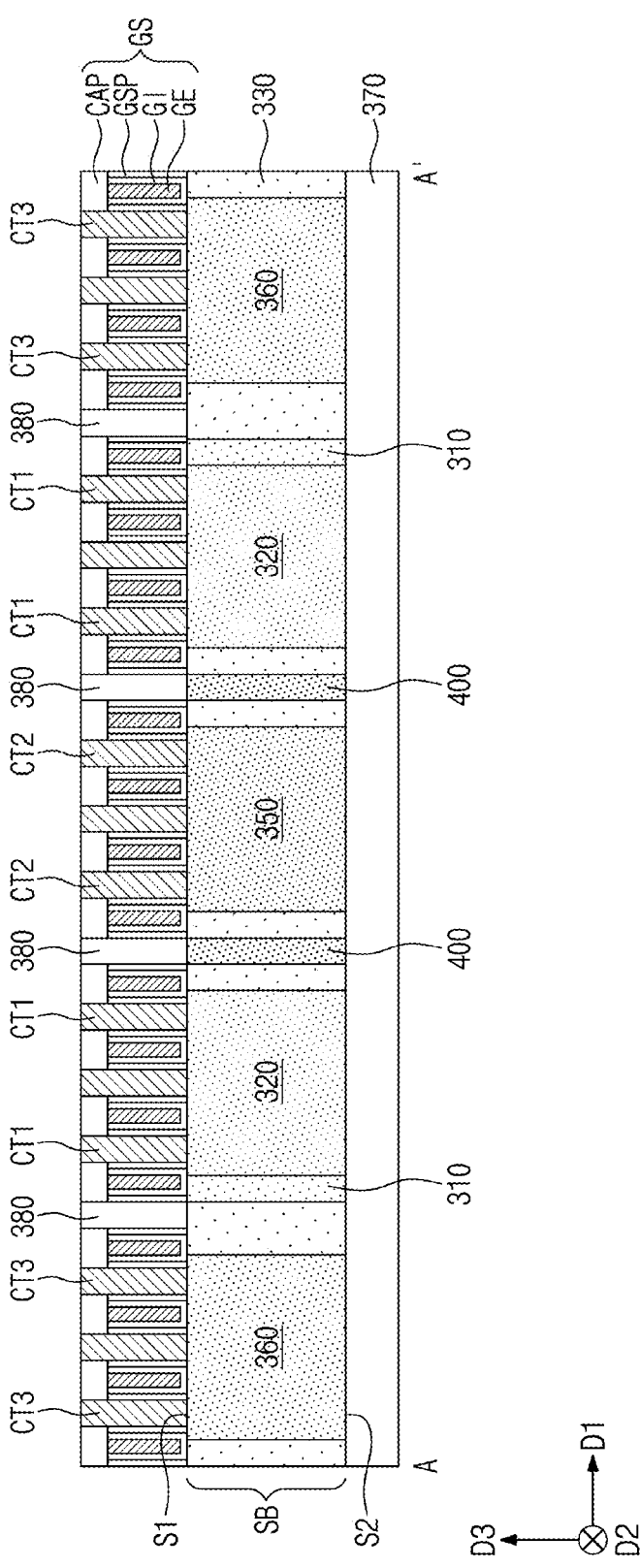
FIG. 22A is a cross-sectional view taken along a line A-A' of FIG. 21.

FIG. 21 is a plan view illustrating a semiconductor device according to some embodiments of the inventive concepts. FIG. 22A is a cross-sectional view taken along a line A-A' of FIG. 21, and FIG. 22B is a cross-sectional view taken along a line B-B' of FIG. 21.

Figure 22B:
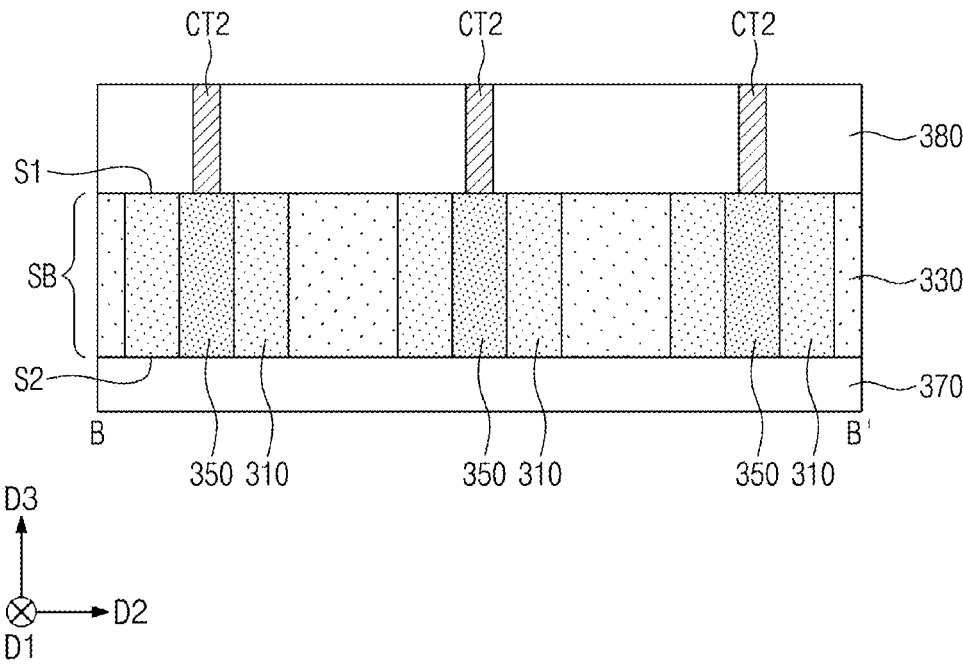
FIG. 22B is a cross-sectional view taken along a line B-B' of FIG. 21.

Referring to FIGS. 21, 22A, and 22B, a semiconductor body SB having a first surface S1 and a second surface S2 which are opposite to each other may be provided. The semiconductor body SB may include a semiconductor material (e.g., silicon and/or germanium). The semiconductor body SB may include first well regions 310 having a first conductivity type, and a second well region 330 having a second conductivity type different from the first conductivity type. The first well regions 310 may extend in the first direction D1 and may be spaced apart from each other in the second direction D2. Each of the first well regions 310 may have a bar shape extending in the first direction D1. Each of the first well regions 310 may penetrate the second well region 330 in the third direction D3, and a side surface of each of the first well regions 310 may be in contact with the second well region 330. The second well region 330 may be disposed between the first well regions 310 and may extend in the first direction D1 between the first well regions 310. The second well region 330 may border or at least partially surround the side surface of each of the first well regions 310 and may be in contact with the side surface of each of the first well regions 310. Side surfaces of the first well regions 310 and the second well region 330 may be in contact with each other in a horizontal direction (e.g., in the first direction D1 and the second direction D2). Top surfaces of the first well regions 310 and the second well region 330 may correspond to the first surface S1 of the semiconductor body SB, and bottom surfaces of the first well regions 310 and the second well region 330 may correspond to the second surface S2 of the semiconductor body SB. For some examples, the first conductivity type may be an N-type, and the second conductivity type may be a P-type. For certain examples, the first conductivity type may be a P-type, and the second conductivity type may be an N-type.

The semiconductor body SB may further include first doped regions 320, which are disposed in each of the first well regions 310 and are spaced apart from each other in the first direction D1. Each of the first doped regions 320 may have a bar shape extending in the first direction D1 and may penetrate each of the first well regions 310 in the third direction D3. Top surfaces of the first doped regions 320 may correspond to the first surface S1 of the semiconductor body SB, and bottom surfaces of the first doped regions 320 may correspond to the second surface S2 of the semiconductor body SB. The first doped regions 320 may have the first conductivity type. A concentration of dopants having the first conductivity type in the first doped regions 320 may be greater than a concentration of dopants having the first conductivity type in the first well regions 310.

The semiconductor body SB may further include a second doped region 350 disposed between the first doped regions 320 in each of the first well regions 310. The second doped region 350 may have a bar shape extending in the first direction D1 and may penetrate each of the first well regions 310 in the third direction D3. A top surface of the second doped region 350 may correspond to the first surface S1 of the semiconductor body SB, and a bottom surface of the second doped region 350 may correspond to the second surface S2 of the semiconductor body SB. The second doped region 350 may have the second conductivity type. A concentration of dopants having the second conductivity type in the second doped region 350 may be greater than a concentration of dopants having the second conductivity type in the second well region 330.

Isolation patterns 400 may be disposed in each of the first well regions 310. The isolation patterns 400 may be spaced apart from each other in the first direction D1 with the second doped region 350 interposed therebetween. The second doped region 350 may be disposed between the isolation patterns 400, and the second doped region 350 and the isolation patterns 400 may be disposed between the first doped regions 320. One of the isolation patterns 400 may be disposed between one of the first doped regions 320 and the second doped region 350, and the other of the isolation patterns 400 may be disposed between the other of the first doped regions 320 and the second doped region 350. Each of the isolation patterns 400 may have a bar shape extending in the second direction D2 and may penetrate each of the first well regions 310 in the third direction D3. Top surfaces of the isolation patterns 400 may be located at the same height in the D3 direction as the first surface S1 of the semiconductor body SB, and bottom surfaces of the isolation patterns 400 may be located at the same height in the D3 direction as the second surface S2 of the semiconductor body SB. In the present specification, the 'height' may be a distance measured from the second surface S2 of the semiconductor body SB in the third direction D3.

A length 400L of each of the isolation patterns 400 in the second direction D2 may be greater than a length 350L1 of the second doped region 350 in the second direction D2. A length 310L1 of each of the first well regions 310 in the second direction D2 may be greater than the length 400L of each of the isolation patterns 400 in the second direction D2. The isolation patterns 400 may include an insulating material, such as silicon oxide, silicon nitride, and/or silicon oxynitride.

The semiconductor body SB may further include third doped regions 360, which are disposed in the second well region 330 and are spaced apart from each other in the first direction D1. Each of the first well regions 310 may be disposed between the third doped regions 360. The first doped regions 320, the second doped region 350, and the isolation patterns 400, which are disposed in each of the first well regions 310, may be disposed between the third doped regions 360. One of the first doped regions 320 may be disposed between one of the isolation patterns 400 and one of the third doped regions 360, and the other of the first doped regions 320 may be disposed between the other of the isolation patterns 400 and the other of the third doped regions 360. Each of the third doped regions 360 may have a bar shape extending in the first direction D1 and may penetrate the second well region 330 in the third direction D3. Top surfaces of the third doped regions 360 may correspond to the first surface S1 of the semiconductor body SB, and bottom surfaces of the third doped regions 360 may correspond to the second surface S2 of the semiconductor body SB. The third doped regions 360 may be spaced apart from other third doped regions 360 adjacent thereto in the second direction D2. The third doped regions 360 may have the second conductivity type. A concentration of dopants having the second conductivity type in the third doped regions 360 may be greater than the concentration of the dopants having the second conductivity type in the second well region 330. The concentration of the dopants having the second conductivity type in the second doped region 350 may be equal to or greater than the concentration of the dopants having the second conductivity type in the third doped regions 360.

First contacts CT1, second contacts CT2 and third contacts CT3 may be disposed on the first surface S1 of the semiconductor body SB. The first contacts CT1 may be disposed on the first doped regions 320 and may be electrically connected to the first doped regions 320. The first contacts CT1 may be spaced apart from each other in the first direction D1 on each of the first doped regions 320. Each of the first doped regions 320 and the first contacts CT1 connected thereto may constitute a base of a bipolar junction transistor.

The second contacts CT2 may be disposed on the second doped region 350 and may be electrically connected to the second doped region 350. The second contacts CT2 may be spaced apart from each other in the first direction D1 on the second doped region 350. The second doped region 350 and the second contacts CT2 connected thereto may constitute an emitter of the bipolar junction transistor. The third contacts CT3 may be disposed on the third doped regions 360 and may be electrically connected to the third doped regions 360. The third contacts CT3 may be spaced apart from each other in the first direction D1 on each of the third doped regions 360. Each of the third doped regions 360 and the third contacts CT3 connected thereto may constitute a collector of the bipolar junction transistor. The first contacts CT1, the second contacts CT2, and the third contacts CT3 may include a conductive material (e.g., a metal).

A space ES extending in the first direction D1 may be defined between a pair of the first well regions 310 directly adjacent to each other in the second direction D2. The space ES may be a portion of the semiconductor body SB, which extends in parallel to the pair of first well regions 310 between the pair of first well regions 310. A length of the space ES in the first direction D1 may be defined to be substantially equal to a length, in the first direction D1, of each of the pair of first well regions 310, and a width ES_W of the space ES in the second direction D2 may be defined as a distance between the isolation patterns 400 in one of the pair of first well regions 310 and the isolation patterns 400 in the other of the pair of first well regions 310. The first contacts CT1 and the second contacts CT2 may not be disposed in the space ES.

A plurality of gate structures GS may be disposed on the first surface S1 of the semiconductor body SB. The plurality of gate structures GS is omitted in FIG. 21 for the purpose of ease and convenience in illustration. The plurality of gate structures GS may be spaced apart from each other in the first direction D1 and may extend in the second direction D2. The first contacts CT1, the second contacts CT2, and the third contacts CT3 may be disposed between the plurality of gate structures GS. Each of the plurality of gate structures GS may include a gate electrode GE extending in the second direction D2, a gate dielectric pattern GI between the gate electrode GE and the first surface S1 of the semiconductor body SB, gate spacers GSP on side surfaces of the gate electrode GE, and a gate capping pattern CAP on a top surface of the gate electrode GE. The gate dielectric pattern GI may extend between the gate electrode GE and the gate spacers GSP, and a topmost surface of the gate dielectric pattern GI may be substantially coplanar with the top surface of the gate electrode GE. The gate capping pattern CAP may extend onto top surfaces of the gate spacers GSP. The gate electrode GE, the gate dielectric pattern GI, the gate spacers GSP, and the gate capping pattern CAP may be substantially the same as the gate electrode GE, the gate dielectric pattern GI, the gate spacers GSP and the gate capping pattern CAP, described with reference to FIGS. 1, 2A, and 2B. The plurality of gate structures GS may be electrically floated dummy gate structures.

An upper interlayer insulating layer 380 may be disposed on the first surface S1 of the semiconductor body SB and may be on and at least partially cover the plurality of gate structures GS and the first to third contacts CT1, CT2, and CT3. The plurality of gate structures GS and the first to third contacts CT1, CT2, and CT3 may penetrate the upper interlayer insulating layer 380 in the third direction D3. For example, the upper interlayer insulating layer 380 may include a silicon oxide layer, a silicon nitride layer, and/or a silicon oxynitride layer.

A lower insulating layer 370 may be disposed on the second surface S2 of the semiconductor body SB. For example, the lower insulating layer 370 may include a silicon oxide layer, a silicon nitride layer, and/or a silicon oxynitride layer.

A first voltage may be applied to the second contacts CT2, and a second voltage may be applied to the first contacts CT1 and the third contacts CT3. The second voltage may be different from the first voltage and may be, for example, a ground voltage. In this case, a first current IC may flow from the emitter consisting of the second contacts CT2 and the second doped region 350 to the collector consisting of each of the third doped regions 360 and the third contacts CT3. In addition, a second current IB may flow from the emitter consisting of the second contacts CT2 and the second doped region 350 to the base consisting of each of the first doped regions 320 and the first contacts CT1. Thus, the bipolar junction transistor may operate in this manner.

According to the embodiments of the inventive concepts, the side surfaces of the first and second well regions 310 and 330 and the first to third doped regions 320, 350, and 360 may be in contact with each other in a horizontal direction (e.g., in the first direction D1 and the second direction D2). The top surfaces of the first and second well regions 310 and 330 and the first to third doped regions 320, 350, and 360 may constitute the first surface S1 of the semiconductor body SB, and the bottom surfaces of the first and second well regions 310 and 330 and the first to third doped regions 320, 350, and 360 may constitute the second surface S2 of the semiconductor body SB. In this case, even though a thickness of the semiconductor body SB in the third direction D3 is relatively thin, the bipolar junction transistor operable in the semiconductor body SB may be easily realized. In addition, the isolation patterns 400 may be disposed between the second doped region 350 and the first doped regions 320, respectively, in each of the first well regions 310. Thus, the flow of the second current IB may be controlled, and the flow of the first current IC may be increased. As a result, operating characteristics of the bipolar junction transistor may be controlled.

Figure 23A:
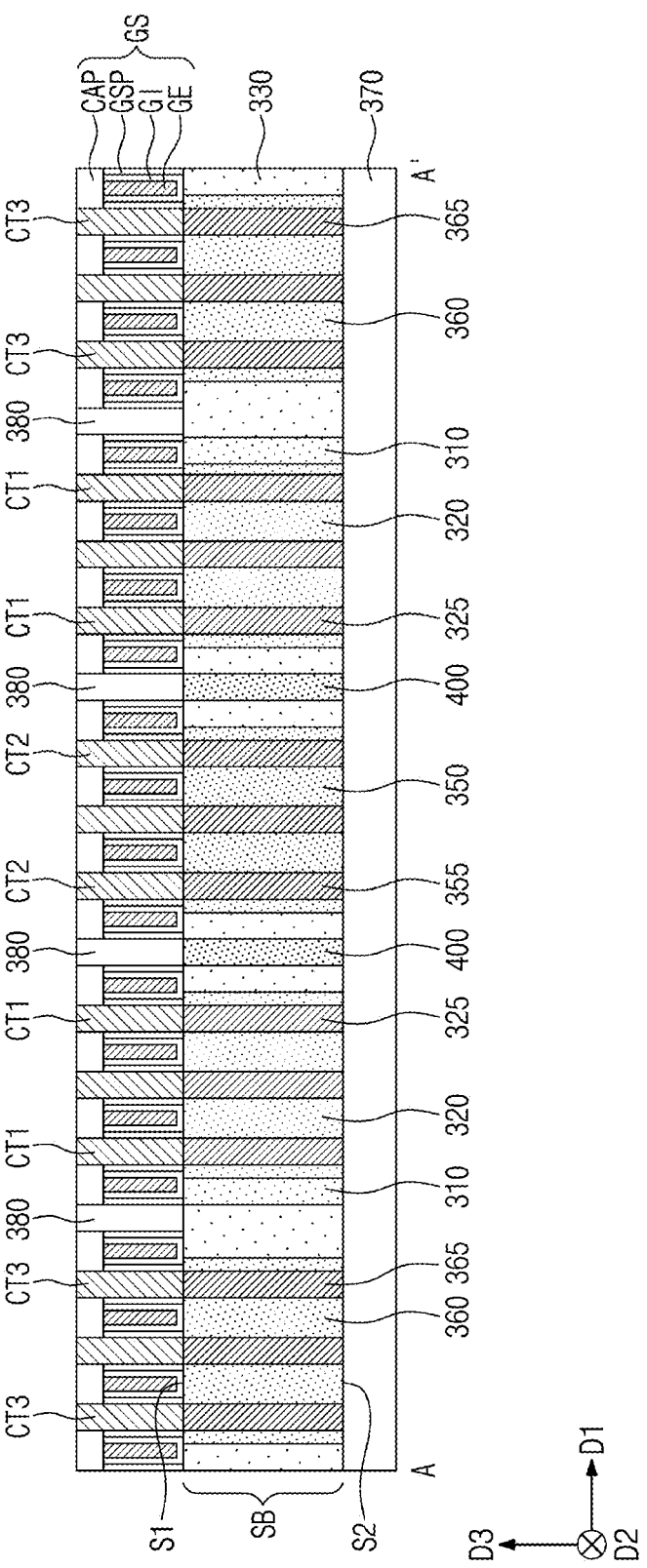
FIGS. 23A and 23B are cross-sectional views corresponding to the lines A-A' and B-B' of FIG. 21, respectively, to illustrate a semiconductor device according to some embodiments of the inventive concepts.
Figure 23B:
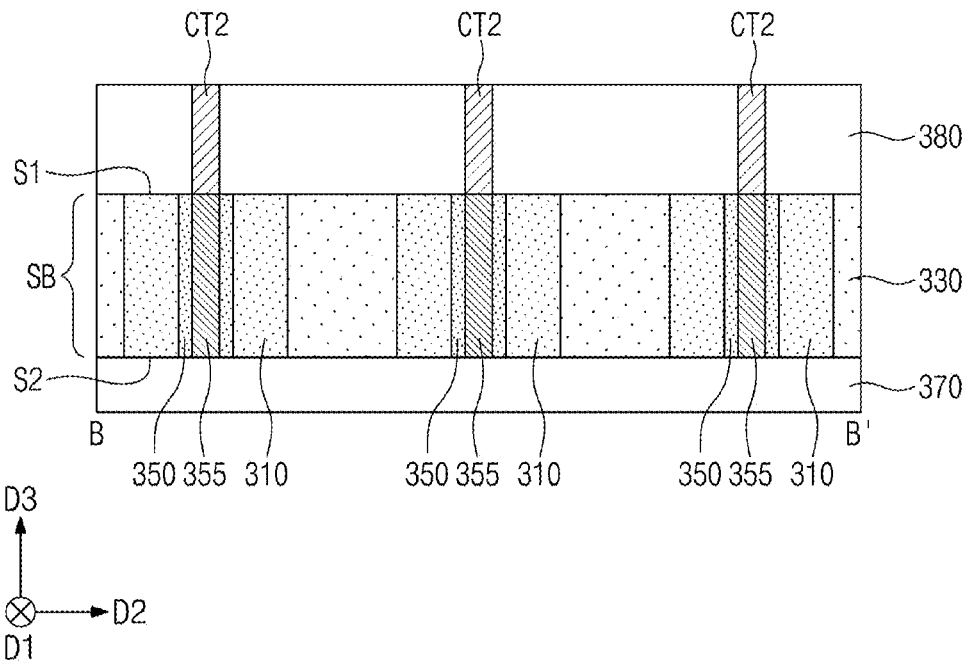

FIGS. 23A and 23B are cross-sectional views corresponding to the lines A-A' and B-B' of FIG. 21, respectively, to illustrate a semiconductor device according to some embodiments of the inventive concepts. Hereinafter, differences between the present embodiments and the above embodiments of FIGS. 21, 22A, and 22B will be mainly described for the purpose of ease and convenience in explanation.

Referring to FIGS. 21, 23A and 23B, the semiconductor body SB may further include first doped patterns 325 penetrating each of the first doped regions 320. The first doped patterns 325 may be spaced apart from each other in the first direction D1 in each of the first doped regions 320 and may be disposed under the first contacts CT1, respectively. The first doped patterns 325 may be electrically connected to the first contacts CT1, respectively. Each of the first doped patterns 325 may penetrate each of the first doped regions 320 in the third direction D3. Top surfaces of the first doped patterns 325 may correspond to the first surface S1 of the semiconductor body SB, and bottom surfaces of the first doped patterns 325 may correspond to the second surface S2 of the semiconductor body SB. The first doped patterns 325 may have the first conductivity type and may be epitaxial patterns formed by an epitaxial growth process. A concentration of dopants having the first conductivity type in the first doped patterns 325 may be equal to or greater than the concentration of the dopants having the first conductivity type in the first doped regions 320. The first doped patterns 325 may be used to reduce a contact resistance between the first contacts CT1 and the first doped regions 320.

The semiconductor body SB may further include second doped patterns 355 penetrating the second doped region 350. The second doped patterns 355 may be spaced apart from each other in the first direction D1 in the second doped region 350 and may be disposed under the second contacts CT2, respectively. The second doped patterns 355 may be electrically connected to the second contacts CT2, respectively. Each of the second doped patterns 355 may penetrate the second doped region 350 in the third direction D3. Top surfaces of the second doped patterns 355 may correspond to the first surface S1 of the semiconductor body SB, and bottom surfaces of the second doped patterns 355 may correspond to the second surface S2 of the semiconductor body SB. The second doped patterns 355 may have the second conductivity type and may be epitaxial patterns formed by an epitaxial growth process. A concentration of dopants having the second conductivity type in the second doped patterns 355 may be equal to or greater than the concentration of the dopants having the second conductivity type in the second doped regions 350. The second doped patterns 355 may be used to reduce a contact resistance between the second contacts CT2 and the second doped regions 350.

The semiconductor body SB may further include third doped patterns 365 penetrating each of the third doped regions 360. The third doped patterns 365 may be spaced apart from each other in the first direction D1 in each of the third doped regions 360 and may be disposed under the third contacts CT3, respectively. The third doped patterns 365 may be electrically connected to the third contacts CT3, respectively. Each of the third doped patterns 365 may penetrate each of the third doped regions 360 in the third direction D3. Top surfaces of the third doped patterns 365 may correspond to the first surface S1 of the semiconductor body SB, and bottom surfaces of the third doped patterns 365 may correspond to the second surface S2 of the semiconductor body SB. The third doped patterns 365 may have the second conductivity type and may be epitaxial patterns formed by an epitaxial growth process. A concentration of dopants having the second conductivity type in the third doped patterns 365 may be equal to or greater than the concentration of the dopants having the second conductivity type in the third doped regions 360. The third doped patterns 365 may be used to reduce a contact resistance between the third contacts CT3 and the third doped regions 360.

Except for the differences described above, other components and features of the semiconductor device according to the present embodiments may be substantially the same as corresponding components and features of the semiconductor device described with reference to FIGS. 21, 22A and 22B.

Figure 24A:
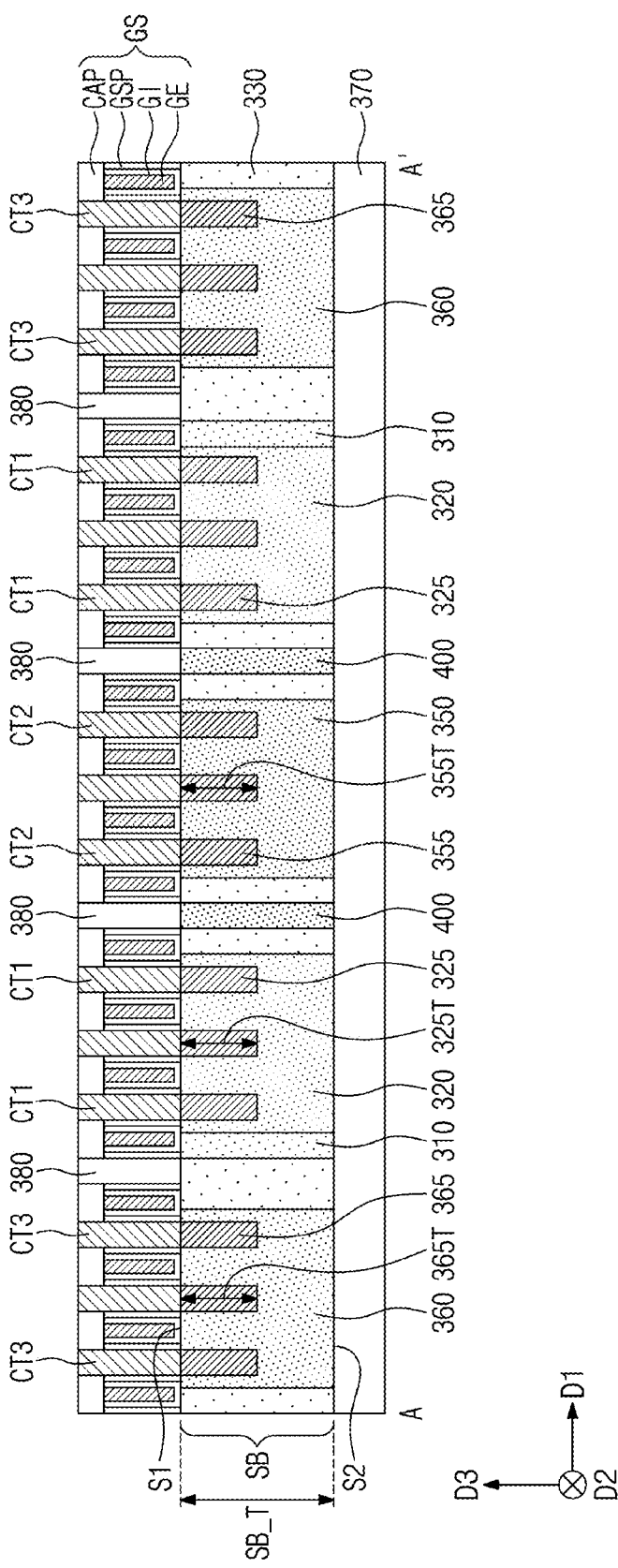
FIGS. 24A and 24B are cross-sectional views corresponding to the lines A-A' and B-B' of FIG. 21, respectively, to illustrate a semiconductor device according to some embodiments of the inventive concepts.
Figure 24B:
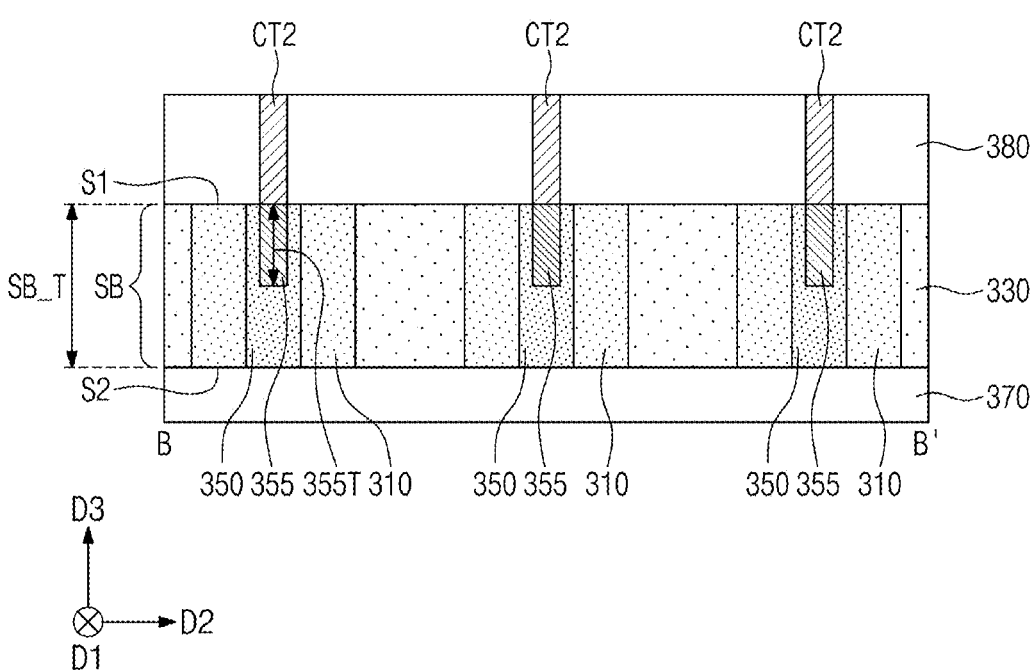

FIGS. 24A and 24B are cross-sectional views corresponding to the lines A-A' and B-B' of FIG. 21, respectively, to illustrate a semiconductor device according to some embodiments of the inventive concepts. Hereinafter, differences between the present embodiments and the above embodiments of FIGS. 21, 23A, and 23B will be mainly described for the purpose of ease and convenience in explanation.

Referring to FIGS. 21, 24A and 24B, in some embodiments, each of the first doped patterns 325 may penetrate a portion of each of the first doped regions 320 in the third direction D3. Top surfaces of the first doped patterns 325 may correspond to the first surface S1 of the semiconductor body SB, and bottom surfaces of the first doped patterns 325 may be located at a higher height in the third direction D3 than the second surface S2 of the semiconductor body SB. Here, the 'height' may be a distance measured from the second surface S2 of the semiconductor body SB in the third direction D3. Each of the first doped regions 320 may extend under the first doped patterns 325 and may be on and at least partially cover the bottom surfaces of the first doped patterns 325. Each of the first doped patterns 325 may have a thickness 325T in the third direction D3, and the thickness 325T of each of the first doped patterns 325 may be less than a thickness SB_T of the semiconductor body SB in the third direction D3.

Each of the second doped patterns 355 may penetrate a portion of the second doped region 350 in the third direction D3. Top surfaces of the second doped patterns 355 may correspond to the first surface S1 of the semiconductor body SB, and bottom surfaces of the second doped patterns 355 may be located at a higher height in the third direction D3 than the second surface S2 of the semiconductor body SB. The second doped region 350 may extend under the second doped patterns 355 and may be on and at least partially cover the bottom surfaces of the second doped patterns 355. Each of the second doped patterns 355 may have a thickness 355T in the third direction D3, and the thickness 355T of each of the second doped patterns 355 may be less than the thickness SB_T of the semiconductor body SB in the third direction D3.

Each of the third doped patterns 365 may penetrate a portion of each of the third doped regions 360 in the third direction D3. Top surfaces of the third doped patterns 365 may correspond to the first surface S1 of the semiconductor body SB, and bottom surfaces of the third doped patterns 365 may be located at a higher height in the third direction D3 than the second surface S2 of the semiconductor body SB. Each of the third doped regions 360 may extend under the third doped patterns 365 and may be on and at least partially cover the bottom surfaces of the third doped patterns 365. Each of the third doped patterns 365 may have a thickness 365T in the third direction D3, and the thickness 365T of each of the third doped patterns 365 may be less than the thickness SB_T of the semiconductor body SB in the third direction D3.

Except for the differences described above, other components and features of the semiconductor device according to the present embodiments may be substantially the same as corresponding components and features of the semiconductor device described with reference to FIGS. 21, 23A and 23B.

Figure 25:
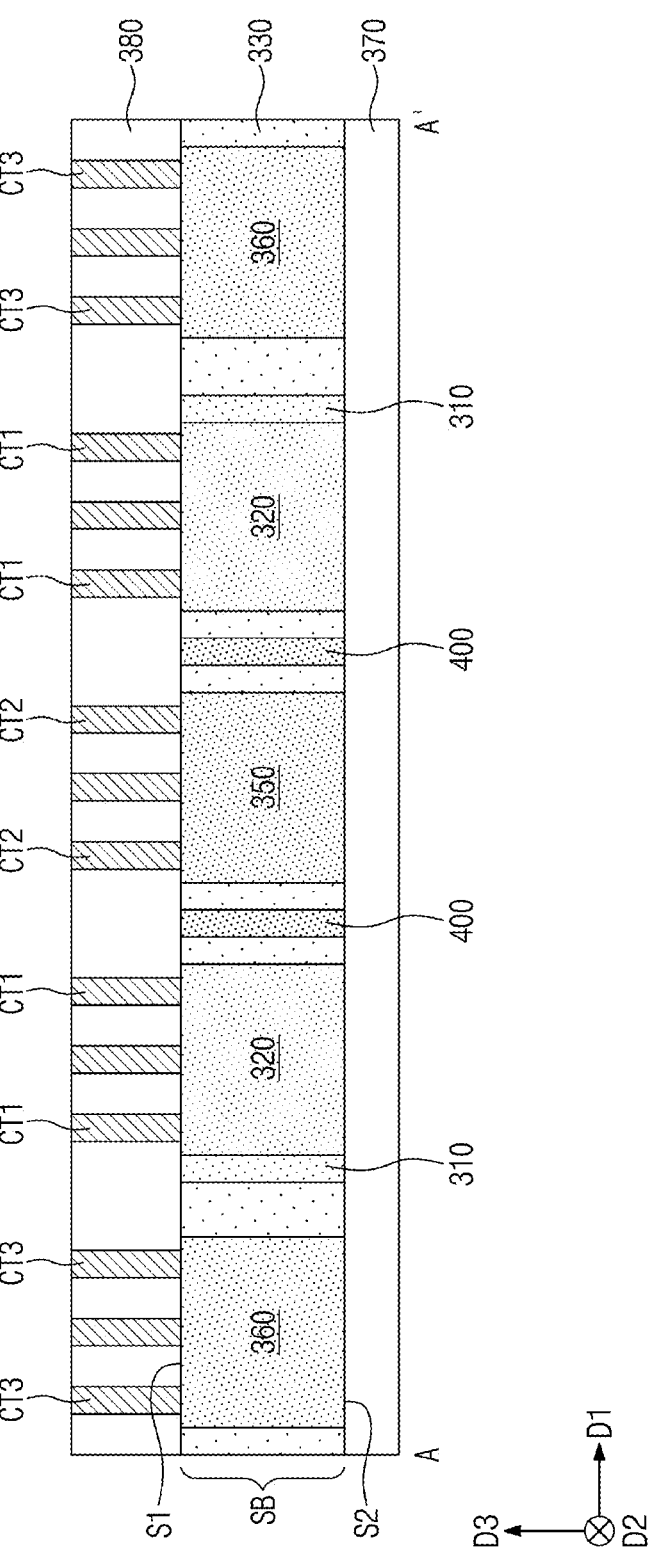
FIGS. 25 and 26 are cross-sectional views corresponding to the line A-A' of FIG. 21 to illustrate semiconductor devices according to some embodiments of the inventive concepts.

FIG. 25 is a cross-sectional view corresponding to the line A-A' of FIG. 21 to illustrate a semiconductor device according to some embodiments of the inventive concepts. Hereinafter, differences between the present embodiments and the above embodiments of FIGS. 21, 22A and 22B will be mainly described for the purpose of ease and convenience in explanation.

Referring to FIGS. 21, 25 and 22B, in some embodiments, the plurality of gate structures GS may be omitted. In this case, the first to third contacts CT1, CT2, and CT3 may be disposed on the first surface S1 of the semiconductor body SB so as to be electrically connected to the first to third doped regions 320, 350 and 360, and the upper interlayer insulating layer 380 may at least partially fill a space between the first to third contacts CT1, CT2, and CT3 and may be in direct contact with the top surfaces of the first to third doped regions 320, 350, and 360. Except for the differences described above, other components and features of the semiconductor device according to the present embodiments may be substantially the same as corresponding components and features of the semiconductor device described with reference to FIGS. 21, 22A, and 22B.

Figure 26:
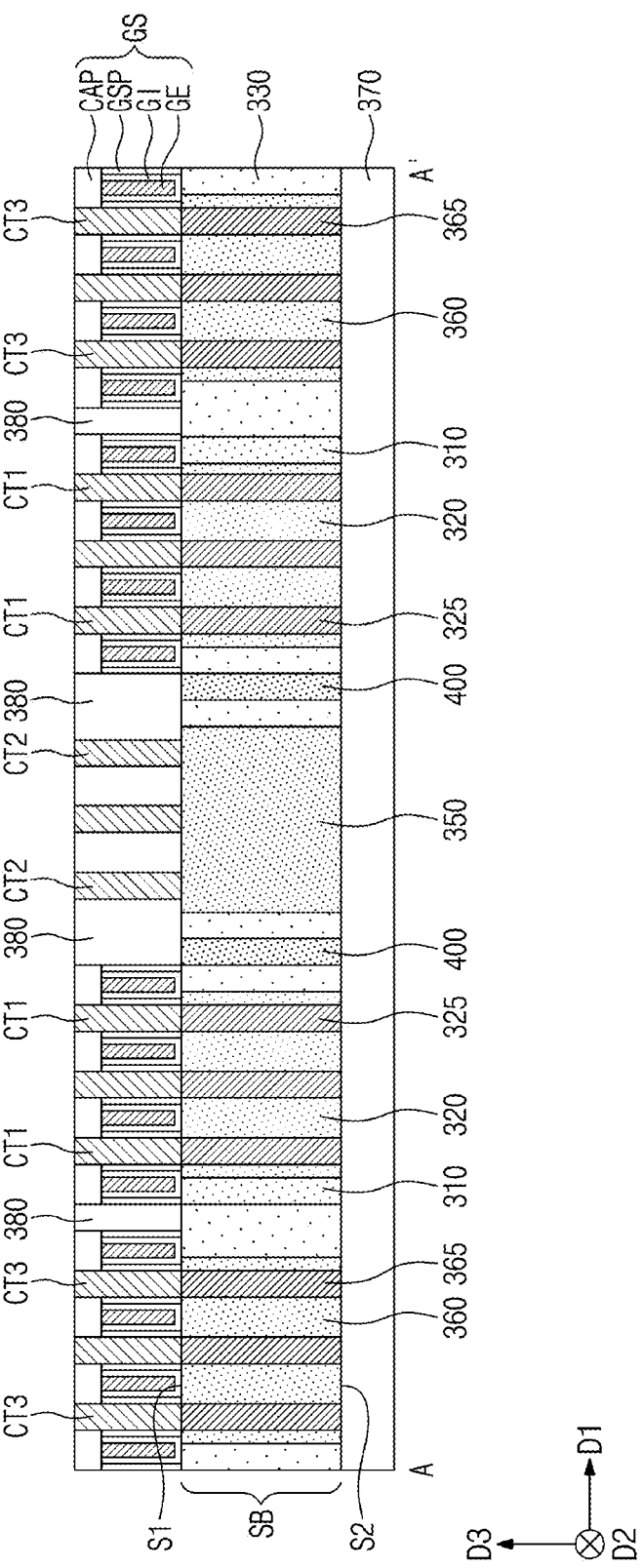

FIG. 26 is a cross-sectional view corresponding to the line A-A' of FIG. 21 to illustrate a semiconductor device according to some embodiments of the inventive concepts. Hereinafter, differences between the present embodiments and the above embodiments of FIGS. 21, 22A, and 22B will be mainly described for the purpose of ease and convenience in explanation.

Referring to FIGS. 21, 26, and 22B, in some embodiments, some of the plurality of gate structures GS may be omitted. For example, the plurality of gate structures GS may extend in the second direction D2 to intersect the first doped regions 320 and the third doped regions 360, and the first contacts CT1 and the third contacts CT3 may be disposed between the plurality of gate structures GS. The plurality of gate structures GS may not be disposed on the second doped region 350. The second contacts CT2 may be disposed on the second doped region 350 so as to be electrically connected to the second doped region 350. The upper interlayer insulating layer 380 may at least partially fill a space between the second contacts CT2 and may be in direct contact with the top surface of the second doped region 350.

According to some embodiments, the semiconductor body SB may further include first doped patterns 325 penetrating each of the first doped regions 320, and third doped patterns 365 penetrating each of the third doped regions 360. The first doped patterns 325 and the third doped patterns 365 may be substantially the same as the first doped patterns 325 and the third doped patterns 365, described with reference to FIGS. 21, 23A, and 23B. In the case in which the plurality of gate structures GS is not disposed on the second doped region 350, the second doped patterns 355 described with reference to FIGS. 21, 23A and 23B may not be provided.

Except for the differences described above, other components and features of the semiconductor device according to the present embodiments may be substantially the same as corresponding components and features of the semiconductor device described with reference to FIGS. 21, 22A, and 22B.

Figure 27:
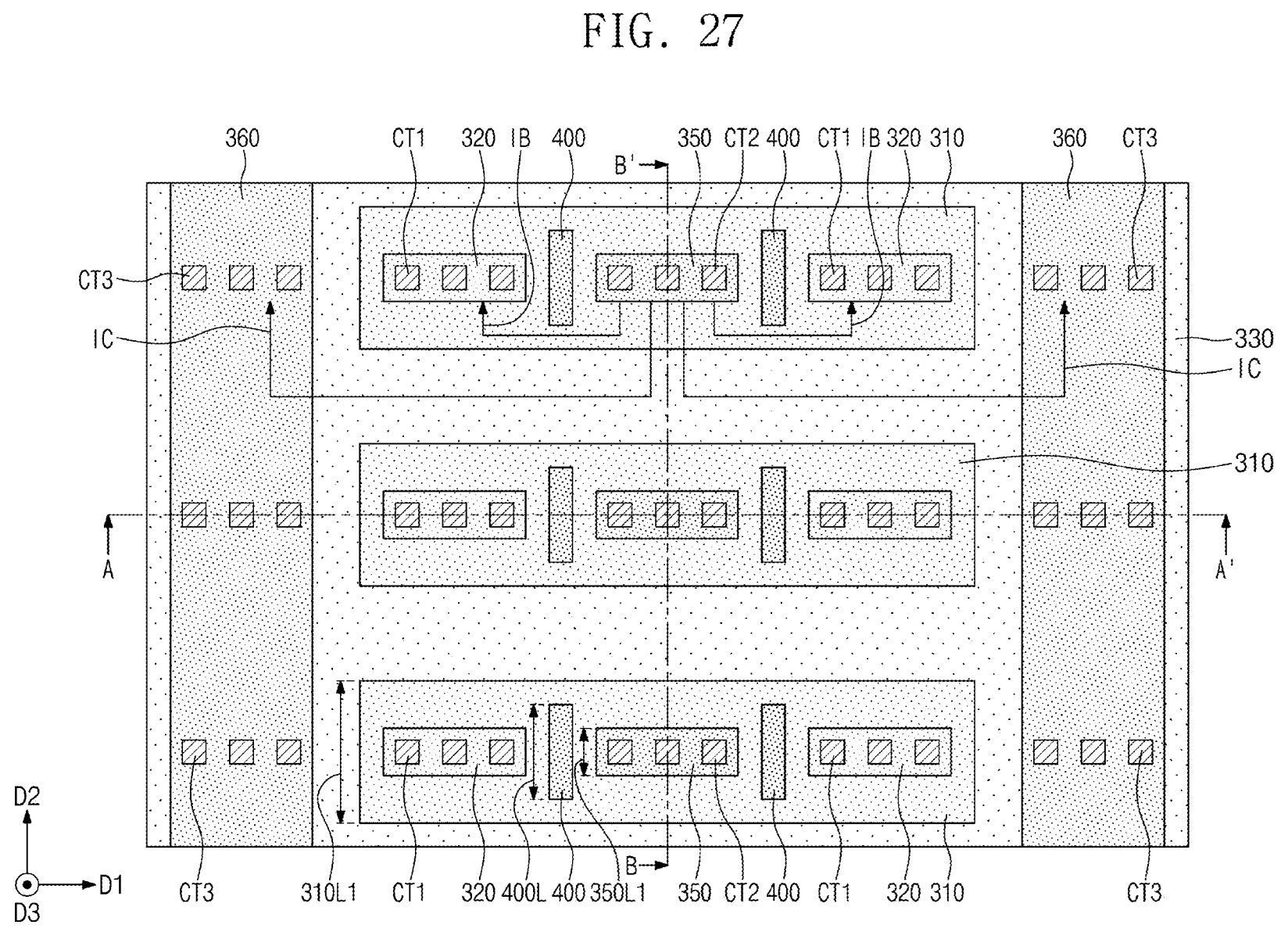

FIG. 27 is a plan view illustrating a semiconductor device according to some embodiments of the inventive concepts. Cross-sectional views taken along lines A-A' and B-B' of FIG. 27 are substantially the same as those of FIGS. 22A and 22B, respectively. Hereinafter, differences between the present embodiments and the above embodiments of FIGS. 21, 22A, and 22B will be mainly described for the purpose of ease and convenience in explanation.

Referring to FIG. 27, in some embodiments, each of the third doped regions 360 may continuously extend in the second direction D2 at a side of the first well regions 310 spaced apart from each other in the second direction D2. Each of the third doped regions 360 may have a line shape extending in the second direction D2 and may continuously extend along side surfaces of the first well regions 310 spaced apart from each other in the second direction D2. The first well regions 310 spaced apart from each other in the second direction D2 may be disposed between the third doped regions 360. According to the present embodiments, the second doped regions 350 respectively disposed in the first well regions 310 and the second contacts CT2 connected to the second doped regions 350 may constitute a plurality of emitters, and the first doped regions 320 respectively disposed in the first well regions 310 and the first contacts CT1 connected to the first doped regions 320 may constitute a plurality of bases. Each of the third doped regions 360 and the third contacts CT3 connected to each of the third doped regions 360 may constitute a collector, and the plurality of emitters and the plurality of bases may share the collector.

Figure 28:
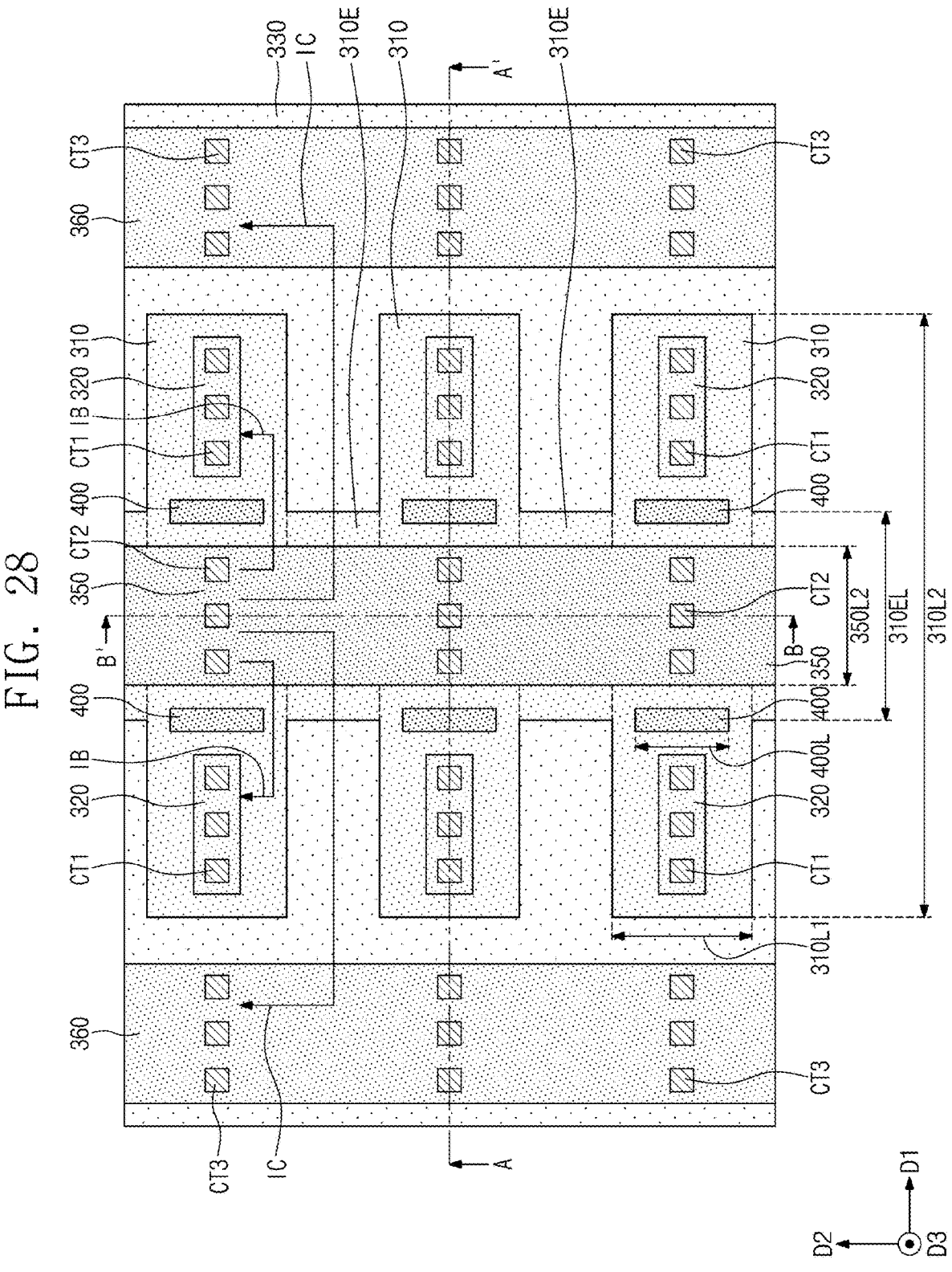
FIG. 28 is a plan view illustrating a semiconductor device according to some embodiments of the inventive concepts.
Figure 29:
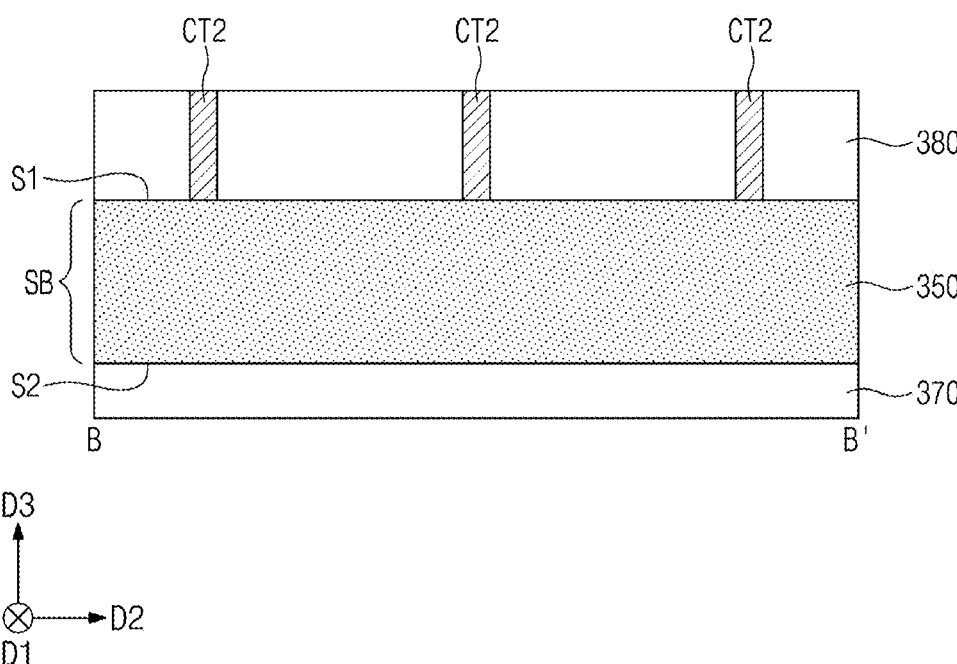
FIG. 29 is a cross-sectional view taken along a line B-B' of FIG. 28.

FIG. 28 is a plan view illustrating a semiconductor device according to some embodiments of the inventive concepts, and FIG. 29 is a cross-sectional view taken along a line B-B' of FIG. 28. A cross-sectional view taken along a line A-A' of FIG. 28 is substantially the same as that of FIG. 22A. Hereinafter, differences between the present embodiments and the above embodiments of FIGS. 21, 22A, and 22B will be mainly described for the purpose of ease and convenience in explanation.

Referring to FIGS. 28 and 29, in some embodiments, the semiconductor body SB may further include extension well regions 310E between the first well regions 310. The extension well regions 310E may be disposed between the first well regions 310 spaced apart from each other in the second direction D2, and the first well regions 310 may be electrically connected to each other through the extension well regions 310E. A length 310EL of each of the extension well regions 310E in the first direction D1 may be less than a length 310L2 of each of the first well regions 310 in the first direction D1. The extension well regions 310E may penetrate the second well region 330 in the third direction D3. Top surfaces of the first well regions 310, the extension well regions 310E, and the second well region 330 may correspond to the first surface S1 of the semiconductor body SB, and bottom surfaces of the first well regions 310, the extension well regions 310E and the second well region 330 may correspond to the second surface S2 of the semiconductor body SB. The extension well regions 310E may have the first conductivity type, and a concentration of dopants having the first conductivity type in the extension well regions 310E may be equal to the concentration of the dopants having the first conductivity type in the first well regions 310.

According to some embodiments, the second doped region 350 may extend in the second direction D2 to intersect the first well regions 310 and the extension well regions 310E. The second doped region 350 may have a line shape extending in the second direction D2 and may penetrate the first well regions 310 and the extension well regions 310E in the third direction D3. A top surface of the second doped region 350 may correspond to the first surface S1 of the semiconductor body SB, and a bottom surface of the second doped region 350 may correspond to the second surface S2 of the semiconductor body SB. A length 350L2 of the second doped region 350 in the first direction D1 may be less than the length 310EL of each of the extension well regions 310E in the first direction D1.

In some embodiments, each of the third doped regions 360 may continuously extend in the second direction D2 at a side of the first well regions 310 and the extension well regions 310E. Each of the third doped regions 360 may have a line shape extending in the second direction D2 and may continuously extend along side surfaces of the first well regions 310 and the extension well regions 310E. The first well regions 310 and the extension well regions 310E may be disposed between the third doped regions 360. According to the present embodiments, the second doped region 350 and the second contacts CT2 connected to the second doped region 350 may constitute an emitter. The first doped regions 320 respectively disposed in the first well regions 310 and the first contacts CT1 connected to the first doped regions 320 may constitute a plurality of bases. Each of the third doped regions 360 and the third contacts CT3 connected to each of the third doped regions 360 may constitute a collector. The plurality of bases may share the emitter and the collector.

Figure 30:
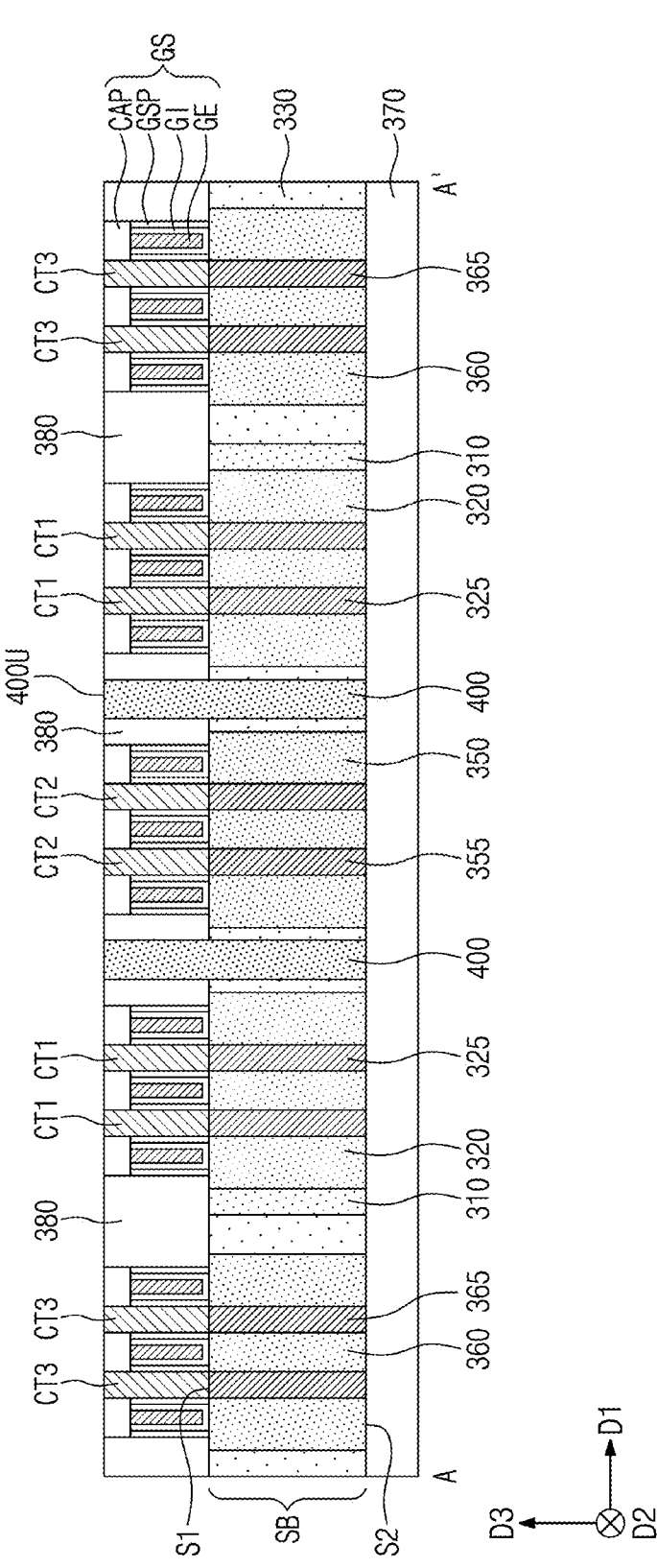
FIG. 30 is a cross-sectional view corresponding to the line A-A' of FIG. 21 to illustrate a semiconductor device according to some embodiments of the inventive concepts.

FIG. 30 is a cross-sectional view corresponding to the line A-A' of FIG. 21 to illustrate a semiconductor device according to some embodiments of the inventive concepts. Hereinafter, differences between the present embodiments and the above embodiments of FIGS. 21, 22A, and 22B will be mainly described for the purpose of ease and convenience in explanation.

Referring to FIGS. 21 and 30, the semiconductor body SB may further include first doped patterns 325 penetrating each of the first doped regions 320, second doped patterns 355 penetrating the second doped region 350, and third doped patterns 365 penetrating each of the third doped regions 360. The first to third doped patterns 325, 355, and 365 may be substantially the same as the first to third doped patterns 325, 355 and 365 described with reference to FIGS. 21, 23A and 23B. In some embodiments, each of the isolation patterns 400 may extend into the upper interlayer insulating layer 380 in the third direction D3 and may penetrate the upper interlayer insulating layer 380 in the third direction D3. Top surfaces 400U of the isolation patterns 400 may be located at a higher height in the third direction D3 than the first surface S1 of the semiconductor body SB and may be located at substantially the same height in the third direction D3 as a top surface of the upper interlayer insulating layer 380 and top surfaces of the gate structures GS (i.e., top surfaces of the gate capping patterns CAP). Bottom surfaces of the isolation patterns 400 may be located at the same height in the third direction D3 as the second surface S2 of the semiconductor body SB. Except for the differences described above, other components and features of the semiconductor device according to the present embodiments may be substantially the same as corresponding components and features of the semiconductor device described with reference to FIGS. 21, 22A, and 22B.

FIGS. 31 to 35 are cross-sectional views corresponding to the line A-A' of FIG. 21 to illustrate a method of manufacturing a semiconductor device according to some embodiments of the inventive concepts. Hereinafter, the descriptions of the same features as mentioned with reference to FIGS. 21, 22A and 22B will be omitted for the purpose of ease and convenience in explanation.

Figure 31:
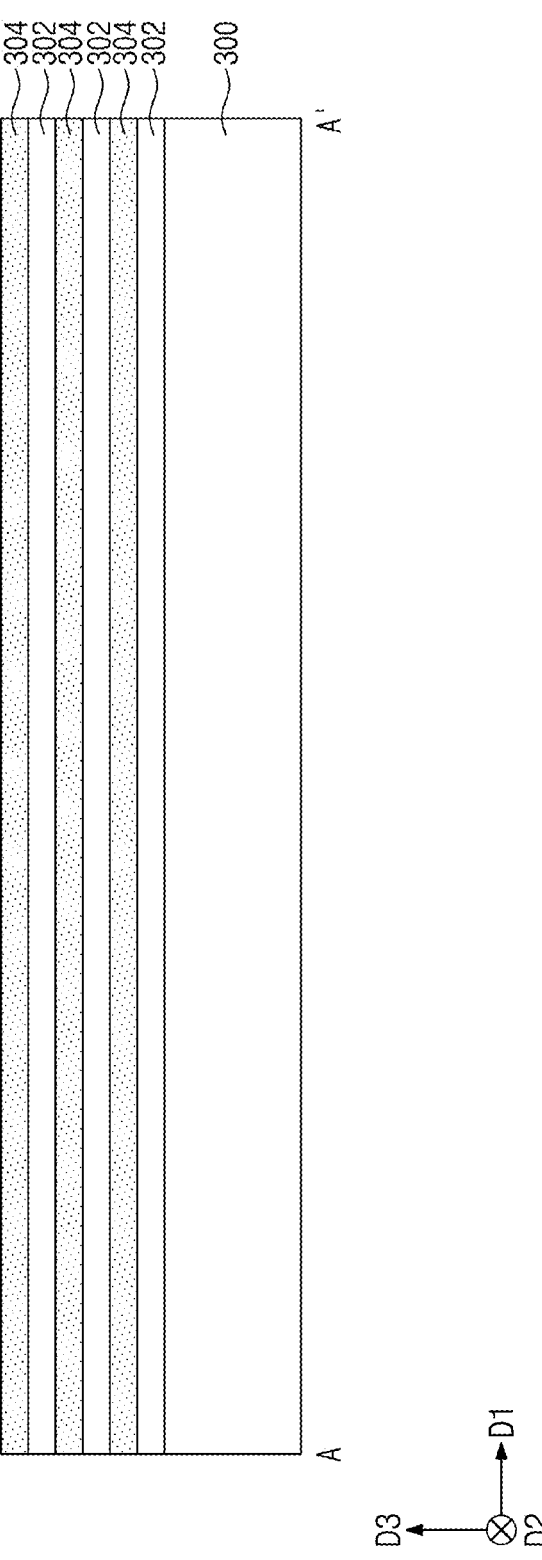
FIGS. 31 to 39 are cross-sectional views corresponding to the line A-A' of FIG. 21 to illustrate methods of manufacturing semiconductor devices according to some embodiments of the inventive concepts.

Referring to FIG. 31, first semiconductor layers 302 and second semiconductor layers 304 may be alternately stacked on a substrate 300. The substrate 300 may be a semiconductor substrate. The first semiconductor layers 302 may include, for example, silicon, and the second semiconductor layers 304 may include, for example, silicon-germanium.

Figure 32:
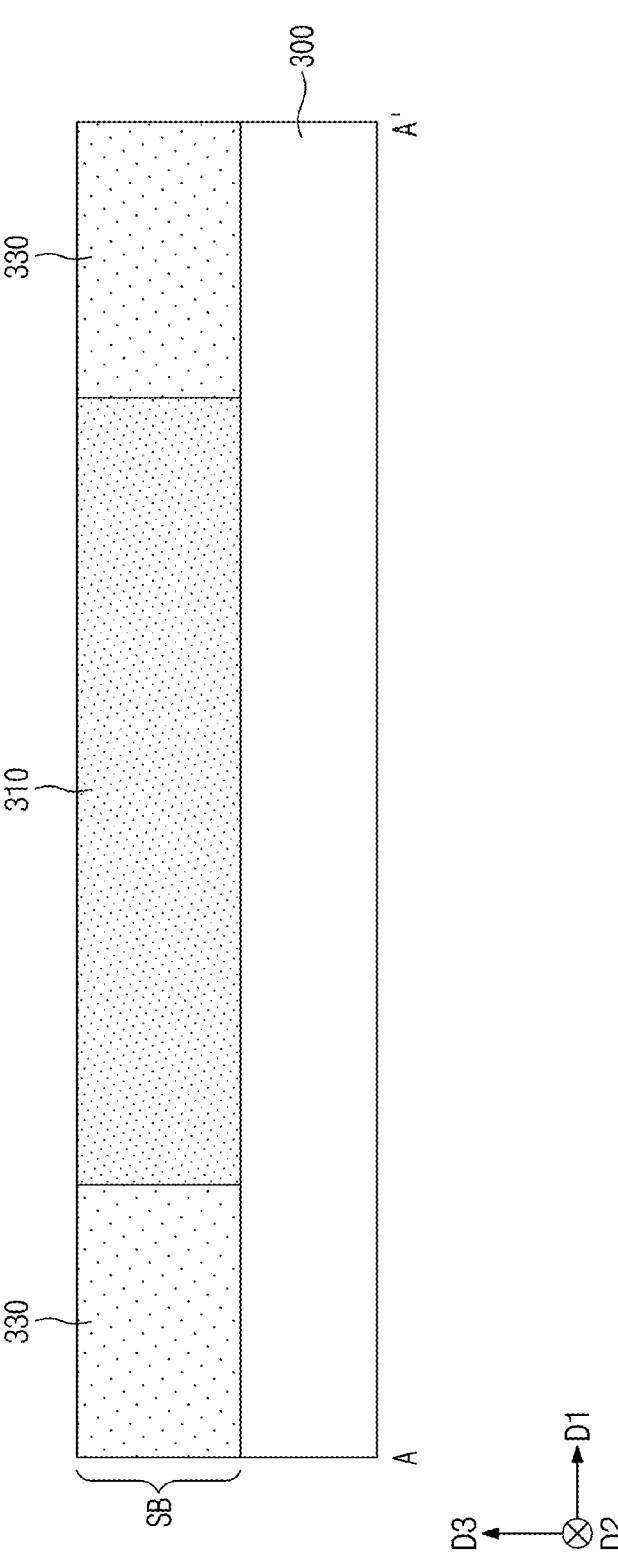

Referring to FIGS. 21 and 32, first well regions 310 and a second well region 330 may be formed in the first semiconductor layers 302 and the second semiconductor layers 304. For example, the formation of the first well regions 310 may include injecting or implanting dopants having a first conductivity type into the first semiconductor layers 302 and the second semiconductor layers 304. The first well regions 310 may extend in the first direction D1 and may be spaced apart from each other in the second direction D2. Each of the first well regions 310 may have a bar shape extending in the first direction D1. For example, the formation of the second well region 330 may include injecting or implanting dopants having a second conductivity type into the first semiconductor layers 302 and the second semiconductor layers 304. The second well region 330 may be formed to border or at least partially surround a side surface of each of the first well regions 310. Side surfaces of the first well regions 310 and the second well region 330 may be in contact with each other in a horizontal direction (e.g., in the first direction D1 and the second direction D2). The first well regions 310 and the second well region 330 may constitute a semiconductor body SB.

Figure 33:
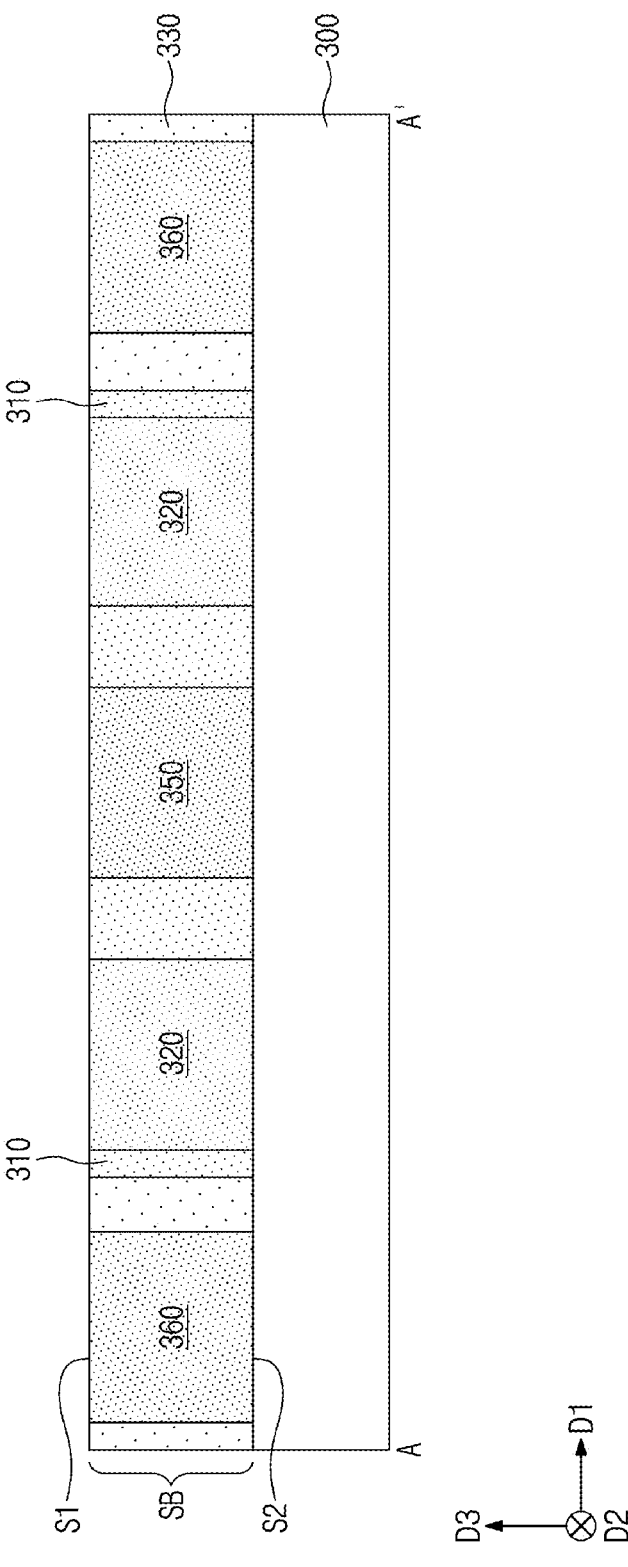

Referring to FIGS. 21 and 33, first doped regions 320 may be formed in each of the first well regions 310. The first doped regions 320 may be formed to be spaced apart from each other in the first direction D1 in each of the first well regions 310. Each of the first doped regions 320 may penetrate each of the first well regions 310 in the third direction D3. For example, the formation of the first doped regions 320 may include injecting or implanting dopants having the first conductivity type into each of the first well regions 310. A concentration of dopants having the first conductivity type in the first doped regions 320 may be greater than a concentration of dopants having the first conductivity type in the first well regions 310.

A second doped region 350 may be formed between the first doped regions 320 in each of the first well regions 310. The second doped region 350 may have a bar shape extending in the first direction D1 and may penetrate each of the first well regions 310 in the third direction D3. For example, the formation of the second doped region 350 may include injecting or implanting dopants having the second conductivity type into each of the first well regions 310. A concentration of dopants having the second conductivity type in the second doped region 350 may be greater than a concentration of dopants having the second conductivity type in the second well region 330.

Third doped regions 360 may be formed in the second well region 330. The third doped regions 360 may be spaced apart from each other in the first direction D1 with each of the first well regions 310 interposed therebetween. Each of the third doped regions 360 may have a bar shape extending in the first direction D1 and may penetrate the second well region 330 in the third direction D3. For example, the formation of the third doped regions 360 may include injecting or implanting dopants having the second conductivity type into the second well region 330. A concentration of dopants having the second conductivity type in the third doped regions 360 may be greater than the concentration of the dopants having the second conductivity type in the second well region 330. The concentration of the dopants having the second conductivity type in the second doped region 350 may be equal to or greater than the concentration of the dopants having the second conductivity type in the third doped regions 360.

Side surfaces of the first and second well regions 310 and 330 and the first to third doped regions 320, 350, and 360 may be in contact with each other in a horizontal direction (e.g., in the first direction D1 and the second direction D2). The first and second well regions 310 and 330 and the first to third doped regions 320, 350, and 360 may constitute the semiconductor body SB. The semiconductor body SB may have a first surface S1 and a second surface S2, which are opposite to each other, and the second surface S2 of the semiconductor body SB may be adjacent to the substrate 300.

Figure 34:
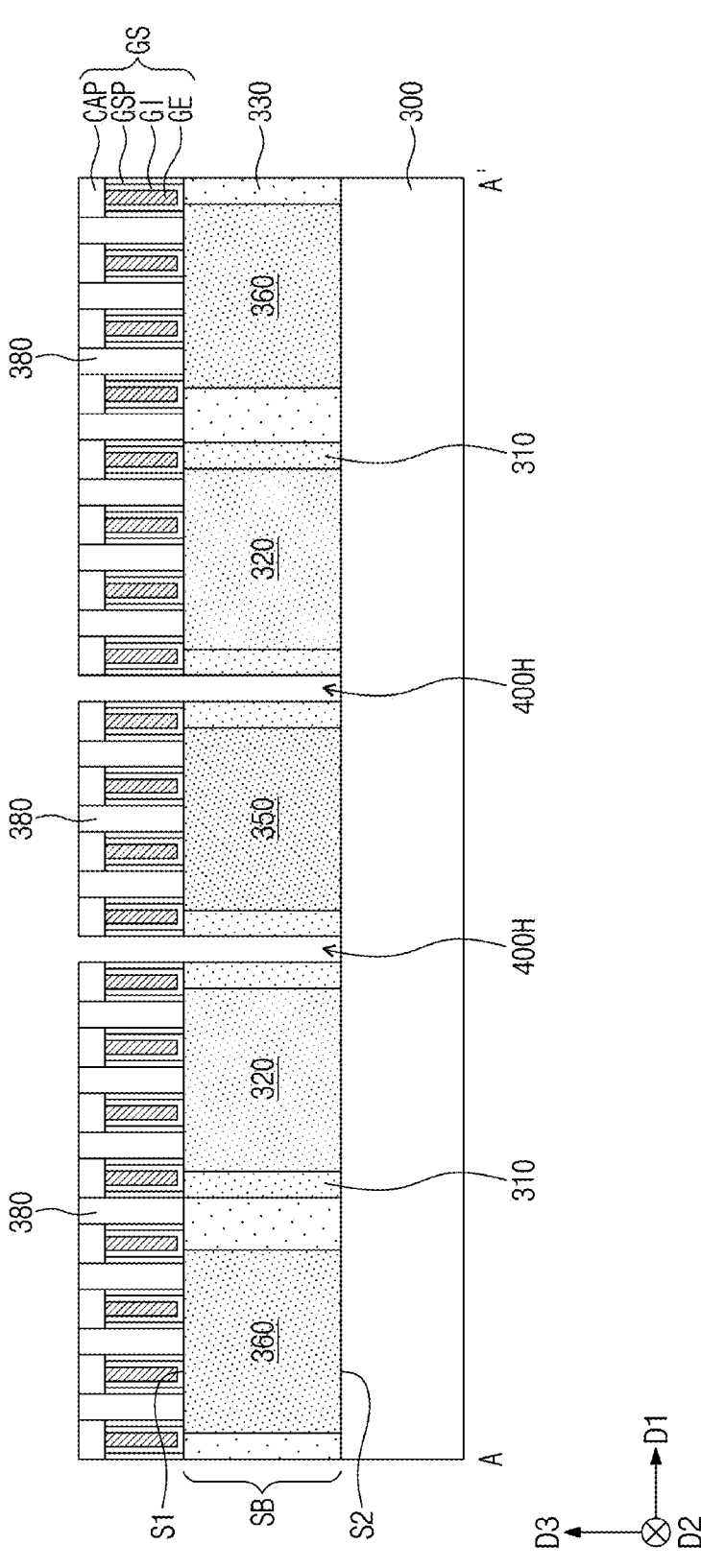

Referring to FIGS. 21 and 34, a plurality of gate structures GS may be formed on the first surface S1 of the semiconductor body SB. The plurality of gate structures GS may be spaced apart from each other in the first direction D1 and may extend in the second direction D2. Each of the plurality of gate structures GS may include a gate electrode GE extending in the second direction D2, a gate dielectric pattern GI between the gate electrode GE and the first surface S1 of the semiconductor body SB, gate spacers GSP on side surfaces of the gate electrode GE, and a gate capping pattern CAP on a top surface of the gate electrode GE. The gate dielectric pattern GI may extend between the gate electrode GE and the gate spacers GSP, and a topmost surface of the gate dielectric pattern GI may be substantially coplanar with the top surface of the gate electrode GE. The gate capping pattern CAP may extend onto top surfaces of the gate spacers GSP. An upper interlayer insulating layer 380 may be formed on the first surface S1 of the semiconductor body SB and may be on and at least partially cover the plurality of gate structures GS.

Holes 400H may be formed in the upper interlayer insulating layer 380 and may extend into each of the first well regions 310. Each of the holes 400H may penetrate the upper interlayer insulating layer 380 and each of the first well regions 310. In each of the first well regions 310, the holes 400H may be spaced apart from each other in the first direction D1 with the second doped region 350 interposed therebetween. One of the holes 400H may be formed between one of the first doped regions 320 and the second doped region 350, and the other of the holes 400H may be formed between the other of the first doped regions 320 and the second doped region 350. Each of the holes 400H may have a bar shape extending in the second direction D2 and may penetrate the upper interlayer insulating layer 380 and each of the first well regions 310 in the third direction D3. In some embodiments, the formation of the holes 400H may include removing the upper interlayer insulating layer 380 between the plurality of gate structures GS to expose portions of each of the first well regions 310, and etching the exposed portions of each of the first well regions 310.

Figure 35:
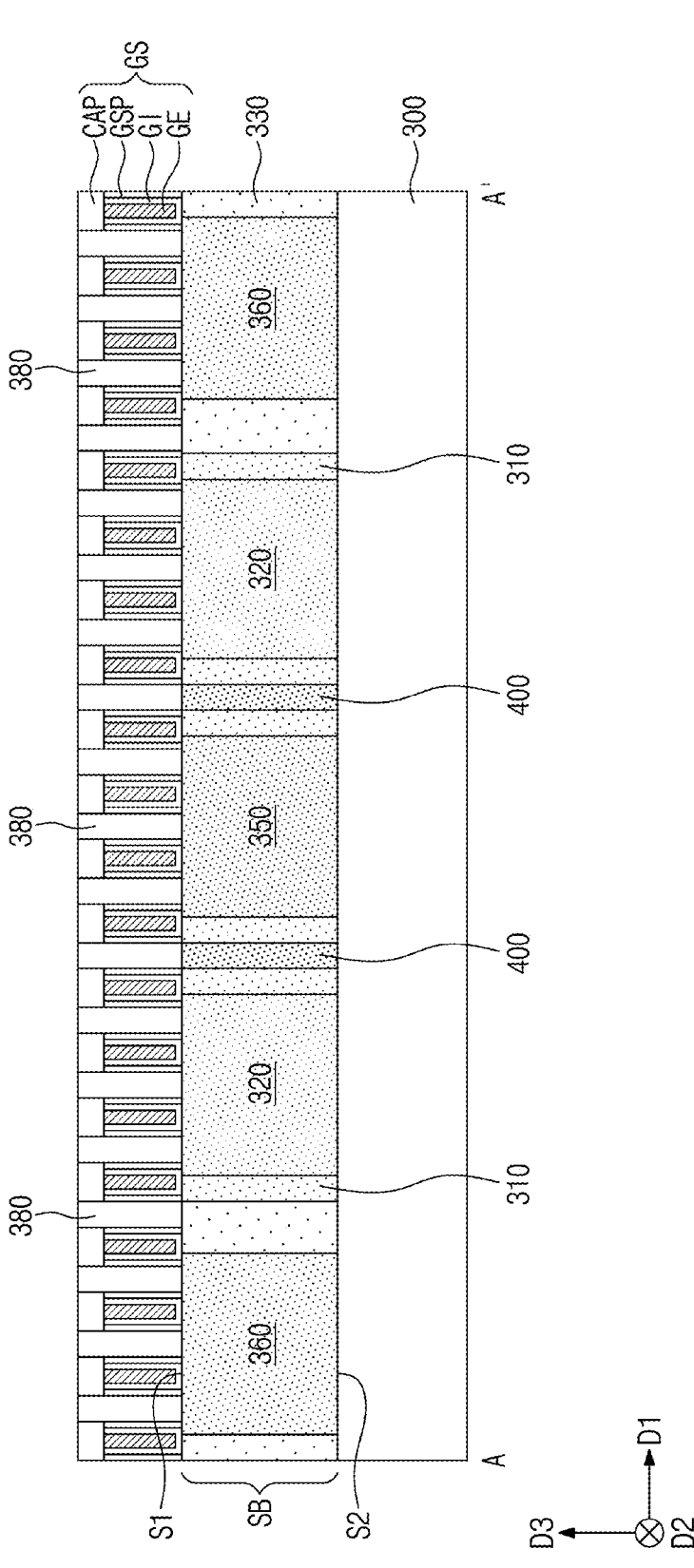

Referring to FIGS. 21 and 35, isolation patterns 400 may be formed in the holes 400H, respectively. Each of the isolation patterns 400 may at least partially fill a lower portion of each of the holes 400H and may penetrate each of the first well regions 310 in the third direction D3. For example, the formation of the isolation patterns 400 may include forming an isolation insulating layer at least partially filling the holes 400H on the upper interlayer insulating layer 380, and recessing the isolation insulating layer until the isolation insulating layer having a desired thickness remains in each of the holes 400H. Since the isolation insulating layer is recessed, the isolation insulating layer may be removed from an upper portion of each of the holes 400H, and each of the isolation patterns 400 may be locally formed in the lower portion of each of the holes 400H. Thereafter, an additional insulating layer may be formed to at least partially fill the upper portion of each of the holes 400H. The additional insulating layer may be referred to as the upper interlayer insulating layer 380.

Referring again to FIGS. 21 and 22A, first contacts CT1, second contacts CT2, and third contacts CT3 may be formed in the upper interlayer insulating layer 380 and between the plurality of gate structures GS. For example, the formation of the first to third contacts CT1, CT2, and CT3 may include forming first contact holes, second contact holes and third contact holes in the upper interlayer insulating layer 380 between the plurality of gate structures GS, and forming the first contacts CT1, the second contacts CT2 and the third contacts CT3 in the first contact holes, the second contact holes, and the third contact holes, respectively.

Thereafter, the substrate 300 may be removed. For example, the removal of the substrate 300 may include grinding the substrate 300 to expose the second surface S2 of the semiconductor body SB. After the removal of the substrate 300, a lower insulating layer 370 may be formed on the second surface S2 of the semiconductor body SB.

Figure 36:
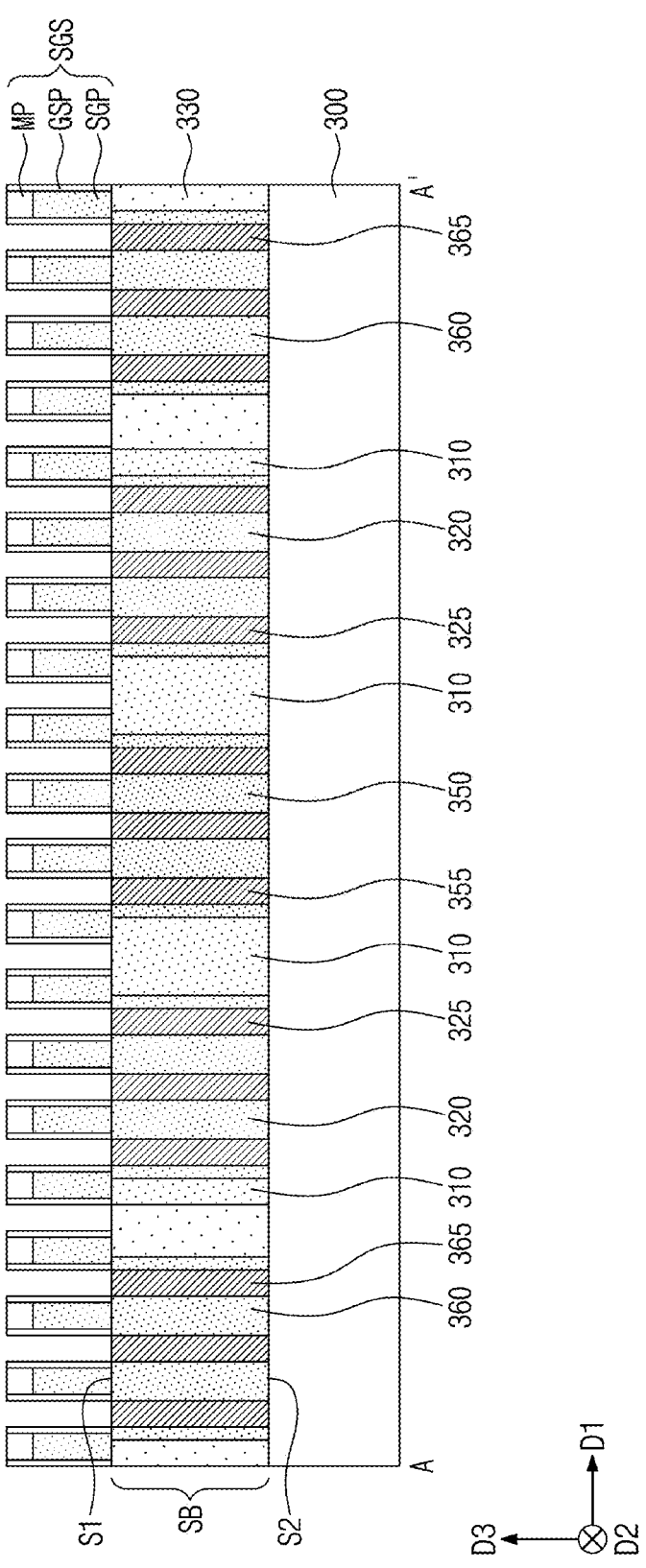

FIG. 36 is a cross-sectional view corresponding to the line A-A' of FIG. 21 to illustrate a method of manufacturing a semiconductor device according to some embodiments of the inventive concepts. Hereinafter, differences between the present embodiments and the embodiments mentioned with reference to FIGS. 21, 22A, and 31 to 35 will be mainly described for the purpose of ease and convenience in explanation.

First, as described with reference to FIGS. 21 and 31 to 33, the first semiconductor layers 302 and the second semiconductor layers 304 may be alternately stacked on the substrate 300, and the first well regions 310 and the second well region 330 may be formed in the first semiconductor layers 302 and the second semiconductor layers 304. The first doped regions 320 and the second doped region 350 may be formed in each of the first well regions 310, and the third doped regions 360 may be formed in the second well region 330. The first and second well regions 310 and 330 and the first to third doped regions 320, 350 and 360 may constitute the semiconductor body SB.

Referring to FIGS. 21 and 36, sacrificial gate structures SGS may be formed on the first surface S1 of the semiconductor body SB. The sacrificial gate structures SGS may be spaced apart from each other in the first direction D1 and may extend in the second direction D2. Each of the sacrificial gate structures SGS may include a sacrificial gate pattern SGP and a gate mask pattern MP sequentially stacked on the first surface S1 of the semiconductor body SB, and gate spacers GSP on both side surfaces of the sacrificial gate pattern SGP. The gate spacers GSP may extend onto both side surfaces of the gate mask pattern MP. For example, the formation of the sacrificial gate pattern SGP may include forming a sacrificial gate layer (not shown) on the first surface S1 of the semiconductor body SB, forming the gate mask pattern MP defining a region, in which the sacrificial gate pattern SGP will be formed, on the sacrificial gate layer, and patterning the sacrificial gate layer using the gate mask pattern MP as an etch mask. The formation of the gate spacers GSP may include forming a gate spacer layer (not shown) on and at least partially covering the gate mask pattern MP and the sacrificial gate pattern SGP on the first surface S1 of the semiconductor body SB, and anisotropically etching the gate spacer layer. The sacrificial gate pattern SGP may include, for example, poly-silicon, and the gate mask pattern MP and the gate spacers GSP may include, for example, silicon nitride.

First doped patterns 325 may be formed in each of the first doped regions 320. The first doped patterns 325 may be spaced apart from each other in the first direction D1 in each of the first doped regions 320, and each of the first doped patterns 325 may penetrate each of the first doped regions 320 in the third direction D3. For example, the formation of the first doped patterns 325 may include forming first holes penetrating each of the first doped regions 320 between the sacrificial gate structures SGS, and performing an epitaxial growth process to form the first doped patterns 325 in the first holes, respectively. The formation of the first doped patterns 325 may further include injecting dopants having the first conductivity type into the first doped patterns 325 during the epitaxial growth process or after the epitaxial growth process. A concentration of the dopants having the first conductivity type in the first doped patterns 325 may be equal to or greater than the concentration of the dopants having the first conductivity type in the first doped regions 320.

Second doped patterns 355 may be formed in the second doped region 350. The second doped patterns 355 may be spaced apart from each other in the first direction D1 in the second doped region 350, and each of the second doped patterns 355 may penetrate the second doped region 350 in the third direction D3. For example, the formation of the second doped patterns 355 may include forming second holes penetrating the second doped region 350 between the sacrificial gate structures SGS, and performing an epitaxial growth process to form the second doped patterns 355 in the second holes, respectively. The formation of the second doped patterns 355 may further include injecting dopants having the second conductivity type into the second doped patterns 355 during the epitaxial growth process or after the epitaxial growth process. A concentration of the dopants having the second conductivity type in the second doped patterns 355 may be equal to or greater than the concentration of the dopants having the second conductivity type in the second doped regions 350.

Third doped patterns 365 may be formed in each of the third doped regions 360. The third doped patterns 365 may be spaced apart from each other in the first direction D1 in each of the third doped regions 360, and each of the third doped patterns 365 may penetrate each of the third doped regions 360 in the third direction D3. For example, the formation of the third doped patterns 365 may include forming third holes penetrating each of the third doped regions 360 between the sacrificial gate structures SGS, and performing an epitaxial growth process to form the third doped patterns 365 in the third holes, respectively. The formation of the third doped patterns 365 may further include injecting dopants having the second conductivity type into the third doped patterns 365 during the epitaxial growth process or after the epitaxial growth process. A concentration of the dopants having the second conductivity type in the third doped patterns 365 may be equal to or greater than the concentration of the dopants having the second conductivity type in the third doped regions 360.

The upper interlayer insulating layer 380 described with reference to FIG. 34 may be formed on the first surface S1 of the semiconductor body SB and may be on and at least partially cover the sacrificial gate structures SGS. Thereafter, the sacrificial gate pattern SGP and the gate mask pattern MP of each of the sacrificial gate structures SGS may be removed. Thus, gap regions may be formed in the upper interlayer insulating layer 380 and between the gate spacers GSP.

Referring again to FIGS. 21 and 34, a gate dielectric pattern GI and a gate electrode GE may be formed to at least partially fill each of the gap regions. Upper portions of the gate dielectric pattern GI, the gate electrode GE and the gate spacers GSP may be recessed to form a groove region in each of the gap regions, and a gate capping pattern CAP may be formed in the groove region. The gate dielectric pattern GI, the gate electrode GE, the gate spacers GSP and the gate capping pattern CAP may be referred to as a gate structure GS.

Except for the differences described above, other processes and features of the manufacturing method according to the present embodiments may be substantially the same as corresponding processes and features of the manufacturing method described with reference to FIGS. 21, 22A, and 31 to 35.

Figure 37:
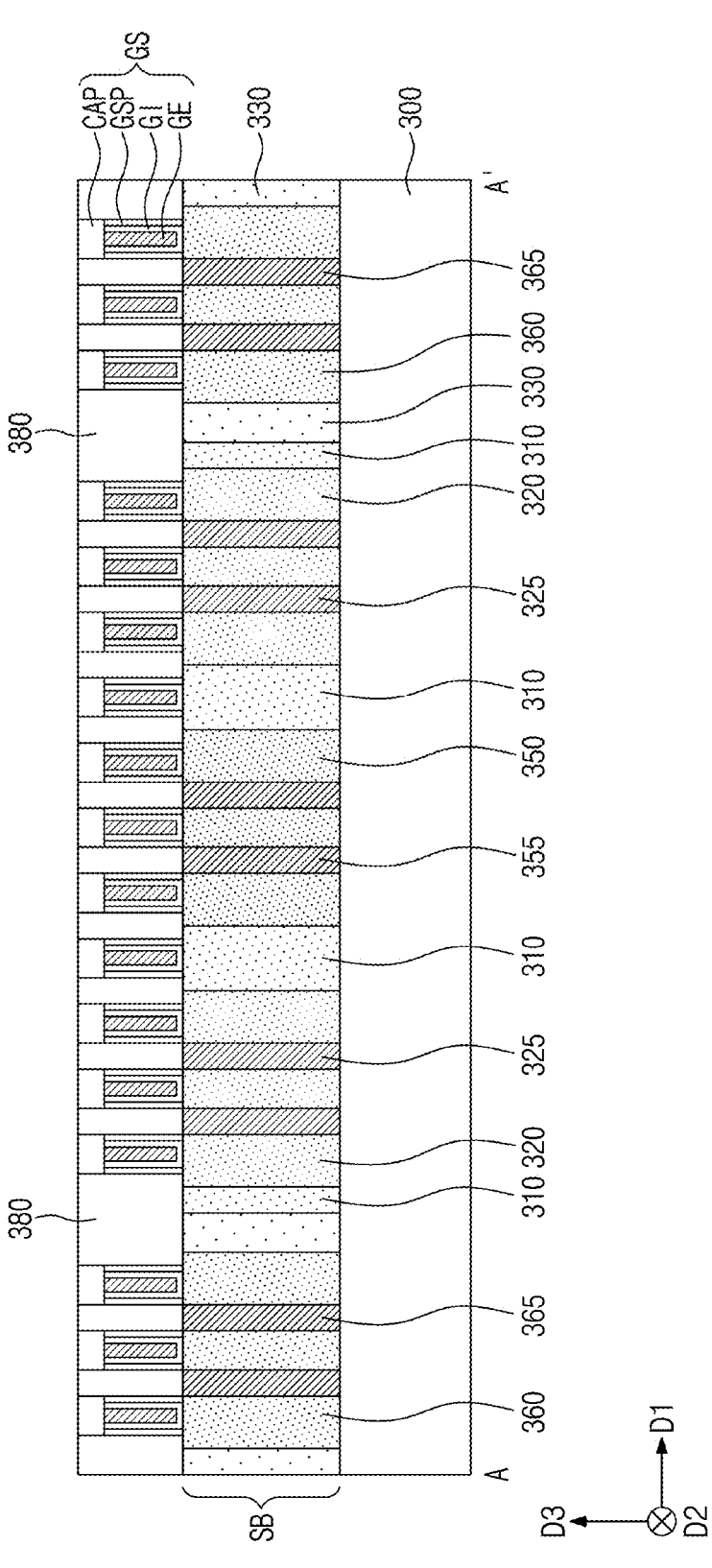
Figure 38:
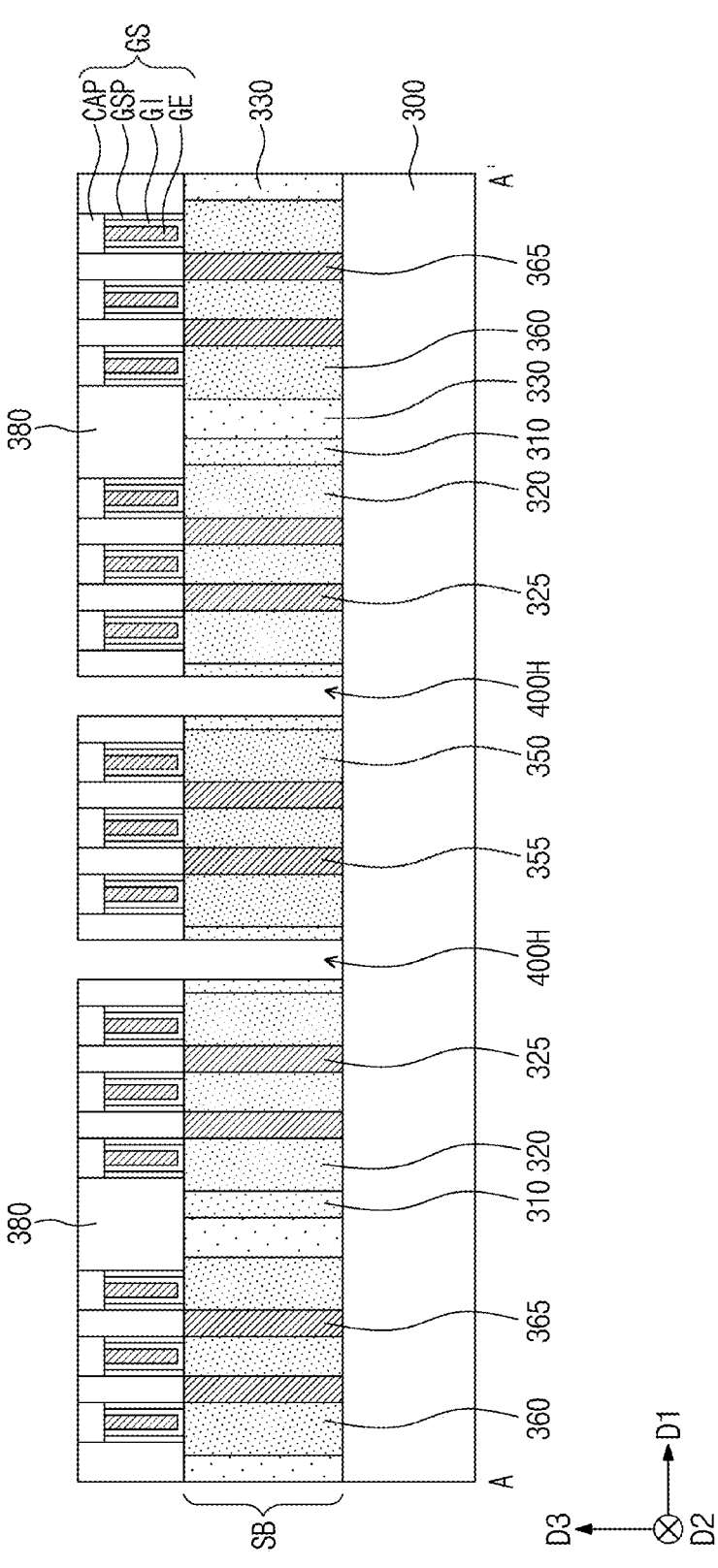
Figure 39:
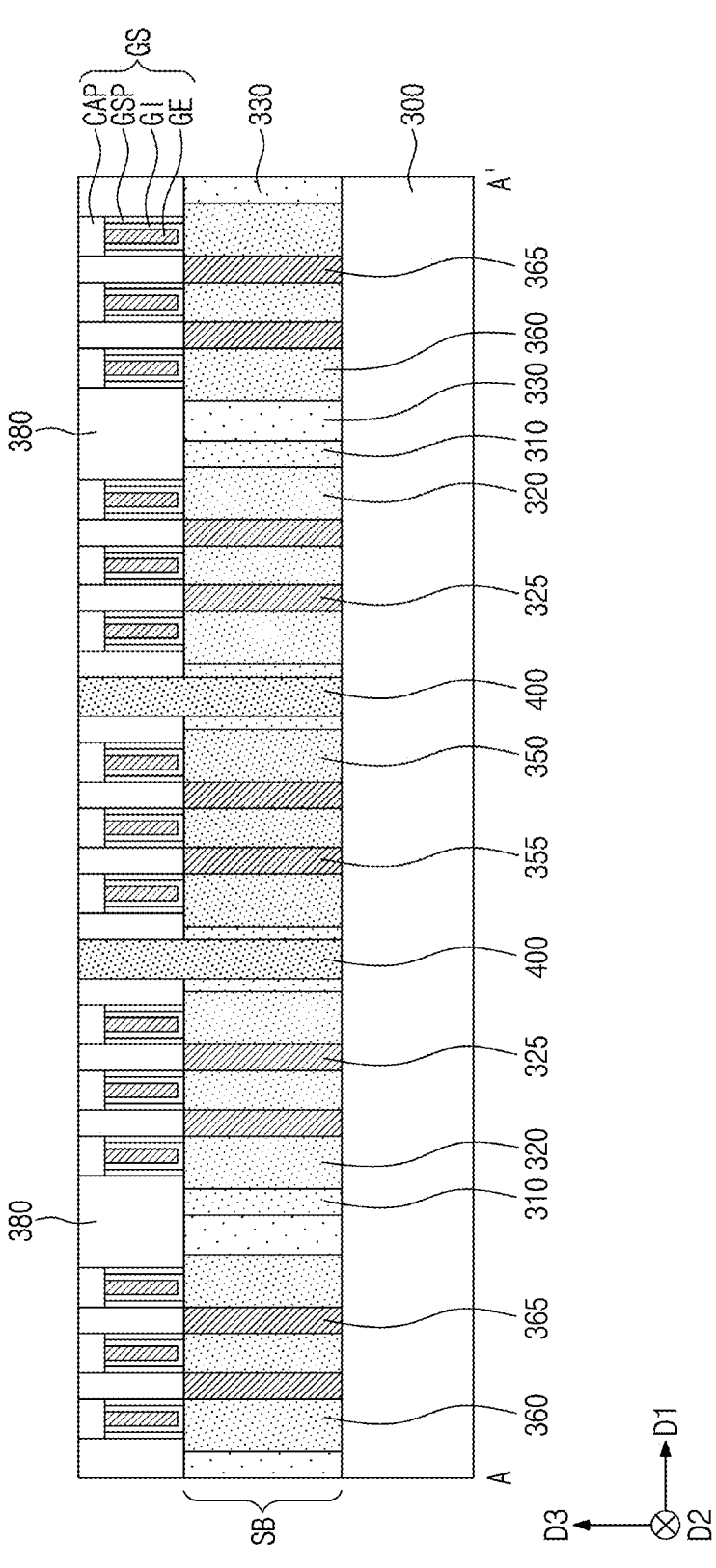

FIGS. 37 to 39 are cross-sectional views corresponding to the line A-A' of FIG. 21 to illustrate a method of manufacturing a semiconductor device according to some embodiments of the inventive concepts. Hereinafter, differences between the present embodiments and the embodiments mentioned with reference to FIGS. 21, 22A, and 31 to 35 will be mainly described for the purpose of ease and convenience in explanation.

First, as described with reference to FIGS. 21 and 31 to 33, the first semiconductor layers 302 and the second semiconductor layers 304 may be alternately stacked on the substrate 300, and the first well regions 310 and the second well region 330 may be formed in the first semiconductor layers 302 and the second semiconductor layers 304. The first doped regions 320 and the second doped region 350 may be formed in each of the first well regions 310, and the third doped regions 360 may be formed in the second well region 330. The first and second well regions 310 and 330 and the first to third doped regions 320, 350, and 360 may constitute the semiconductor body SB. Thereafter, as described with reference to FIGS. 21 and 36, the sacrificial gate structures SGS may be formed on the first surface S1 of the semiconductor body SB, and the first doped patterns 325, the second doped patterns 355, and the third doped patterns 365 may be formed in the first doped regions 320, the second doped regions 350, and the third doped regions 360, respectively, between the sacrificial gate structures SGS.

Referring to FIGS. 21 and 37, an upper interlayer insulating layer 380 may be formed on the first surface S1 of the semiconductor body SB and may be on and at least partially cover the sacrificial gate structures SGS. Thereafter, the sacrificial gate pattern SGP and the gate mask pattern MP of each of the sacrificial gate structures SGS may be removed. Thus, gap regions may be formed in the upper interlayer insulating layer 380 and between the gate spacers GSP. A gate dielectric pattern GI and a gate electrode GE may be formed to at least partially fill each of the gap regions. Upper portions of the gate dielectric pattern GI, the gate electrode GE, and the gate spacers GSP may be recessed to form a groove region in each of the gap regions, and a gate capping pattern CAP may be formed in the groove region. The gate dielectric pattern GI, the gate electrode GE, the gate spacers GSP, and the gate capping pattern CAP may be referred to as a gate structure GS.

Referring to FIGS. 21 and 38, holes 400H may be formed in the upper interlayer insulating layer 380 and may extend into each of the first well regions 310. Each of the holes 400H may penetrate the upper interlayer insulating layer 380 and each of the first well regions 310. In each of the first well regions 310, the holes 400H may be spaced apart from each other in the first direction D1 with the second doped region 350 interposed therebetween. One of the holes 400H may be formed between one of the first doped regions 320 and the second doped region 350, and the other of the holes 400H may be formed between the other of the first doped regions 320 and the second doped region 350. Each of the holes 400H may have a bar shape extending in the second direction D2 and may penetrate the upper interlayer insulating layer 380 and each of the first well regions 310 in the third direction D3. In some embodiments, the formation of the holes 400H may include removing portions of corresponding ones of the plurality of gate structures GS to expose portions of each of the first well regions 310, and etching the exposed portions of each of the first well regions 310.

Referring to FIGS. 21 and 39, isolation patterns 400 may be formed in the holes 400H, respectively. Each of the isolation patterns 400 may penetrate each of the first well regions 310 in the third direction D3. Each of the isolation patterns 400 may extend into the upper interlayer insulating layer 380 in the third direction D3 and may penetrate the upper interlayer insulating layer 380 in the third direction D3. For example, the formation of the isolation patterns 400 may include forming an isolation insulating layer at least partially filling the holes 400H on the upper interlayer insulating layer 380, and planarizing the isolation insulating layer to expose a top surface of the upper interlayer insulating layer 380. By the planarization process, the isolation patterns 400 may be locally formed in the holes 400H.

Referring again to FIGS. 21 and 30, first contacts CT1, second contacts CT2, and third contacts CT3 may be formed in the upper interlayer insulating layer 380 and between the plurality of gate structures GS. The first contacts CT1, the second contacts CT2 and the third contacts CT3 may be electrically connected to the first doped patterns 325, the second doped patterns 355 and the third doped patterns 365, respectively. Thereafter, the substrate 300 may be removed, and a lower insulating layer 370 may be formed on the second surface S2 of the semiconductor body SB.

Figure 40:
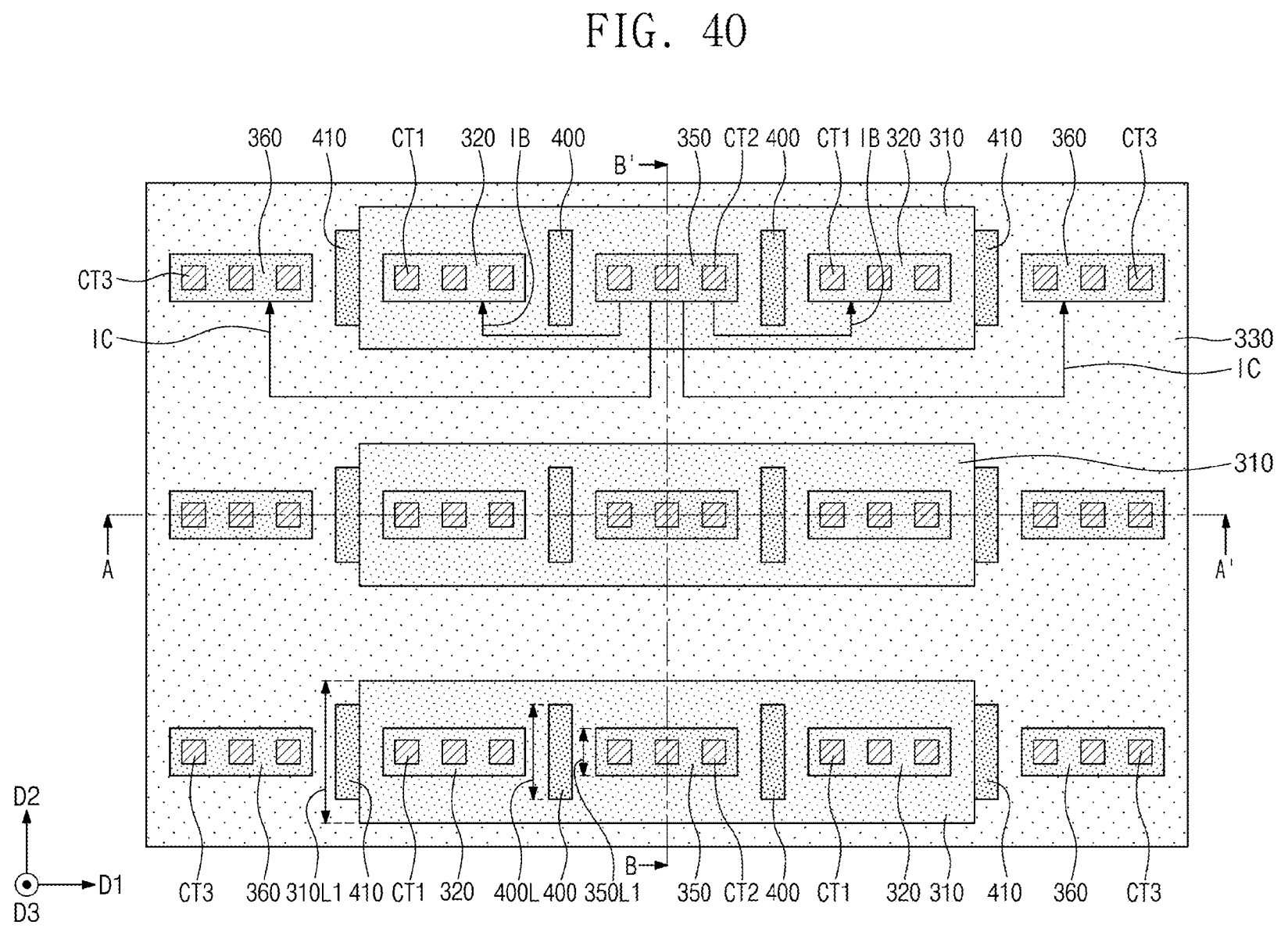
Figure 41:
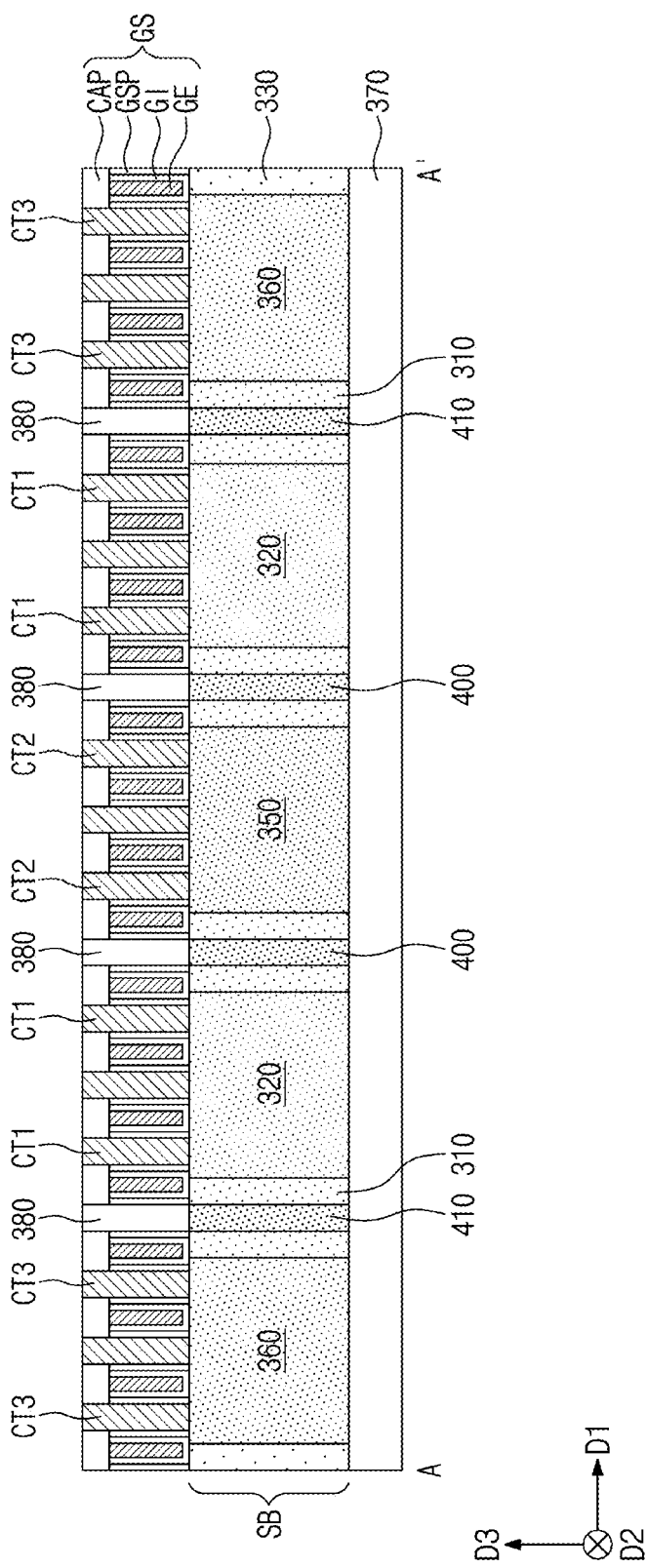
FIG. 41 is a cross-sectional view taken along a line A-A' of FIG. 40.

FIG. 40 is a plan view illustrating a semiconductor device according to some embodiments of the inventive concepts, and FIG. 41 is a cross-sectional view taken along a line A-A' of FIG. 40. A cross-sectional view taken along a line B-B' of FIG. 40 is substantially the same as that of FIG. 22B. Hereinafter, differences between the present embodiments and the above embodiments of FIGS. 21, 22A, and 22B will be mainly described for the purpose of ease and convenience in explanation.

Referring to FIGS. 40 and 41, additional isolation patterns 410 may be disposed between the first doped regions 320 and the third doped regions 360. One of the additional isolation patterns 410 may be disposed between one of the first doped regions 320 and one of the third doped regions 360, and the other of the additional isolation patterns 410 may be disposed between the other of the first doped regions 320 and the other of the third doped regions 360. Each of the additional isolation patterns 410 may have a bar shape extending in the second direction D2. Each of the additional isolation patterns 410 may penetrate the semiconductor body SB in the third direction D3. For example, each of the additional isolation patterns 410 may penetrate the second well region 330 in the third direction D3. Top surfaces of the additional isolation patterns 410 may be located at the same height in the D3 direction as the first surface S1 of the semiconductor body SB, and bottom surfaces of the additional isolation patterns 410 may be located at the same height in the D3 direction as the second surface S2 of the semiconductor body SB. Except for the positions of the additional isolation patterns 410, other features of the additional isolation patterns 410 may be substantially the same as corresponding features of the isolation patterns 400 described with reference to FIGS. 21, 22A, and 22B.

Figure 42:
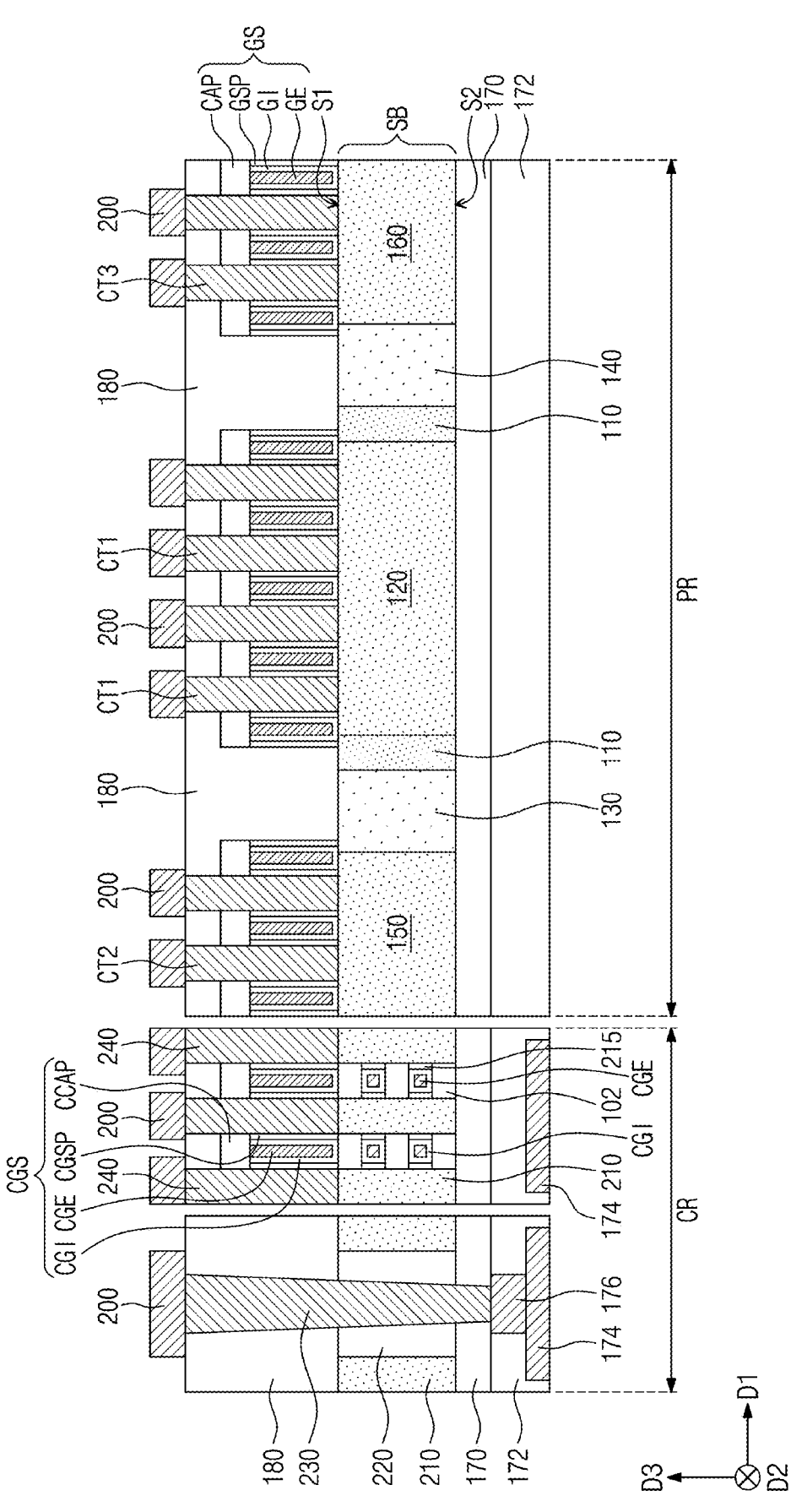
FIG. 42 is a cross-sectional view illustrating a semiconductor device according to some embodiments of the inventive concepts.

FIG. 42 is a cross-sectional view illustrating a semiconductor device according to some embodiments of the inventive concepts. Hereinafter, differences between the present embodiments and the above embodiments of FIGS. 1, 2A, and 2B will be mainly described for the purpose of ease and convenience in explanation.

Referring to FIG. 42, the semiconductor body SB may include a device region CR and a peripheral region PR. In some embodiments, the peripheral region PR of the semiconductor body SB may include the first to third well regions 110, 130, and 140, the plurality of first doped regions 120, the second doped region 150 and the third doped region 160, described with reference to FIGS. 1, 2A, and 2B. The plurality of gate structures GS and the first to third contacts CT1, CT2, and CT3, described with reference to FIGS. 1, 2A and 2B, may be disposed on the first surface S1 of the peripheral region PR of the semiconductor body SB. In certain embodiments, unlike FIG. 42, the peripheral region PR of the semiconductor body SB may include substantially the same components as at least one of the semiconductor devices described with reference to FIGS. 3A to 10C, 21 to 30, 40 and 41.

The device region CR of the semiconductor body SB may include semiconductor patterns 102 vertically spaced apart from each other (e.g., in a direction perpendicular to the first surface S1 of the semiconductor body SB), source/drain patterns 210 disposed at both sides of the semiconductor patterns 102, and a device isolation pattern 220 disposed between the source/drain patterns 210. The semiconductor patterns 102 may include silicon, and the source/drain patterns 210 may include silicon, silicon-germanium, and/or silicon carbide. The device isolation pattern 220 may include an oxide, a nitride, and/or an oxynitride.

Cell gate structures CGS may be disposed on the first surface S1 of the device region CR of the semiconductor body SB and may intersect the semiconductor patterns 102. Each of the cell gate structures CGS may include a cell gate electrode CGE intersecting the semiconductor patterns 102, a cell gate dielectric pattern CGI between the cell gate electrode CGE and the first surface S1 of the device region CR of the semiconductor body SB, cell gate spacers CGSP on side surfaces of the cell gate electrode CGE, and a cell gate capping pattern CCAP on a top surface of the cell gate electrode CGE. The cell gate electrode CGE, the cell gate dielectric pattern CGI, the cell gate spacers CGSP and the cell gate capping pattern CCAP may be substantially the same as the gate electrode GE, the gate dielectric pattern GI, the gate spacers GSP and the gate capping pattern CAP described with reference to FIGS. 1, 2A, and 2B, respectively. The cell gate electrode CGE may extend between the semiconductor patterns 102, and the cell gate dielectric pattern CGI may extend between each of the semiconductor patterns 102 and the cell gate electrode CGE. The cell gate dielectric pattern CGI may further extend between the cell gate electrode CGE and the cell gate spacers CGSP.

Sidewall spacers 215 may be disposed between the semiconductor patterns 102, and the cell gate electrode CGE and the cell gate dielectric pattern CGI may be disposed between the sidewall spacers 215. The cell gate dielectric pattern CGI may further extend between each of the sidewall spacers 215 and the cell gate electrode CGE. The cell gate electrode CGE and the cell gate dielectric pattern CGI may be spaced apart from the source/drain patterns 210 with the sidewall spacers 215 interposed therebetween.

Source/drain contacts 240 may be disposed on the first surface S1 of the device region CR of the semiconductor body SB and between the cell gate structures CGS. The source/drain contacts 240 may be electrically connected to the source/drain patterns 210, respectively.

An upper interlayer insulating layer 180 may be disposed on the first surface S1 of the semiconductor body SB and may be on and at least partially cover the device region CR and the peripheral region PR. The upper interlayer insulating layer 180 may be substantially the same as the upper interlayer insulating layer 180 described with reference to FIGS. 1, 2A, and 2B or the upper interlayer insulating layer 380 described with reference to FIGS. 21, 22A, and 22B. The upper interlayer insulating layer 180 may be on and at least partially cover the cell gate structures CGS and the source/drain contacts 240 on the device region CR of the semiconductor body SB and may be on and at least partially cover the gate structures GS and the first to third contacts CT1, CT2, and CT3 on the peripheral region PR of the semiconductor body SB.

Upper interconnection lines 200 may be disposed on the upper interlayer insulating layer 180. The source/drain contacts 240 and the first to third contacts CT1, CT2, and CT3 may be electrically connected to the upper interconnection lines 200. The upper interconnection lines 200 may include a conductive material (e.g., a metal).

A lower insulating layer 170 may be disposed on the second surface S2 of the semiconductor body SB and may be on and at least partially cover the device region CR and the peripheral region PR. The lower insulating layer 170 may be substantially the same as the lower insulating layer 170 described with reference to FIGS. 1, 2A, and 2B or the lower insulating layer 370 described with reference to FIGS. 21, 22A, and 22B.

Lower interconnection lines 174 and lower vias 176 may be disposed on the lower insulating layer 170. The lower insulating layer 170 may be disposed between the second surface S2 of the semiconductor body SB and the lower vias 176, and the lower vias 176 may be disposed between the lower insulating layer 170 and the lower interconnection lines 174. The lower vias 176 may be electrically connected to the lower interconnection lines 174. The lower interconnection lines 174 and the lower vias 176 may include a conductive material (e.g., a metal). In some embodiments, the lower interconnection lines 174 and the lower vias 176 may constitute a power delivery network.

A lower interlayer insulating layer 172 may be disposed on the lower insulating layer 170 and may be on and at least partially cover the lower interconnection lines 174 and the lower vias 176. The lower insulating layer 170 may be disposed between the second surface S2 of the semiconductor body SB and the lower interlayer insulating layer 172, and the lower interconnection lines 174 and the lower vias 176 may be disposed in the lower interlayer insulating layer 172. For example, the lower interlayer insulating layer 172 may include a silicon oxide layer, a silicon nitride layer, and/or a silicon oxynitride layer.

A through-electrode 230 may penetrate the upper interlayer insulating layer 180, the semiconductor body SB, and the lower insulating layer 170. The through-electrode 230 may penetrate the device isolation pattern 220 of the semiconductor body SB. The through-electrode 230 may be electrically connected to a corresponding upper interconnection line 200 of the upper interconnection lines 200 and may be electrically connected to a corresponding lower via 176 of the lower vias 176. The through-electrode 230 may be electrically connected to a corresponding lower interconnection line 174 of the lower interconnection lines 174 through the corresponding lower via 176. The through-electrode 230 may include a conductive material (e.g., a metal).

In some embodiments, to form the through-electrode 230 penetrating the semiconductor body SB, it may be desired that a vertical thickness (e.g., a thickness in a direction perpendicular to the first surface S1 of the semiconductor body SB) of the semiconductor body SB is relatively thin. According to embodiments of the inventive concepts, in the peripheral region PR of the semiconductor body SB, the side surfaces of the first to third well regions 110, 130 and 140 and the first to third doped regions 120, 150 and 160 may be in contact with each other in a horizontal direction (e.g., in the first direction D1 and the second direction D2). The top surfaces of the first to third well regions 110, 130, and 140 and the first to third doped regions 120, 150, and 160 may constitute the first surface S1 of the semiconductor body SB, and the bottom surfaces of the first to third well regions 110, 130, and 140 and the first to third doped regions 120, 150, and 160 may constitute the second surface S2 of the semiconductor body SB. In this case, even though the vertical thickness of the semiconductor body SB is relatively thin, an operable bipolar junction transistor may be realized in the semiconductor body SB. Thus, the operable bipolar junction transistor compatible with the through-electrode 230 may be realized.

According to embodiments of the inventive concepts, even though the thickness of the semiconductor body is relatively thin, the operable bipolar junction transistor may be realized in the semiconductor body. In addition, it may be possible to control the flow of the current flowing through the bipolar junction transistor (e.g., the first current flowing from the emitter to the collector and the second current flowing from the emitter to the base), and thus the operating characteristics of the bipolar junction transistor may be controlled.

As a result, it is possible to provide the semiconductor device including the bipolar junction transistor capable of being realized in a relatively thin semiconductor body and in which the operating characteristics may be relatively easily controlled.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device comprising:
a semiconductor body having a first surface and a second surface, which are opposite to each other,
wherein the semiconductor body comprises:
a first well region having a first conductivity type;
a second well region and a third well region, which are spaced apart from each other in a first direction with the first well region interposed therebetween and have a second conductivity type different from the first conductivity type;
a plurality of first doped regions spaced apart from each other in a second direction intersecting the first direction in the first well region, the plurality of first doped regions having the first conductivity type, wherein a concentration of dopants having the first conductivity type in each of the plurality of first doped regions is greater than a concentration of dopants having the first conductivity type in the first well region;
a second doped region, which is adjacent to the second well region and has the second conductivity type; and
a third doped region, which is adjacent to the third well region and has the second conductivity type,
wherein the second well region is disposed between the first well region and the second doped region, and the third well region is disposed between the first well region and the third doped region, and
wherein the second surface of the semiconductor body comprises bottom surfaces of the first to third well regions, the plurality of first doped regions, the second doped region, and the third doped region.

2. The semiconductor device of claim 1, wherein a concentration of dopants having the second conductivity type in the second doped region is greater than a concentration of dopants having the second conductivity type in the second well region.

3. The semiconductor device of claim 2, wherein a concentration of dopants having the second conductivity type in the third doped region is greater than a concentration of dopants having the second conductivity type in the third well region.

4. The semiconductor device of claim 1, wherein each of the plurality of first doped regions has a bar shape extending in the first direction, and wherein a length, in the first direction, of each of the plurality of first doped regions is greater than a width, in the second direction, of each of the plurality of first doped regions.

5. The semiconductor device of claim 4, further comprising:

a plurality of first contacts spaced apart from each other in the first direction on each of the plurality of first doped regions, wherein respective ones of the plurality of first contacts are electrically connected to corresponding ones of the plurality of first doped regions.

6. The semiconductor device of claim 5, further comprising:

a plurality of first doped patterns penetrating the plurality of first doped regions, respectively, wherein respective ones of the plurality of first doped patterns are spaced apart from each other in the first direction and are electrically connected to corresponding ones of the plurality of first contacts.

7. The semiconductor device of claim 6, wherein the plurality of first doped patterns have the first conductivity type, and wherein a concentration of dopants having the first conductivity type in each of the plurality of first doped patterns is equal to or greater than the concentration of the dopants having the first conductivity type in each of the plurality of first doped regions.

8. The semiconductor device of claim 1, further comprising:

first contacts on the plurality of first doped regions, respectively, and electrically connected to the plurality of first doped regions, respectively;

a second contact on the second doped region and electrically connected to the second doped region; and a third contact on the third doped region and electrically connected to the third doped region.

9. The semiconductor device of claim 8, further comprising:

a second doped pattern penetrating the second doped region and electrically connected to the second contact; and a third doped pattern penetrating the third doped region and electrically connected to the third contact.

10. The semiconductor device of claim 9, wherein each of the second doped pattern and the third doped pattern has the second conductivity type, wherein a concentration of dopants having the second conductivity type in the second doped pattern is equal to or greater than a concentration of dopants having the second conductivity type in the second doped region, and wherein a concentration of dopants having the second conductivity type in the third doped pattern is equal to or greater than a concentration of dopants having the second conductivity type in the third doped region.

11. The semiconductor device of claim 1, wherein the first well region comprises:

a first portion having a first width in the first direction; and a second portion having a second width in the first direction, wherein the first width and the second width are different from each other, wherein some of the plurality of first doped regions are in the first portion of the first well region, and wherein others of the plurality of first doped regions are in the second portion of the first well region.

12. A semiconductor device comprising:

a semiconductor body having a first surface and a second surface, which are opposite to each other, wherein the semiconductor body comprises:

a first well region having a first conductivity type;

a second well region and a third well region, which are spaced apart from each other in a first direction with the first well region interposed therebetween and have a second conductivity type different from the first conductivity type;

a plurality of first doped regions spaced apart from each other in a second direction intersecting the first direction in the first well region, the plurality of first doped regions having the first conductivity type;

first contacts on the plurality of first doped regions, respectively;

a second doped region, which is adjacent to the second well region and has the second conductivity type; and a third doped region, which is adjacent to the third well region and has the second conductivity type, wherein the second well region is between the first well region and the second doped region, and the third well region is between the first well region and the third doped region, wherein the first surface of the semiconductor body comprises top surfaces of the first to third well regions, the plurality of first doped regions, the second doped region and the third doped region, and wherein the second surface of the semiconductor body comprises bottom surfaces of the first to third well regions, the plurality of first doped regions, the second doped region and the third doped region.

13. The semiconductor device of claim 12, wherein a concentration of dopants having the first conductivity type in each of the plurality of first doped regions is greater than a concentration of dopants having the first conductivity type in the first well region, wherein a concentration of dopants having the second conductivity type in the second doped region is greater than a concentration of dopants having the second conductivity type in the second well region, and wherein a concentration of dopants having the second conductivity type in the third doped region is greater than a concentration of dopants having the second conductivity type in the third well region.

14. The semiconductor device of claim 13, further comprising:

a plurality of first doped patterns penetrating the plurality of first doped regions, respectively, and spaced apart from each other in the second direction, wherein the plurality of first doped patterns are connected to the first contacts, respectively, wherein the plurality of first doped patterns have the first conductivity type, and wherein a concentration of dopants having the first conductivity type in each of the plurality of first doped patterns is equal to or greater than the concentration of the dopants having the first conductivity type in each of the plurality of first doped regions.

* * * * *